(12) United States Patent
Park et al.

(10) Patent No.: US 12,389,740 B2
(45) Date of Patent: Aug. 12, 2025

(54) ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Bumwoo Park, Yongin-si (KR); Ohyun Kwon, Seoul (KR); Virendra Kumar Rai, Hwaseong-si (KR); Soyeon Kim, Seoul (KR); Yongsuk Cho, Hwaseong-si (KR); Byoungki Choi, Hwaseong-si (KR); Jongwon Choi, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 833 days.

(21) Appl. No.: 17/685,741

(22) Filed: Mar. 3, 2022

(65) Prior Publication Data
US 2023/0022068 A1 Jan. 26, 2023

(30) Foreign Application Priority Data
Jun. 11, 2021 (KR) .......... 10-2021-0076330

(51) Int. Cl.
*H10K 85/30* (2023.01)
*C07F 15/00* (2006.01)
(Continued)

(52) U.S. Cl.
CPC .......... *H10K 50/11* (2023.02); *C07F 15/0033* (2013.01); *C09K 11/06* (2013.01);
(Continued)

(58) Field of Classification Search
None
See application file for complete search history.

(56) References Cited

U.S. PATENT DOCUMENTS 6,465,115 B2 10/2002 Shi et al.
6,596,415 B2 7/2003 Shi et al.
(Continued)

FOREIGN PATENT DOCUMENTS

CN 1696137 A 11/2005
CN 111690015 A * 9/2020 .......... C07F 15/0033
(Continued)

OTHER PUBLICATIONS

Office Action issued Jan. 27, 2025 of KR Patent Application No. 10-2021-0076330.
(Continued)

*Primary Examiner* — Robert S Loewe
(74) *Attorney, Agent, or Firm* — CANTOR COLBURN LLP

(57) ABSTRACT

An organometallic compound, represented by Formula 1:

$$M_1(Ln_1)_{n1}(Ln_2)_{n2} \qquad \text{Formula 1}$$

wherein, in Formula 1, $M_1$ is a transition metal, $Ln_1$ is a ligand represented by Formula 1-1, $Ln_2$ is a ligand represented by Formula 2-1 or 2-2, n1 is 1 or 2, and n2 is 1 or 2:

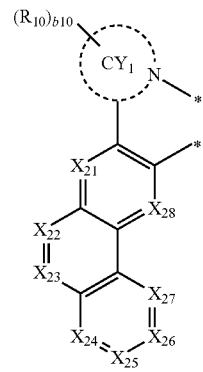

Formula 1-1

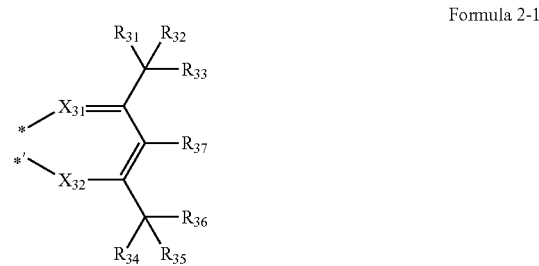

Formula 2-1

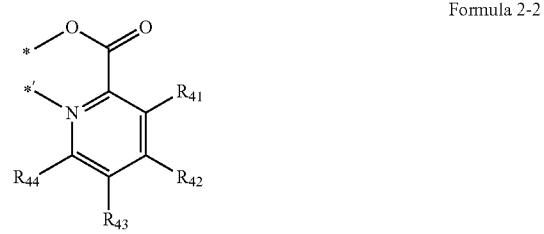

Formula 2-2 wherein, in Formulae 1-1, 2-1, and 2-2, $CY_1$, $X_{21}$ to $X_{28}$, $X_{31}$, $X_{32}$, $R_{10}$, $R_{31}$ to $R_{37}$, $R_{41}$ to $R_{44}$, and b10 are as defined herein, and * and *' each indicates a binding site to $M_1$.

20 Claims, 1 Drawing Sheet

(51) Int. Cl.
*C09K 11/06* (2006.01)
*H10K 50/11* (2023.01)
*H10K 101/10* (2023.01)
*H10K 101/30* (2023.01)

(52) U.S. Cl.
CPC ........... *C09K 2211/1044* (2013.01); *C09K 2211/185* (2013.01); *H10K 2101/10* (2023.02); *H10K 2101/30* (2023.02)

(56) References Cited

U.S. PATENT DOCUMENTS

| | | | |
|---|---|---|---|
| 2001/0019782 A1 | 9/2001 | Igarashi et al. | |
| 2004/0239237 A1* | 12/2004 | Matsusue | H05B 33/14 313/504 |
| 2012/0068165 A1 | 3/2012 | Hayashi | |
| 2016/0164012 A1 | 6/2016 | Lee et al. | |
| 2019/0214582 A1* | 7/2019 | Thompson | C07F 7/0812 |
| 2019/0252619 A1 | 8/2019 | Tsai et al. | |
| 2020/0087334 A1* | 3/2020 | Ji | H10K 85/40 |
| 2020/0308205 A1 | 10/2020 | Lee et al. | |
| 2022/0185834 A1 | 6/2022 | Kwon et al. | |

FOREIGN PATENT DOCUMENTS

| | | | | |
|---|---|---|---|---|
| CN | 112759617 A | * | 5/2021 | ........ C07F 15/0033 |
| JP | 2007169474 A | * | 7/2007 | ........ C09K 11/06 |
| JP | 2010278354 A | | 12/2010 | |
| JP | 5305637 B2 | * | 10/2013 | ........ C07C 17/14 |
| KR | 1020200115240 A | | 10/2020 | |
| WO | 2008044723 A1 | | 4/2008 | |

OTHER PUBLICATIONS

Chunyu Shang et al., "Quantum chemistry investigation on the photophysical properties of phosphorescent iridium(III) complexes with modified cyclometalating ligands," Polyhedron, Dec. 17, 2015, pp. 186-191, vol. 105.

M. A. Baldo et al., "Highlyefficient phosphorescent emission fromorganic electroluminescent devices," Nature, Sep. 10, 1998, pp. 151-154, vol. 395.

M. A. Baldo et al., "Very high-efficiency green organic light-emitting devices based on electrophosphorescence," Applied Physics Letters, May 10, 1999, pp. 4-6, vol. 75, No. 1.

Qin Wang et al., "Effects of charged self-assembled quantum dots on two-dimensional quantum transport," Applied Physics Letters, Feb. 1, 2000, pp. 1704-1706, vol. 76, No. 13.

Raymond C. Kwong et al., "High operational stability of electrophosphorescent devices," Applied Physics Letters, Apr. 30, 2002, pp. 162-164, vol. 81, No. 1.

Sergey Lamansky et al., "Highly Phosphorescent Bis-Cyclometalated Iridium Complexes: Synthesis, Photophysical Characterization, and Use in Organic Light Emitting Diodes," J. Am. Chem. Soc., 2001, pp. 4304-4312, vol. 123.

Sergey Lamansky et al., "Synthesis and Characterization of Phosphorescent Cyclometalated Iridium Complexes," Inorg. Chem., 2001, pp. 1704-1711, vol. 40.

Xiaohong Shang et al., "DFT/TDDFT study on the electronic structures and optoelectronic properties of a series of ridium(III) complexes based on quinoline derivatives in OLEDs," J. Phys. Org. Chem., Jul. 11, 2013, pp. 784-790, vol. 26.

* cited by examiner

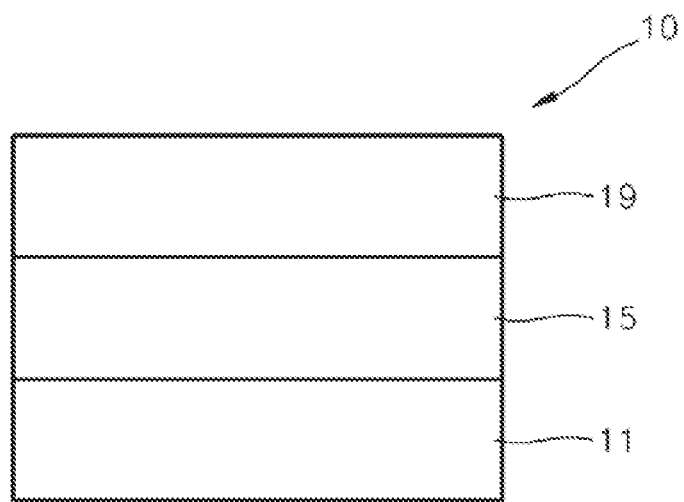

ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

CROSS-REFERENCE TO RELATED APPLICATION

This application claims priority to Korean Patent Application No. 10-2021-0076330, filed on Jun. 11, 2021, in the Korean Intellectual Property Office, and all benefits accruing therefrom under 35 U.S.C. § 119, the content of which is incorporated by reference herein in its entirety.

BACKGROUND

1. Field

The present disclosure relates to organometallic compounds, organic light-emitting devices including the same, and electronic apparatuses including the organic light-emitting devices.

2. Description of the Related Art

Organic light-emitting devices (OLEDs) are self-emissive devices, which have improved characteristics in terms of viewing angles, response time, luminance, driving voltage, and response speed. OLEDs are useful for producing full-color images.

In an example, an organic light-emitting device includes an anode, a cathode, and an organic layer that is arranged between the anode and the cathode and includes an emission layer. A hole transport region may be arranged between the anode and the emission layer, and an electron transport region may be arranged between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state, thereby generating light.

SUMMARY

Provided are organometallic compounds, organic light-emitting devices including the same, and electronic apparatuses including the organic light-emitting devices.

Additional aspects will be set forth in part in the detailed description which follows, and, in part, will be apparent from the detailed description, or may be learned by practice of the presented exemplary embodiments.

According to an aspect, provided is an organometallic compound represented by Formula 1:

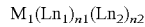
    Formula 1

In Formula 1,
$M_1$ is a transition metal,
$Ln_1$ is a ligand represented by Formula 1-1,
$Ln_2$ is a ligand represented by Formula 2-1 or 2-2,
n1 is 1 or 2,
n2 is 1 or 2,

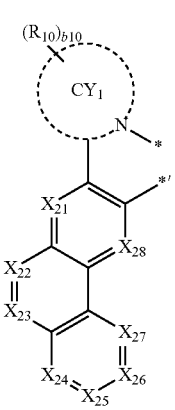
Formula 1-1

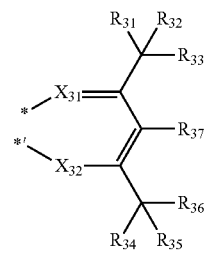
Formula 2-1

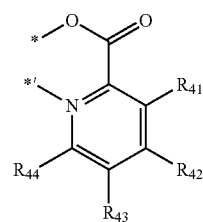
Formula 2-2 wherein, in Formulae 1-1, 2-1, and 2-2,
each bond between a *—N moiety in Formula 1-1 and $M_1$ is a coordinate bond, and each bond between a *'—C moiety and $M_1$ is a covalent bond,
each bond between a *—$X_{31}$ moiety in Formula 2-1 and $M_1$ in Formula 1 is a coordinate bond, each bond between a *'—$X_{32}$ moiety in Formula 2-1 and $M_1$ in Formula 1 is a covalent bond, each bond between a *—O moiety in Formula 2-2 and $M_1$ in Formula 1 is a covalent bond, and each bond between a *'—N moiety in Formula 2-2 and $M_1$ in Formula 1 is a coordinate bond,
$CY_1$ is a quinoline group, an isoquinoline group, a benzoquinoline group, or a benzoisoquinoline group,
$X_{21}$ is N or $C(R_{21})$, $X_{22}$ is N or $C(R_{22})$, $X_{23}$ is N or $C(R_{23})$, $X_{24}$ is N or $C(R_{24})$, $X_{25}$ is N or $C(R_{25})$, $X_{26}$ is N or $C(R_{26})$, $X_{27}$ is N or $C(R_{27})$, and $X_{28}$ is N or $C(R_{28})$,
at least one of $X_{21}$ to $X_{28}$ is N,
$X_{31}$ and $X_{32}$ are each independently O or S,
$R_{10}$, $R_{21}$ to $R_{28}$, $R_{31}$ to $R_{37}$, and $R_{41}$ to $R_{44}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —Ge($Q_1$)($Q_2$)($Q_3$), —N($Q_4$)($Q_5$), —B($Q_6$)($Q_7$), —P($Q_8$)($Q_9$), or —P(=O)($Q_8$)($Q_9$), two or more of $R_{10}$(s) may optionally be linked together to form a substituted or unsubstituted $C_5$-$C_{30}$ carbocyclic group or a substituted or unsubstituted $C_1$-$C_{30}$ heterocyclic group, two or more of $R_{21}$ to $R_{28}$ may optionally be linked together to form a substituted or unsubstituted $C_5$-$C_{30}$ carbocyclic group or a substituted or unsubstituted $C_1$-$C_{30}$ heterocyclic group, two or more of $R_{31}$ to $R_{37}$ may optionally be linked together to form a substituted or unsubstituted $C_5$-$C_{30}$ carbocyclic group or a substituted or unsubstituted $C_1$-$C_{30}$ heterocyclic group, two or more of $R_{41}$ to $R_{44}$ may optionally be linked together to form a substituted or unsubstituted $C_5$-$C_{30}$ carbocyclic group or a substituted or unsubstituted $C_1$-$C_{30}$ heterocyclic group, neighboring two or more of $R_{10}$, $R_{21}$ to $R_{28}$, $R_{31}$ to $R_{37}$, and $R_{41}$ to $R_{44}$ may optionally be linked to form a substituted or unsubstituted $C_5$-$C_{30}$ carbocyclic group or a substituted or unsubstituted $C_1$-$C_{30}$ heterocyclic group, b10 may be 1, 2, 3, 4, 5, 6, 7, or 8,

* and *' each indicate a binding site $M_1$, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{11}$)($Q_{12}$)($Q_{13}$), —Ge($Q_{11}$)($Q_{12}$)($Q_{13}$), —N($Q_{14}$)($Q_{15}$), —B($Q_{16}$)($Q_{17}$), —P($Q_{18}$)($Q_{19}$), —P(=O)($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{21}$)($Q_{22}$)($Q_{23}$), —Ge($Q_{21}$)($Q_{22}$)($Q_{23}$), —N($Q_{24}$)($Q_{25}$), —B($Q_{26}$)($Q_{27}$), —P($Q_{28}$)($Q_{29}$), —P(=O)($Q_{28}$)($Q_{29}$), or a combination thereof; or —Si($Q_{31}$)($Q_{32}$)($Q_{33}$), —Ge($Q_{31}$)($Q_{32}$)($Q_{33}$), —N($Q_{34}$)($Q_{35}$), —B($Q_{36}$)($Q_{37}$), —P($Q_{38}$)($Q_{39}$), or —P(=O)($Q_{38}$)($Q_{39}$), or $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

According to another aspect, provided is an organic light-emitting device including: a first electrode; a second electrode; and an organic layer that is arranged between the first electrode and the second electrode, wherein the organic layer includes an emission layer, and wherein the organic layer further includes at least one organometallic compound.

The at least one organometallic compound may be included in the emission layer of the organic layer, and in this regard, may act as a dopant.

According to still another aspect, provided is an electronic apparatus including the organic light-emitting device.

BRIEF DESCRIPTION OF THE DRAWING

The above and other aspects, features, and advantages of certain exemplary embodiments will be more apparent from the following detailed description taken in conjunction with FIGURE, which shows a schematic cross-sectional view of an organic light-emitting device according to one or more embodiments.

DETAILED DESCRIPTION

Reference will now be made in detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing one or more exemplary embodiments only and is not intended to be limiting. As used herein, the singular forms "a," "an," and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element is referred to as being "on" another element, it can be directly in contact with the other element or intervening elements may be present therebetween. In contrast, when an element is referred to as being "directly on" another element, there are no intervening elements present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

An aspect provides an organometallic compound represented by Formula 1:

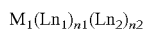

In Formula 1, $M_1$ is a transition metal.

In one or more embodiments, $M_1$ in Formula 1 may be a first-row transition metal of the Periodic Table of Elements, a second-row transition metal of the Periodic Table of Elements, or a third-row transition metal of the Periodic Table of Elements.

In one or more embodiments, $M_1$ in Formula 1 may be iridium (Ir), platinum (Pt), osmium (Os), titanium (Ti), zirconium (Zr), hafnium (Hf), europium (Eu), terbium (Tb), thulium (Tm), rhodium (Rh), palladium (Pd), or gold (Au).

In one or more embodiments, $M_1$ in Formula 1 may be iridium (Ir), platinum (Pt), osmium (Os), titanium (Ti), zirconium (Zr), hafnium (Hf), europium (Eu), terbium (Tb), thulium (Tm), or rhodium (Rh).

In one or more embodiments, $M_1$ in Formula 1 may be Ir, Os, Pt, Pd, or Au.

In one or more embodiments, $M_1$ in Formula 1 may be Ir.

In Formula 1, n1 is 1 or 2.

In Formula 1, n2 is 1 or 2.

In one or more embodiments, $M_1$ in Formula 1 may be Ir, and the sum of n1 and n2 may be equal to 3.

In Formula 1, $Ln_1$ is a ligand represented by Formula 1-1:

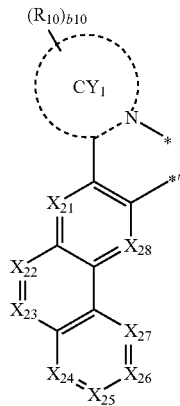

wherein, each bond between a *—N moiety in Formula 1-1 and $M_1$ in Formula 1 is a coordinate bond, and each bond between a *'—C moiety in Formula 1-1 and $M_1$ in Formula 1 is a covalent bond.

$CY_1$ in Formula 1-1 is a quinoline group, an isoquinoline group, a benzoquinoline group, or a benzoisoquinoline group.

In one or more embodiments, $CY_1$ in Formula 1-1 may be a group represented by one of Formulae 3-1 to 3-12:

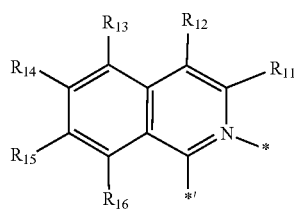

3-1

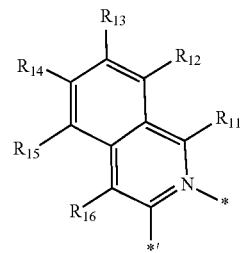

3-2

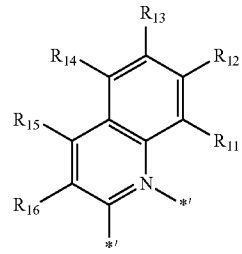

3-3

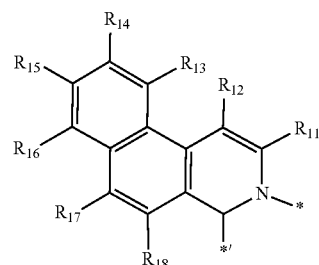

3-4

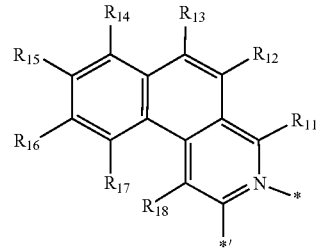

3-5

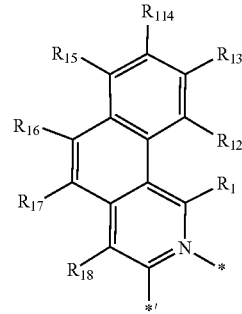

3-6

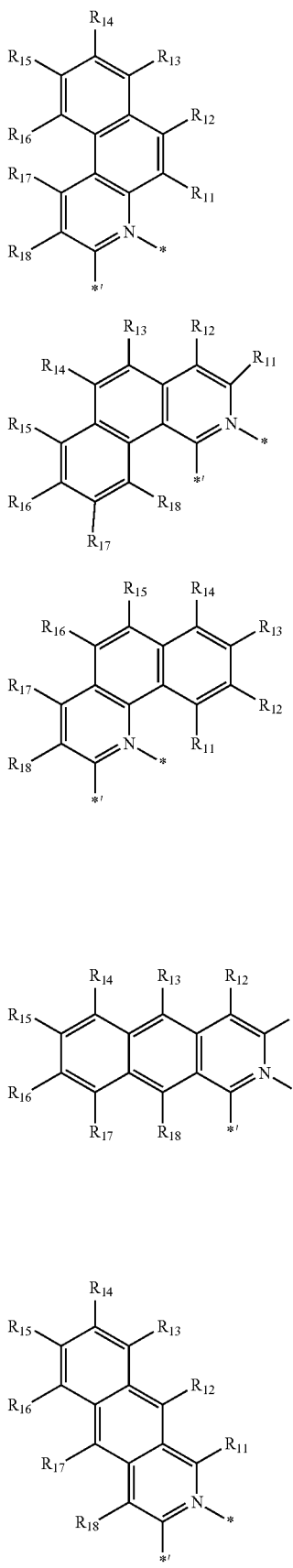

3-7

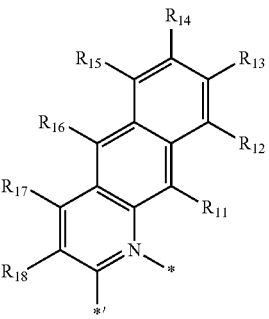

3-8

3-9

3-10

3-11

3-12

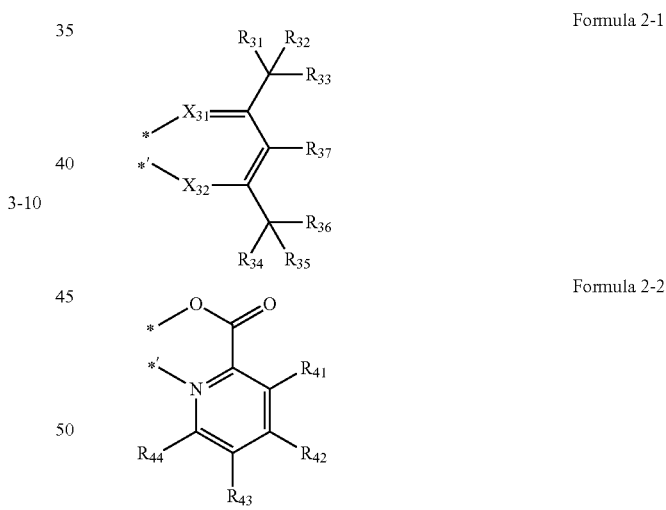

wherein, in Formulae 3-1 to 3-12,
$R_{11}$ to $R_{18}$ may respectively be the same as described in connection with $R_{10}$, and
* indicates a binding site to $M_1$, and *' indicates a binding site to a neighboring atom.

In Formula 1-1, $X_{21}$ is N or $C(R_{21})$, $X_{22}$ is N or $C(R_{22})$, $X_{23}$ is N or $C(R_{23})$, $X_{24}$ is N or $C(R_{24})$, $X_{25}$ is N or $C(R_{25})$, $X_{26}$ is N or $C(R_{26})$, $X_{27}$ is N or $C(R_{27})$, and $X_{28}$ is N or $C(R_{28})$.

In Formula 1-1, at least one of $X_{21}$ to $X_{28}$ is N.

In one or more embodiments, one to four of $X_{21}$ to $X_{28}$ may respectively be N.

For example, one or two of $X_{21}$ to $X_{28}$ may respectively be N.

In Formula 1, $Ln_2$ is a ligand represented by Formula 2-1 or 2-2:

Formula 2-1

Formula 2-2 wherein each bond between a *—$X_{31}$ moiety in Formula 2-1 and $M_1$ in Formula 1 is a coordinate bond,
each bond between a *'—$X_{32}$ moiety in Formula 2-1 and $M_1$ in Formula 1 is a covalent bond,
each bond between a *—O moiety in Formula 2-2 and $M_1$ in Formula 1 is a covalent bond, and
each bond between a *'—N moiety in Formula 2-2 and $M_1$ in Formula 1 is a coordinate bond.

In Formula 2-1, $X_{31}$ and $X_{32}$ are each independently O or S.

In Formulae 1-1, 2-1, and 2-2, $R_{10}$, $R_{21}$ to $R_{28}$, $R_{31}$ to $R_{37}$, and $R_{41}$ to $R_{44}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —Ge($Q_1$)($Q_2$)($Q_3$), —N($Q_4$)($Q_5$), —B($Q_6$)($Q_7$), —P($Q_8$)($Q_9$), or —P(=O)($Q_8$)($Q_9$).

In one or more embodiments, $R_{10}$, $R_{21}$ to $R_{28}$, $R_{31}$ to $R_{37}$, and $R_{41}$ to $R_{44}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a $C_1$-$C_{20}$ alkyl group, a $C_2$-$C_{20}$ alkenyl group, a $C_1$-$C_{20}$ alkoxy group, or a $C_1$-$C_{20}$ alkylthio group;

a $C_1$-$C_{20}$ alkyl group, a $C_2$-$C_{20}$ alkenyl group, a $C_1$-$C_{20}$ alkoxy group, or a $C_1$-$C_{20}$ alkylthio group, each substituted with at least one of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group (bicyclo[2.2.1]heptyl group), a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with at least one of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_1$-$C_{20}$ alkyl group, a $C_1$-$C_{20}$ alkoxy group, a $C_1$-$C_{20}$ alkylthio group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or a combination thereof; or —Si($Q_1$)($Q_2$)($Q_3$), —Ge($Q_1$)($Q_2$)($Q_3$), —N($Q_4$)($Q_5$), —B($Q_6$)($Q_7$), —P($Q_8$)($Q_9$), or —P(=O)($Q_8$)($Q_9$), and $Q_1$ to $Q_9$ may each independently be:

deuterium, —F, —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, —$CD_2CDH_2$, —$CF_3$, —$CF_2H$, —$CFH_2$, —$CH_2CF_3$, —$CH_2CF_2H$, —$CH_2CFH_2$, —$CHFCH_3$, —$CHFCF_2H$, —$CHFCFH_2$, —$CHFCF_3$, —$CF_2CF_3$, —$CF_2CF_2H$, or —$CF_2CFH_2$; or a propyl (n-propyl) group, a 1-methylethyl (isopropyl) group, a butyl (n-butyl) group, a 1-methylpropyl (sec-butyl) group, a 2-methylpropyl (isobutyl group), a 3-methylpropyl (tert-butyl) group, a pentyl (n-pentyl) group, a 1,1-dimethylpropyl (tert-pentyl) group, a 2,2-dimethylpropyl (neo-pentyl) group, a 3-methylbutyl (isopentyl) group, a 1-methylbutyl (sec-pentyl) group, a 1-ethylpropyl (3-pentyl) group, a 3-methyl-2-butyl (sec-isopentyl) group, a phenyl group, a biphenyl group, or a naphthyl group, each unsubstituted or substituted with at least one of deuterium, —F, a $C_1$-$C_{10}$ alkyl group, a phenyl group, or a combination thereof.

In one or more embodiments, $R_{10}$, $R_{21}$ to $R_{28}$, $R_{31}$ to $R_{37}$, and $R_{41}$ to $R_{44}$ may each independently be:

hydrogen, deuterium, —F, —Cl, —Br, —I, —$CD_3$, —$CD_2H$, —$CDH_2$, —$CF_3$, —$CF_2H$, —$CFH_2$, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group; or a group represented by one of Formulae 9-1 to 9-67, 9-201 to 9-244, 10-1 to 10-154, or 10-201 to 10-350:

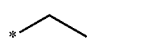

9-1

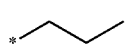

9-2

9-3

9-4

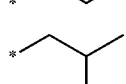

9-5

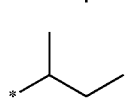

9-6

9-7

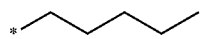

9-8

9-9

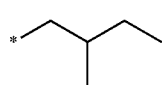

9-10

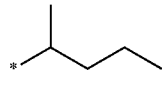

9-11

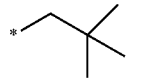

9-12

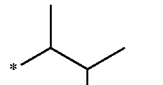

9-13

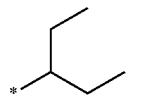

9-14

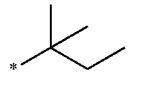

9-15

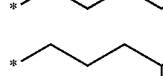

9-16

9-17

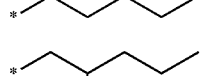

9-18

9-19

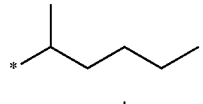

9-20

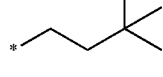

9-21

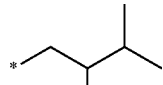

9-22

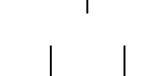

9-23

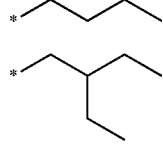

9-24

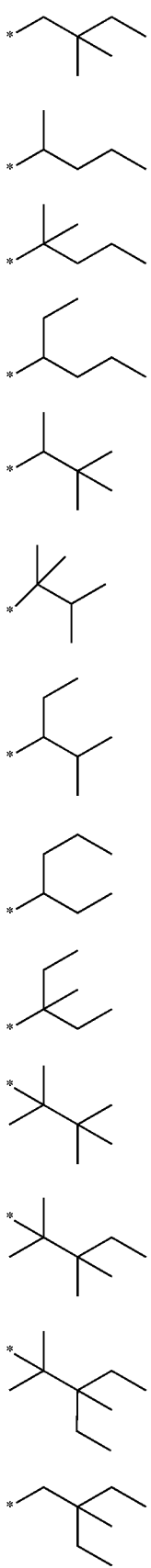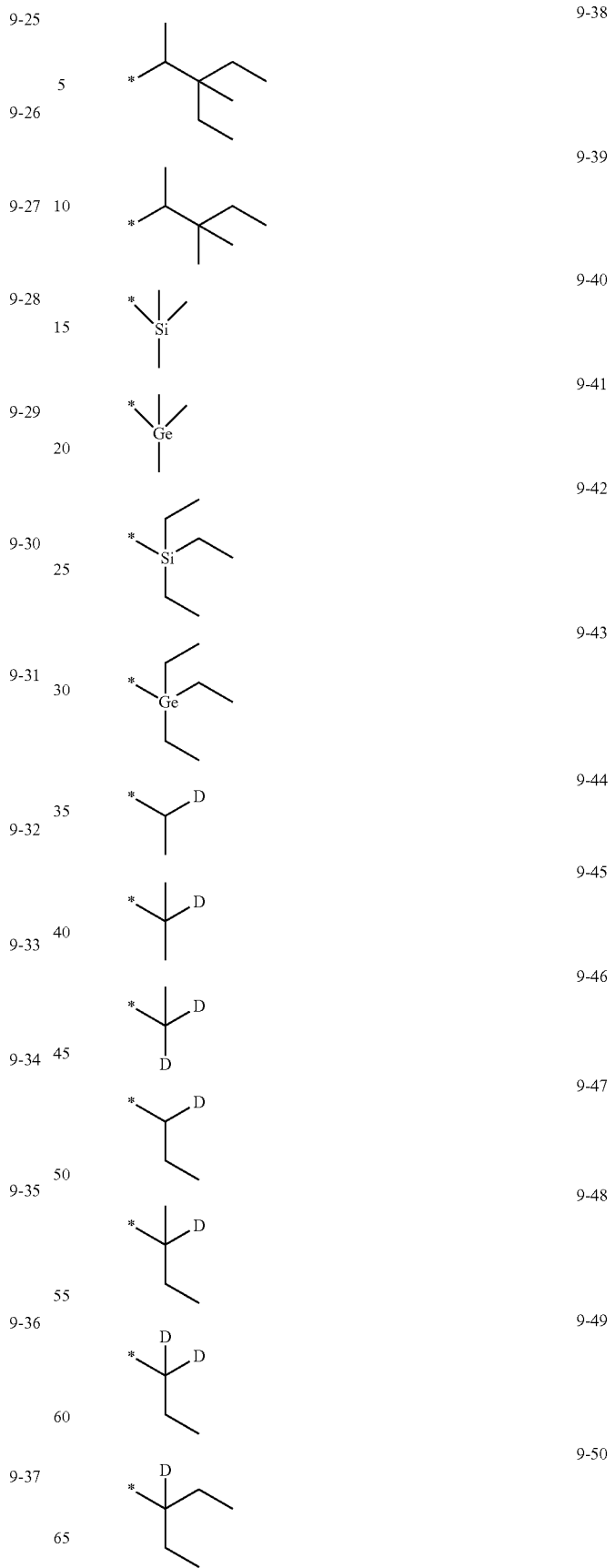

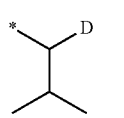
9-51
9-63
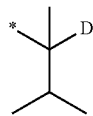
9-52
9-64
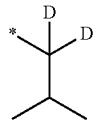
9-53
9-65
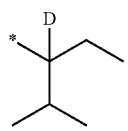
9-54
9-66
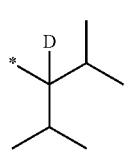
9-55
9-67
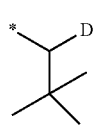
9-56
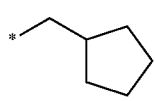
9-201
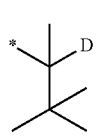
9-57
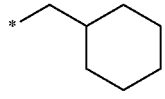
9-202
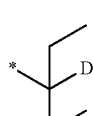
9-58
9-203
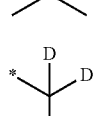
9-59
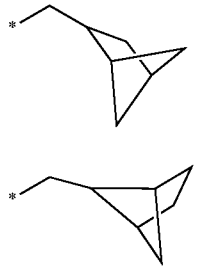
9-204
9-205
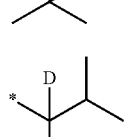
9-60
9-206
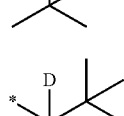
9-61
9-207
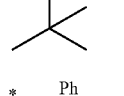
9-62
9-208

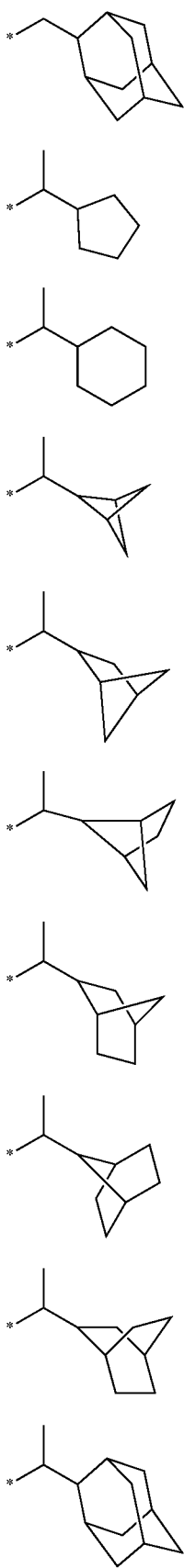
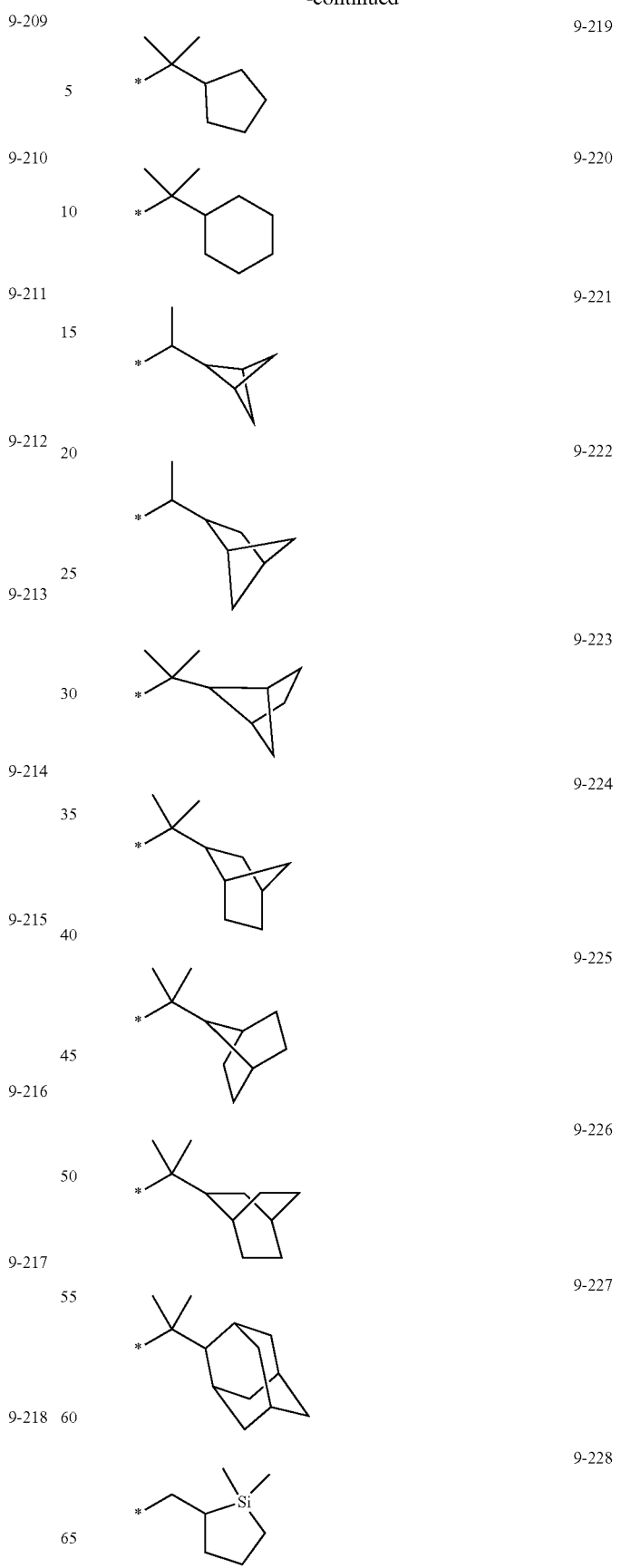

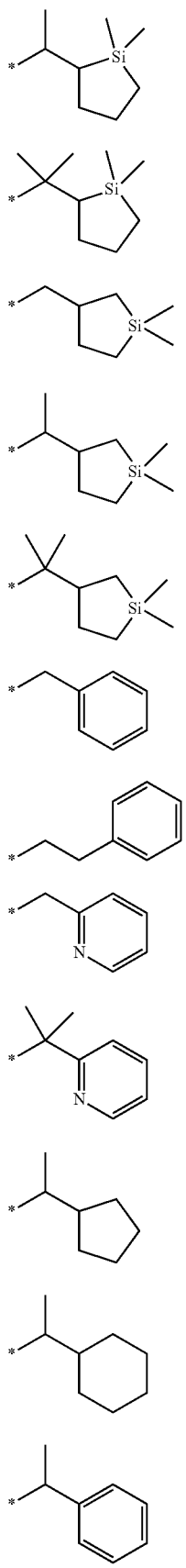
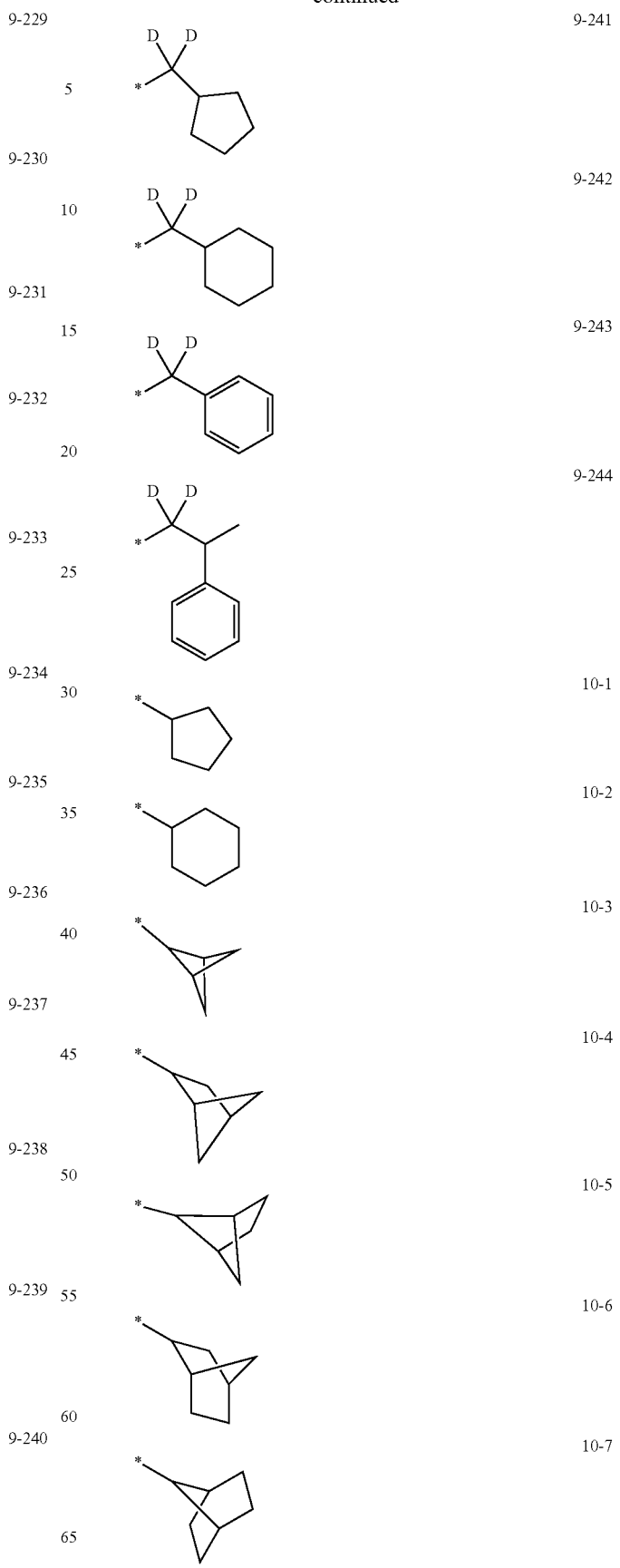

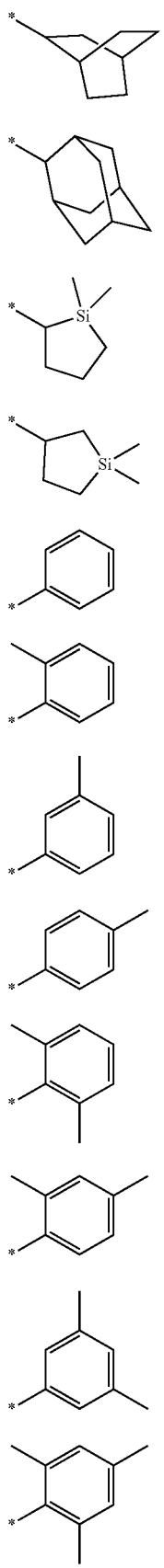
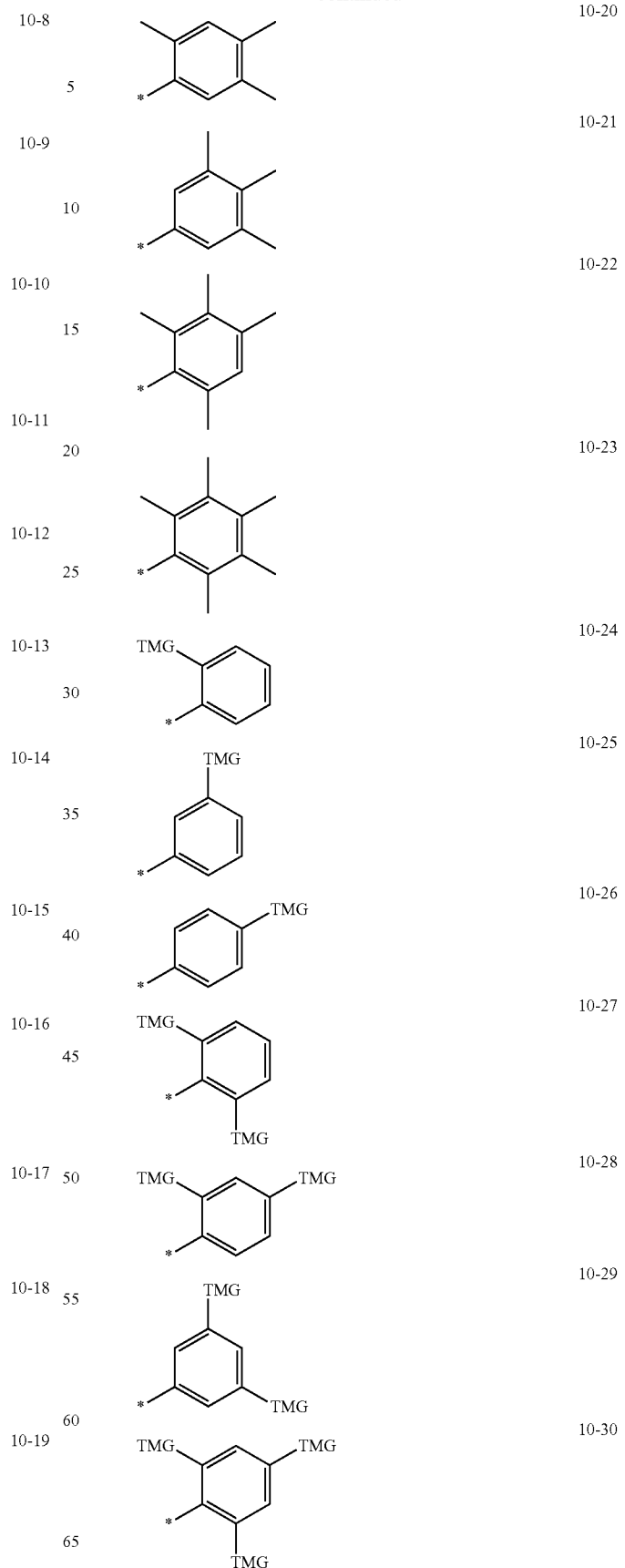

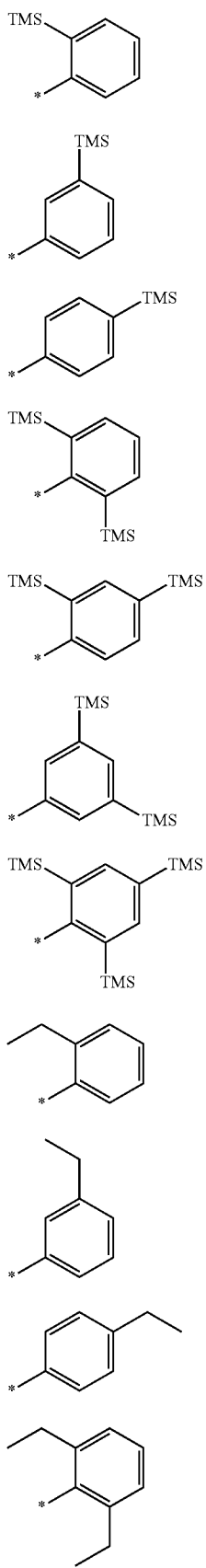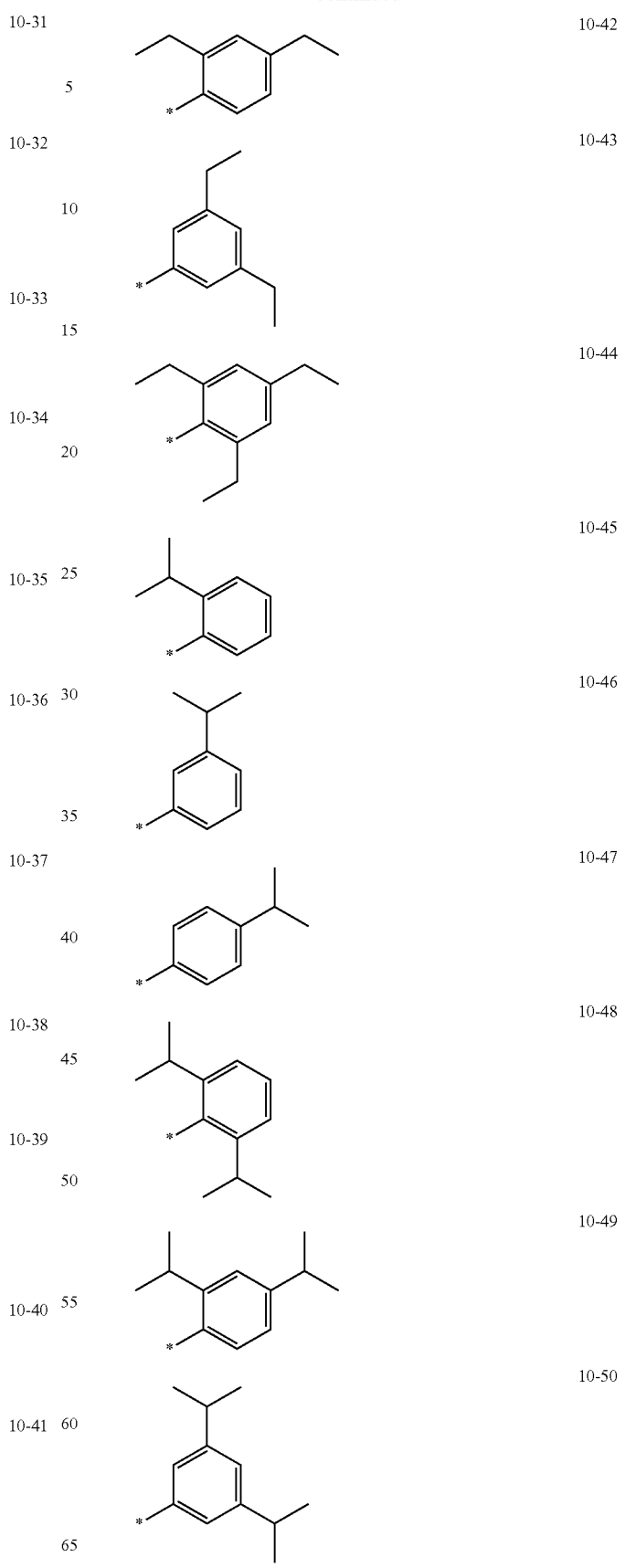

10-51 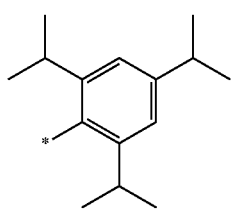
10-52 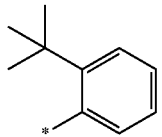
10-53 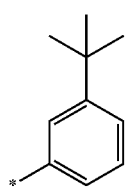
10-54 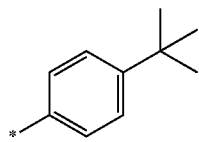
10-55 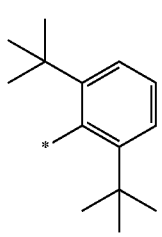
10-56 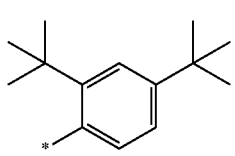
10-57 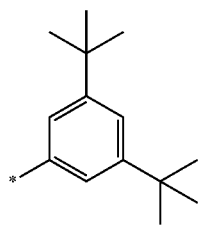
10-58 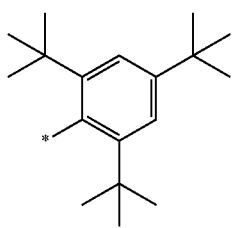
10-59 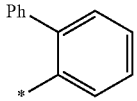
10-60 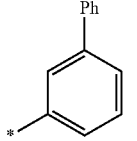
10-61 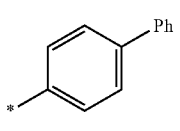
10-62 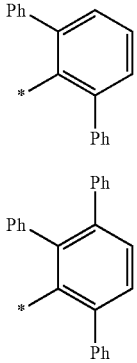
10-63
10-64 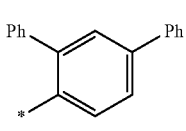
10-65 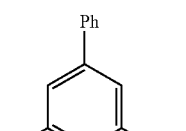
10-66 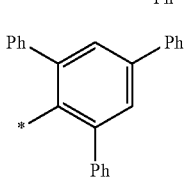
10-67 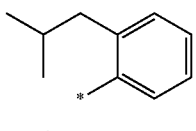
10-68
10-69 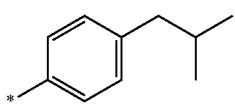

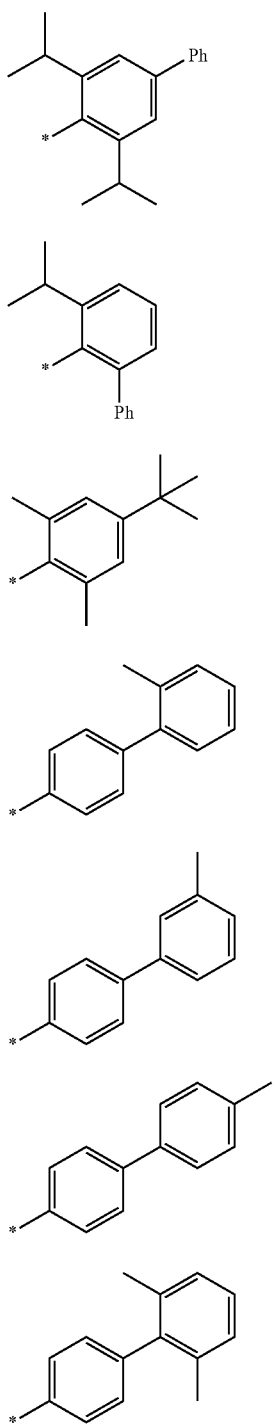
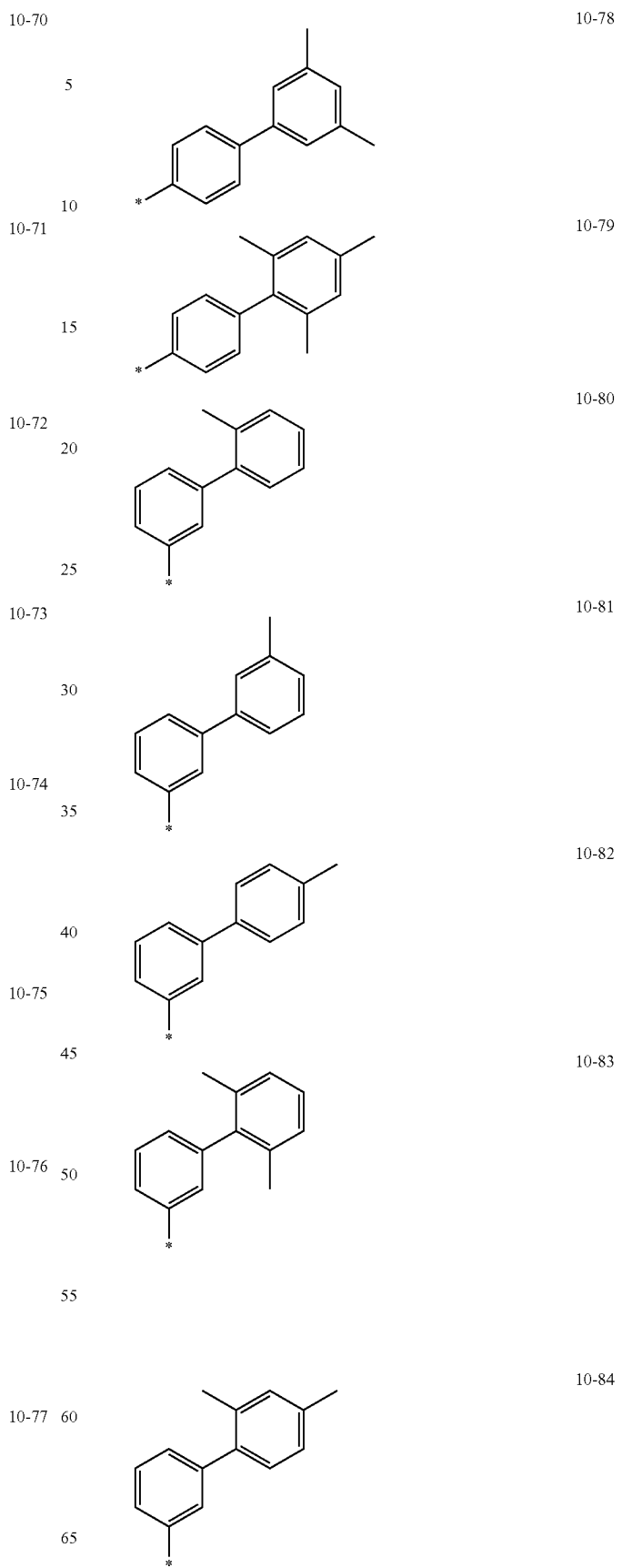

| | |
|---|---|
| 10-85 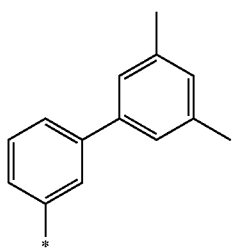 | 10-93 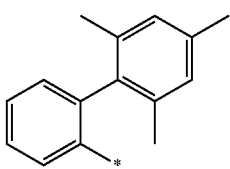 |
| 10-86 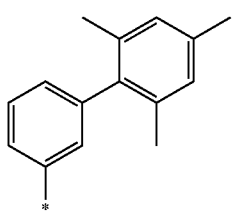 | 10-94 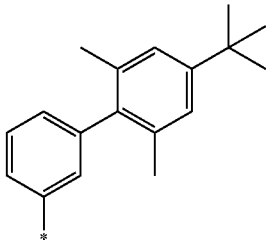 |
| 10-87 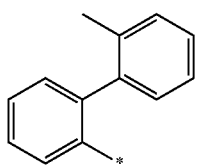 | 10-95 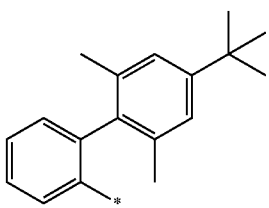 |
| 10-88 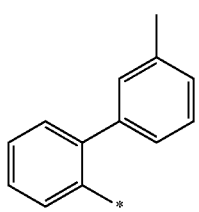 | 10-96 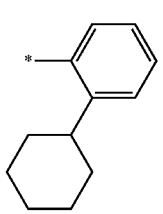 |
| 10-89 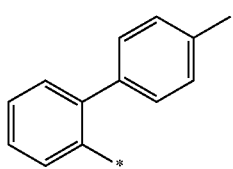 | 10-97 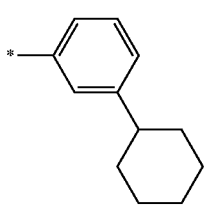 |
| 10-90 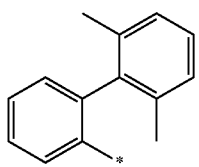 | 10-98 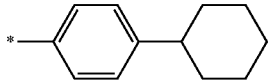 |
| 10-91 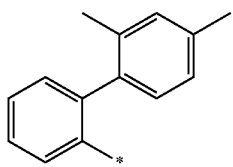 | 10-99 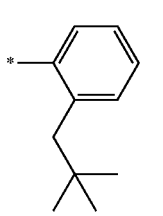 |
| 10-92 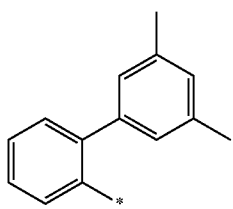 | 10-100 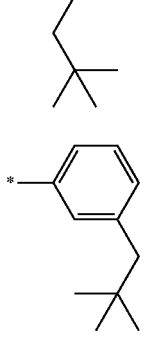 |

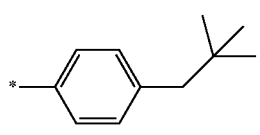
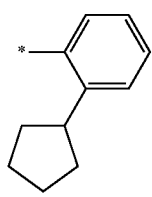
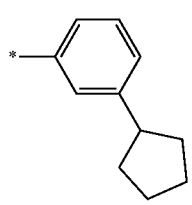
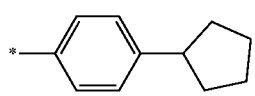
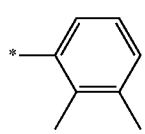
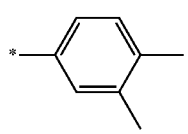
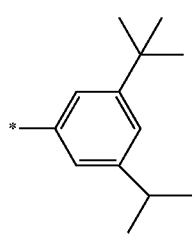
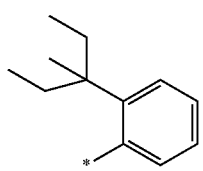
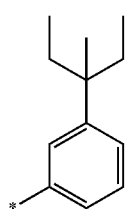
10-101
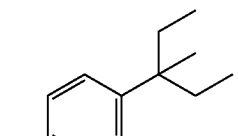
10-102
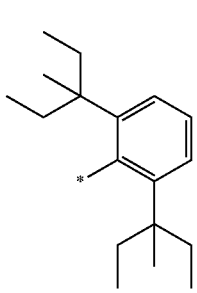
10-103
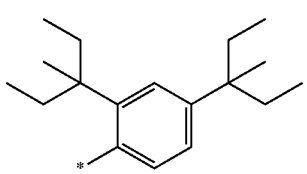
10-104
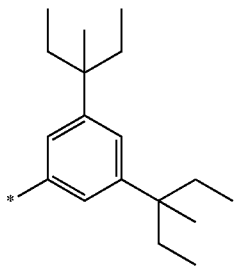
10-105
10-106
10-107
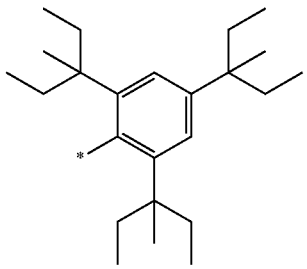
10-108
10-109
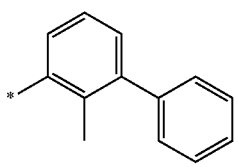
10-110
10-111
10-112
10-113
10-114
10-115
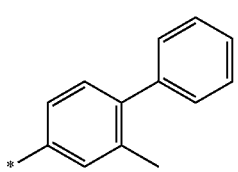
10-116

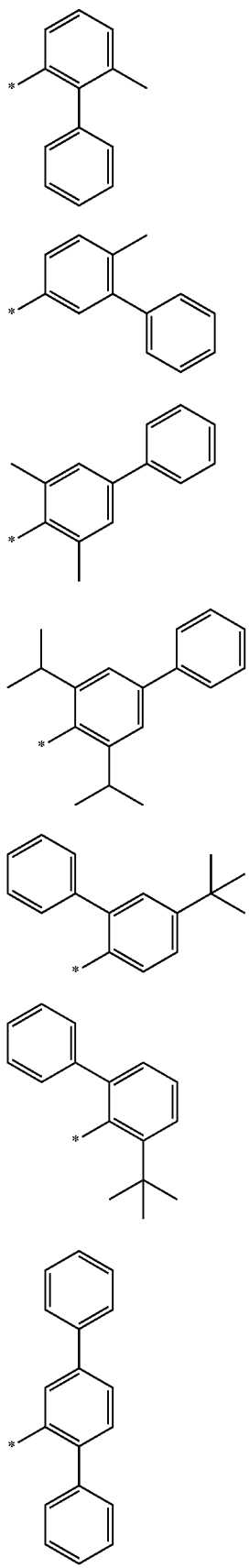
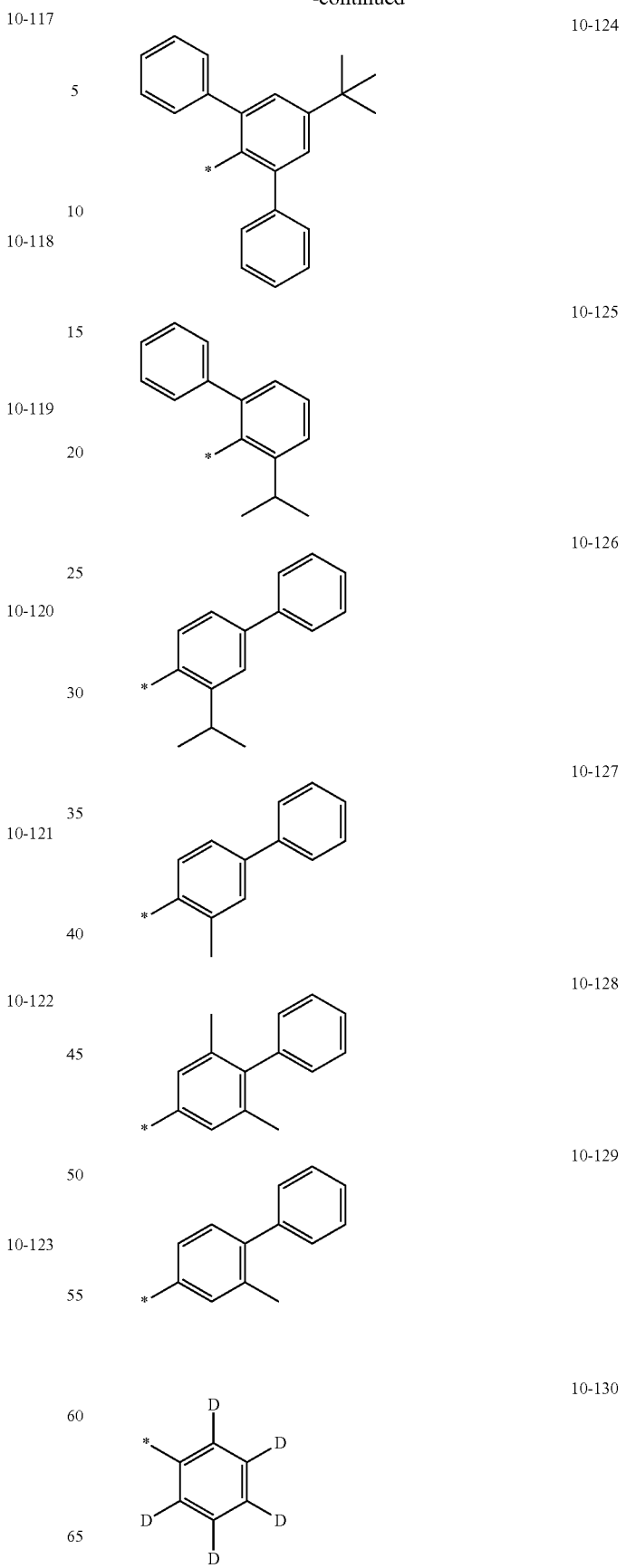

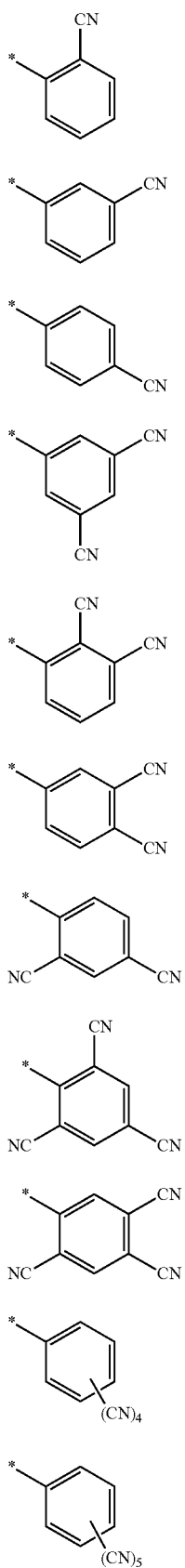
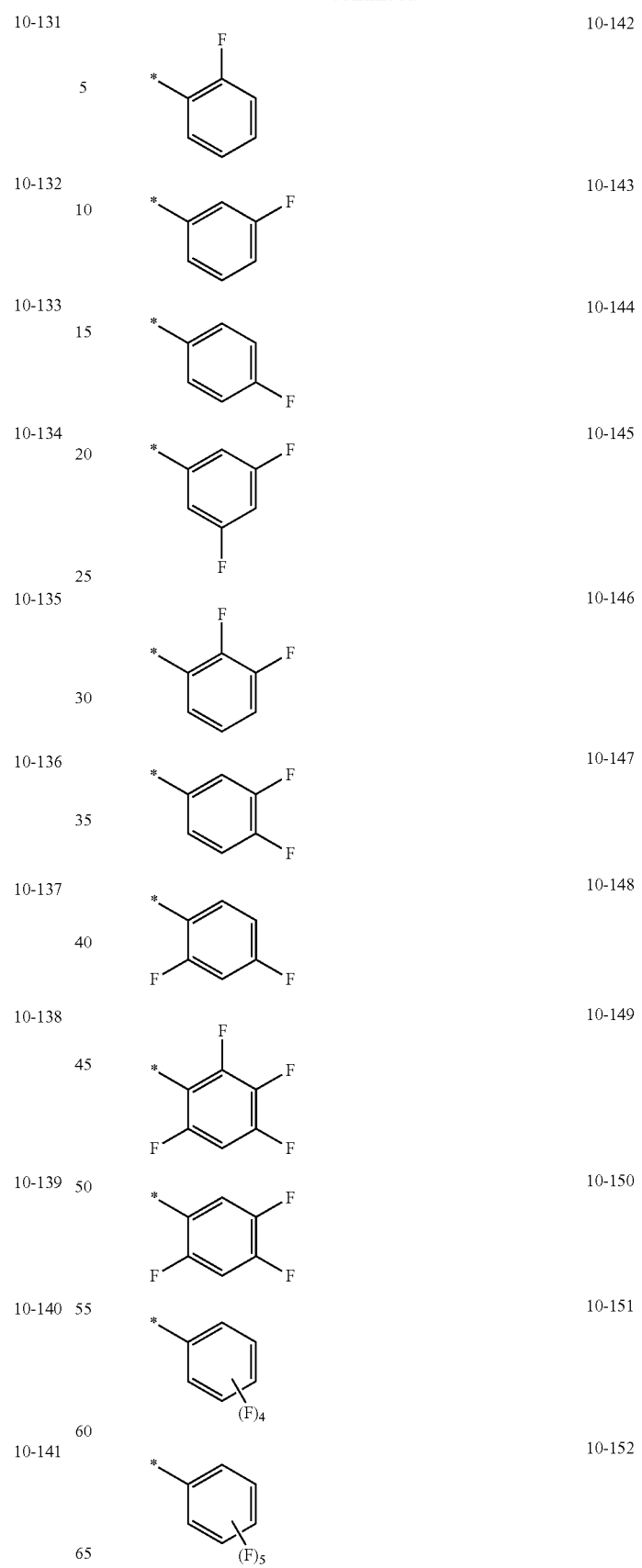

-continued
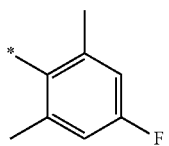
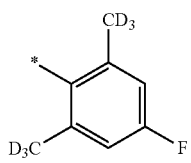
10-201
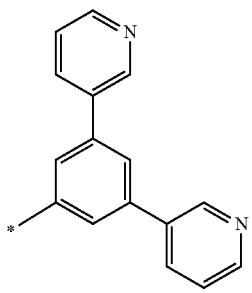
10-202
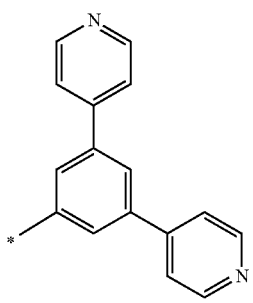
10-203
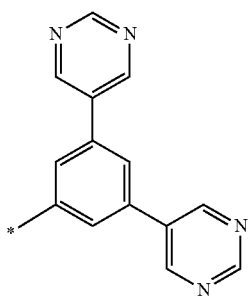
-continued
10-153
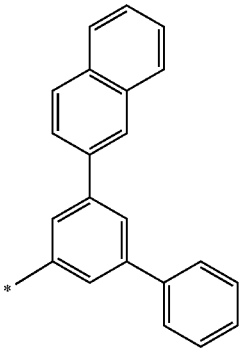
10-154
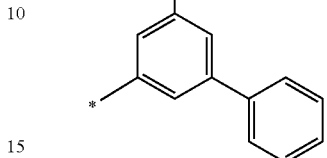
10-201
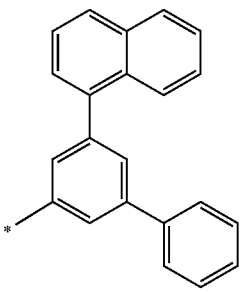
10-204
10-205
10-202
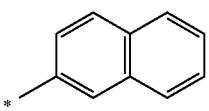
10-206
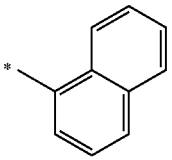
10-207
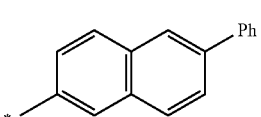
10-208
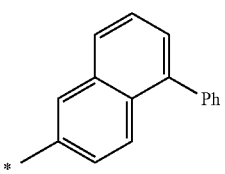
10-209
10-203
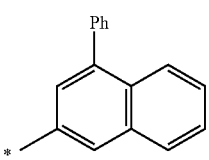
10-210
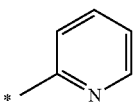
10-211

| | |
|---|---|
| 10-212 | |
| 10-213 | |
| 10-214 | |
| 10-215 | |
| 10-216 | |
| 10-217 | |
| 10-218 | |
| 10-219 | |
| 10-220 | |
| 10-221 | |
| 10-222 | |
| 10-223 | |
| 10-224 | |
| 10-225 | |
| 10-226 | |
| 10-227 | |
| 10-228 | |
| 10-229 | |
| 10-230 | |
| 10-231 | |
| 10-232 | |
| 10-233 | |

10-234 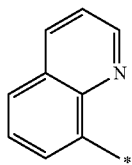
10-235 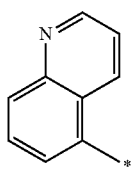
10-236 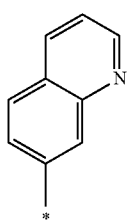
10-237 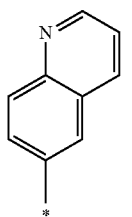
10-238 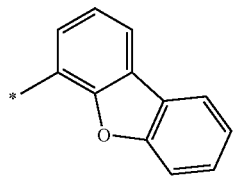
10-239 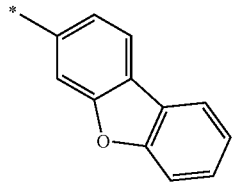
10-240 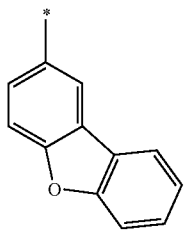
10-241 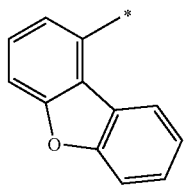
10-242 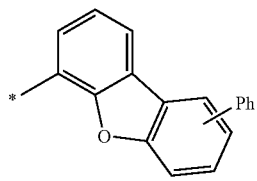
10-243 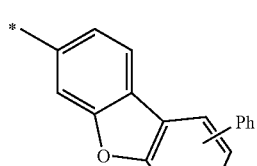
10-244 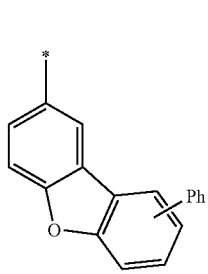
10-245 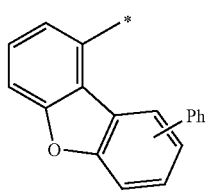
10-246 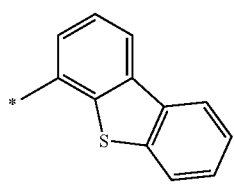
10-247 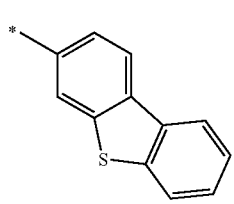

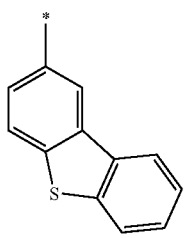
10-248
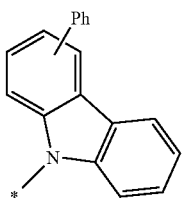
10-255
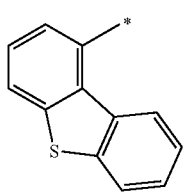
10-249
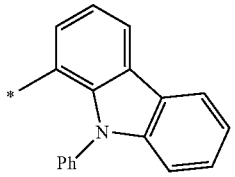
10-256
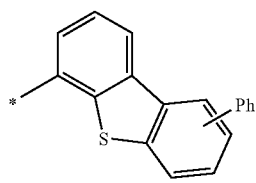
10-250
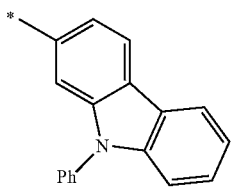
10-257
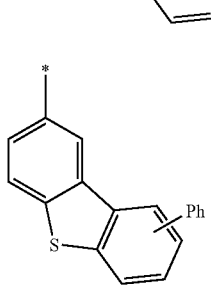
10-251
10-252
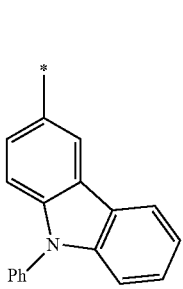
10-258
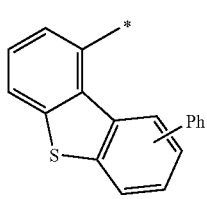
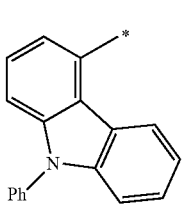
10-259
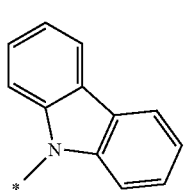
10-253
10-254
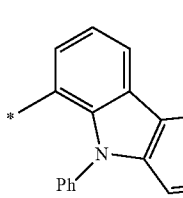
10-260
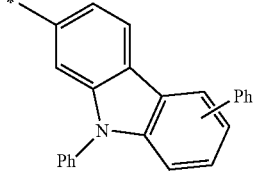
10-261

10-262 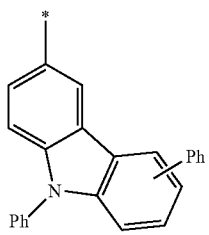
10-263 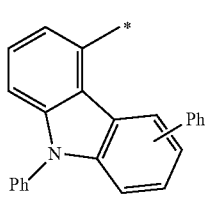
10-264 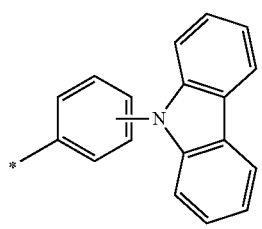
10-265 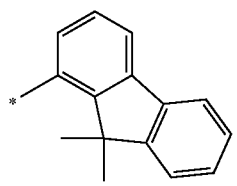
10-266 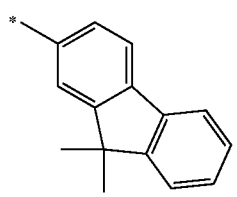
10-267 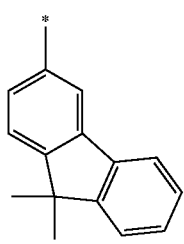
10-268 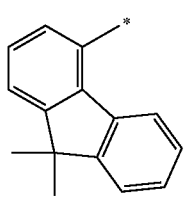
10-269 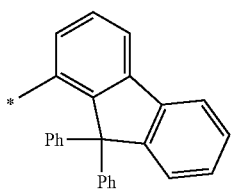
10-270 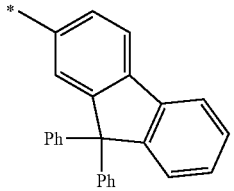
10-271 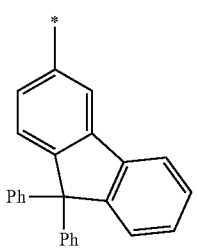
10-272 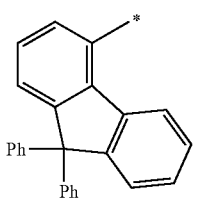
10-273 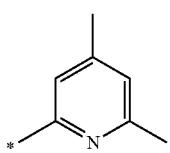
10-274 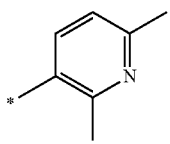
10-275 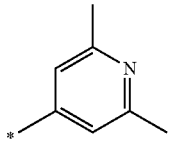
10-276 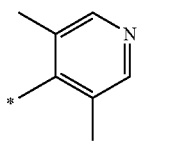

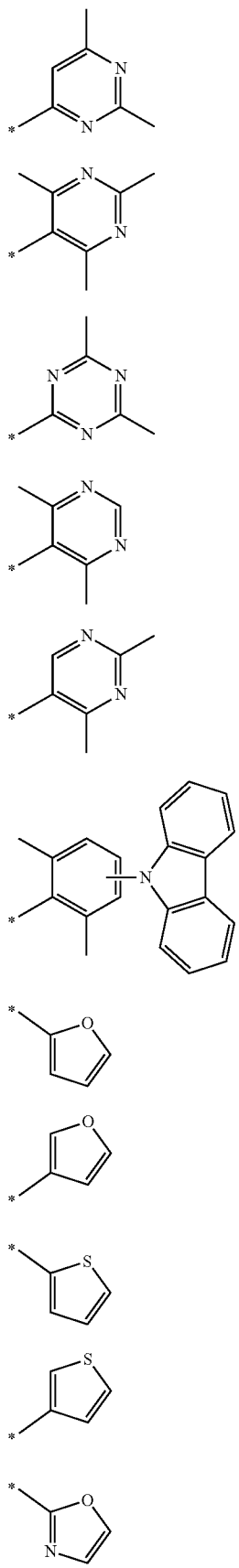
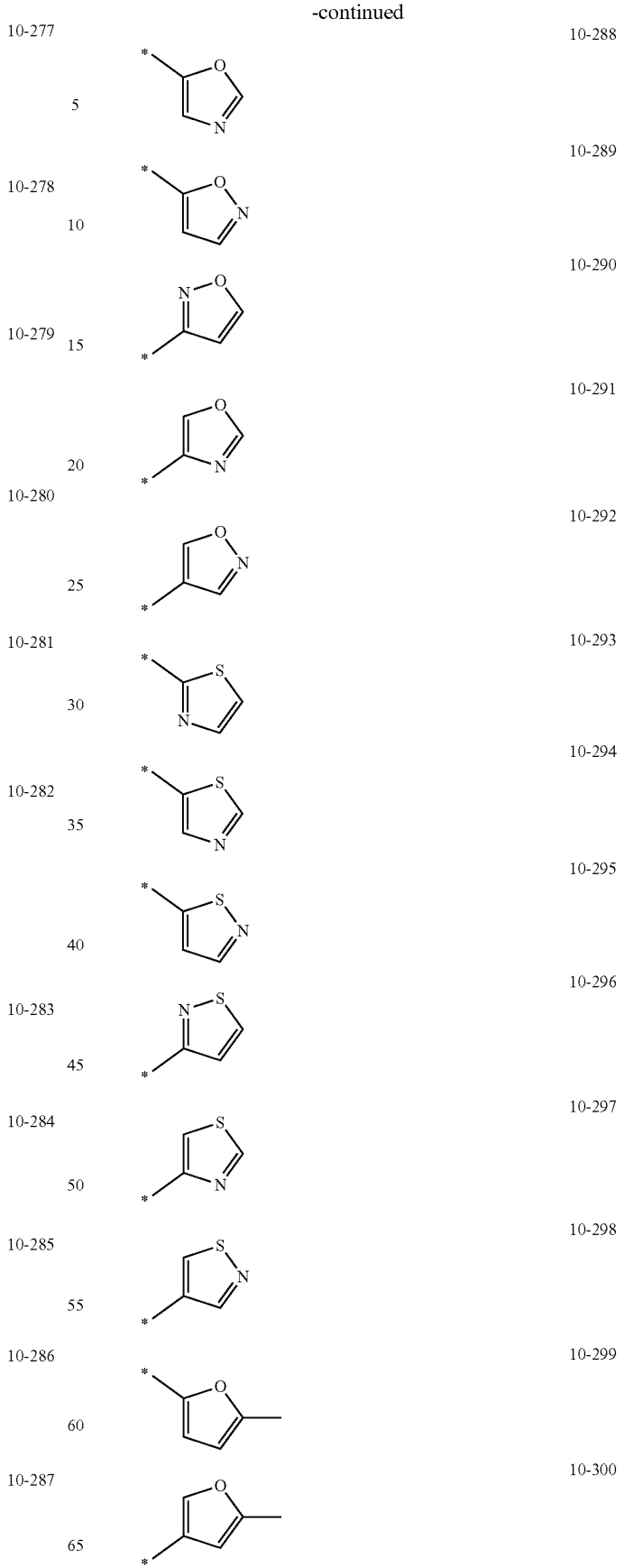

| | |
|---|---|
| 10-301 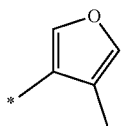 | 10-310 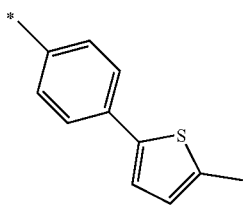 |
| 10-302 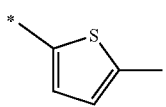 | |
| 10-303 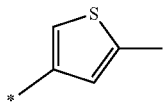 | 10-311 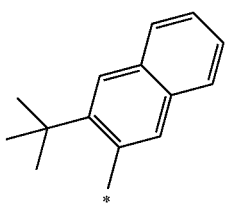 |
| 10-304 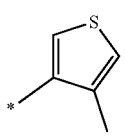 | 10-312 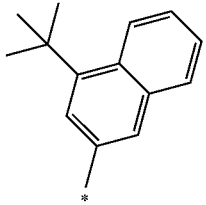 |
| 10-305 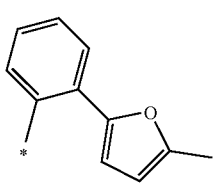 | 10-313 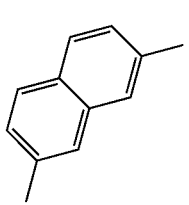 |
| 10-306 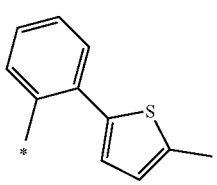 | 10-314 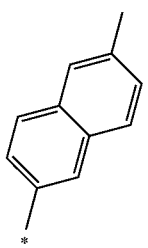 |
| 10-307 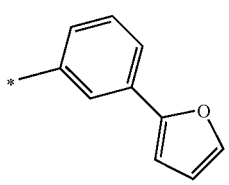 | 10-315 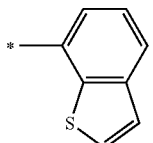 |
| 10-308 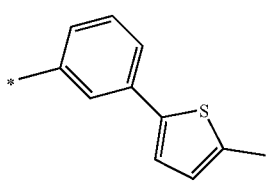 | 10-316 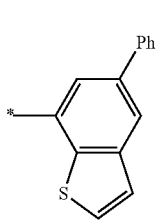 |
| 10-309 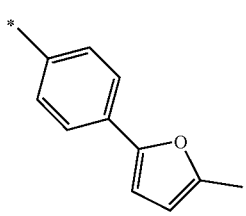 | |

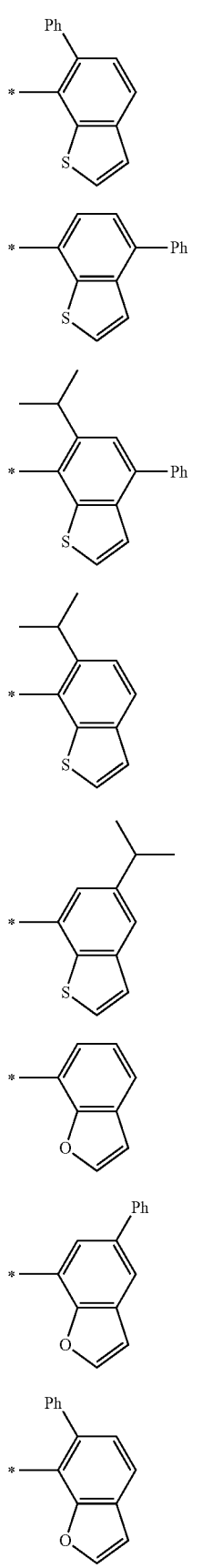
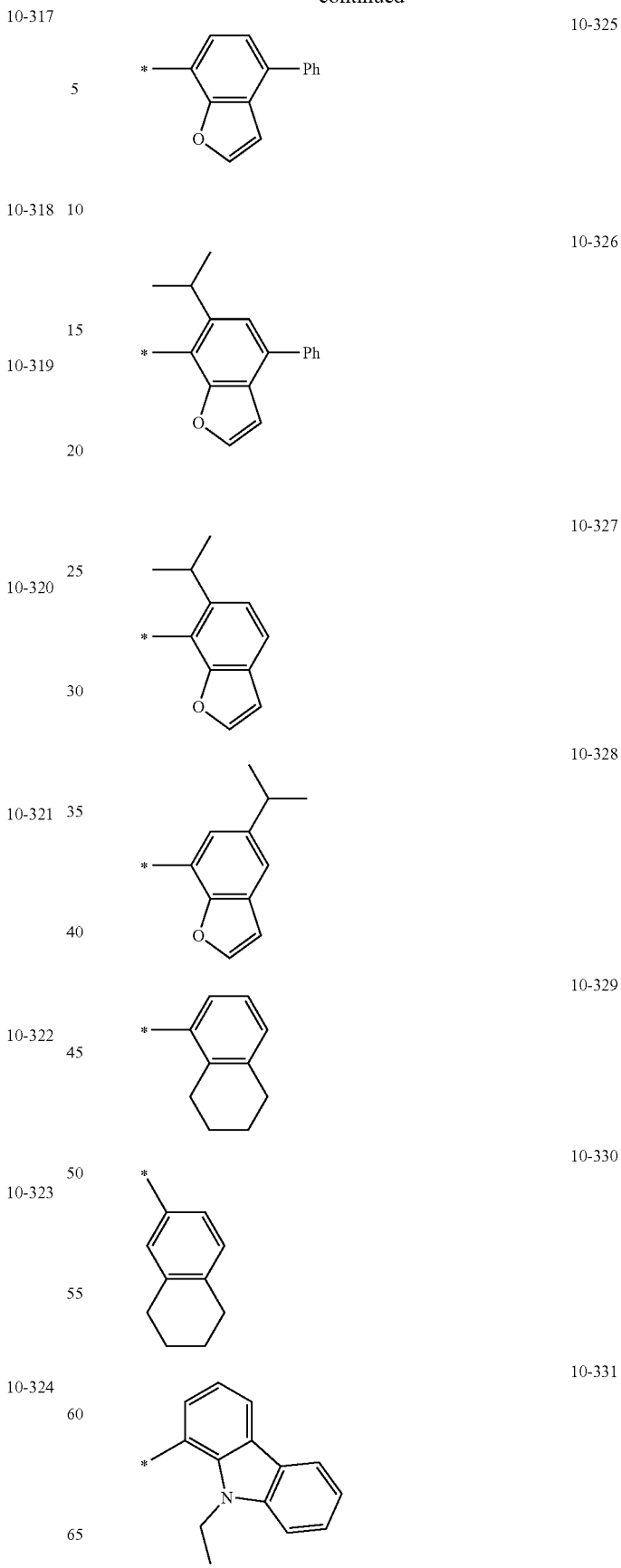

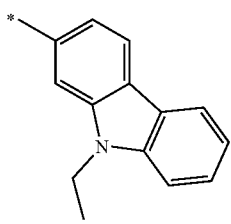
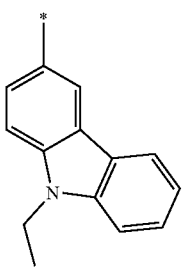
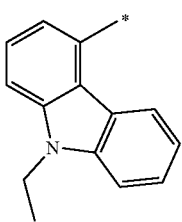
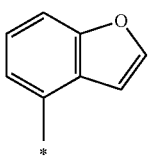
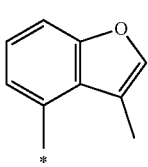
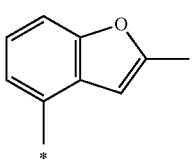
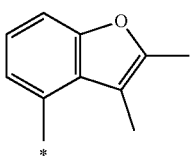
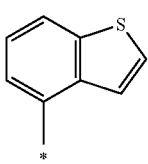
10-332
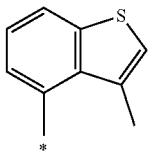
10-333
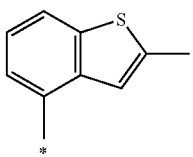
10-334
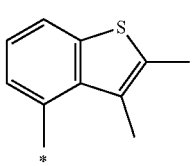
10-335
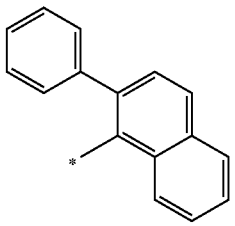
10-336
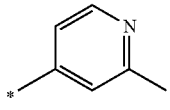
10-337
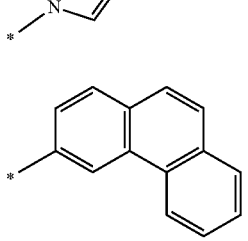
10-338
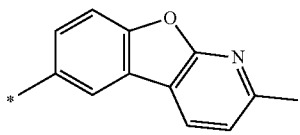
10-339
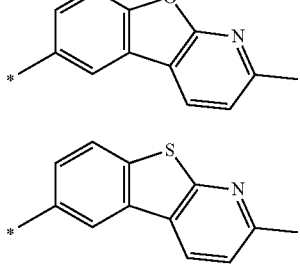
10-340
10-341
10-342
10-343
10-344
10-345
10-346
10-347
10-348
10-349

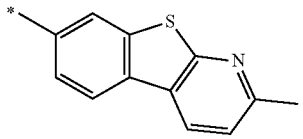

10-350 wherein, in Formulae 9-1 to 9-67, 9-201 to 9-244, 10-1 to 10-154, and 10-201 to 10-350, * indicates a binding site to a neighboring atom, Ph is a phenyl group, TMS is a trimethylsilyl group, and TMG is a trimethylgermyl group.

In one or more embodiments, $R_{10}$, $R_{21}$ to $R_{28}$, $R_{31}$ to $R_{37}$, and $R_{41}$ to $R_{44}$ may each independently be hydrogen, deuterium, a methyl group, an ethyl group, a propyl group, a 1-methylethyl group, a butyl group, a 2-methylpropyl group, a 1-methylpropyl group, a 1,1-dimethylethyl group, a pentyl group, a 3-methylbutyl group, a 2-methylbutyl group, a 1-methylbutyl group, a 1,1-dimethylpropyl group, a 2,2-dimethylpropyl group, a 1-ethylpropyl group, a 3-methyl-2-butyl group, a phenyl group, a biphenyl group, a $C_1$-$C_{20}$ alkylphenyl group, or a naphthyl group.

In one or more embodiments, $R_{10}$ and $R_{21}$ to $R_{28}$ may each independently be hydrogen, a $C_1$-$C_{60}$ alkyl group, a $C_1$-$C_{60}$ aryl group, —Si($Q_1$)($Q_2$)($Q_3$), or —Ge($Q_1$)($Q_2$)($Q_3$).

In one or more embodiments, $R_{31}$ to $R_{37}$ may each independently be hydrogen, deuterium, a methyl group, an ethyl group, a propyl group, a 1-methylethyl group, a butyl group, a 2-methylpropyl group, a 1-methylpropyl group, a 1,1-dimethylethyl group, a pentyl group, a 3-methylbutyl group, a 2-methylbutyl group, a 1-methylbutyl group, a 1,1-dimethylpropyl group, a 2,2-dimethylpropyl group, a 1-ethylpropyl group, or a 3-methyl-2-butyl group.

In one or more embodiments, $R_{41}$ to $R_{44}$ may each independently be hydrogen, deuterium, a methyl group, an ethyl group, a propyl group, a 1-methylethyl group, a butyl group, a 2-methylpropyl group, a 1-methylpropyl group, a 1,1-dimethylethyl group, a pentyl, a 3-methylbutyl group, a 2-methylbutyl group, a 1-methylbutyl group, a 1,1-dimethylpropyl group, a 2,2-dimethylpropyl group, a 1-ethylpropyl group, a 3-methyl-2-butyl group, a phenyl group, a biphenyl group, a $C_1$-$C_{20}$ alkylphenyl group, or a naphthyl group.

When b10 is 2, two $R_{10}$(s) are identical to or different from each other.

In Formula 1-1, two or more of a plurality of $R_{10}$(s) are optionally linked together to form a substituted or unsubstituted $C_5$-$C_{30}$ carbocyclic group or a substituted or unsubstituted $C_1$-$C_{30}$ heterocyclic group; two or more of $R_{21}$ to $R_{28}$ are optionally linked together to form a substituted or unsubstituted $C_5$-$C_{30}$ carbocyclic group or a substituted or unsubstituted $C_1$-$C_{30}$ heterocyclic group, two or more of $R_{31}$ to $R_{37}$ are optionally linked together to form a substituted or unsubstituted $C_5$-$C_{30}$ carbocyclic group or a substituted or unsubstituted $C_1$-$C_{30}$ heterocyclic group, two or more of $R_{41}$ to $R_{44}$ are optionally linked together to form a substituted or unsubstituted $C_5$-$C_{30}$ carbocyclic group or a substituted or unsubstituted $C_1$-$C_{30}$ heterocyclic group, neighboring two or more of $R_{10}$, $R_{21}$ to $R_{28}$, $R_{31}$ to $R_{37}$, and $R_{41}$ to $R_{44}$ are optionally linked to form a substituted or unsubstituted $C_5$-$C_{30}$ carbocyclic group or a substituted or unsubstituted $C_1$-$C_{30}$ heterocyclic group, and/or neighboring two or more of $R_{10}$, $R_{21}$ to $R_{28}$, $R_{31}$ to $R_{37}$, and $R_{41}$ to $R_{44}$ are optionally linked together to form a substituted or unsubstituted $C_5$-$C_{30}$ carbocyclic group or a substituted or unsubstituted $C_1$-$C_{30}$ heterocyclic group.

In one or more embodiments, in Formula 1-1, two or more of a plurality of $R_{10}$(s); or neighboring two or more of $R_{10}$, $R_{21}$ to $R_{28}$, $R_{31}$ to $R_{37}$, and $R_{41}$ to $R_{44}$ may optionally be linked together via a single bond, a double bond, or a first linking group to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$ (for example, a fluorene group, a xanthene group, an acridine group, or the like, each unsubstituted or substituted with at least one $R_{10a}$). $R_{10a}$ may be as described in connection with $R_{10}$.

The first linking group may be *—N($R_8$)—*', *—B($R_8$)—*', *—P($R_8$)—*', *—C($R_8$)($R_9$)—*', *—Si($R_8$)($R_9$)—*', *—Ge($R_8$)($R_9$)—*', *—S—*', *—Se—*', *—O—*', *—C(=O)—*', *—S(=O)—*', *—S(=O)$_2$—*',* C($R_8$)=*', *=C($R_8$)—*', *—C($R_8$)=C($R_9$)—*', *—C(=S)—*', or *—C≡C—*', $R_8$ and $R_9$ may respectively be as described in connection with $R_{10}$ and * and *' each indicate a binding site to a neighboring atom.

In one or more embodiments, each $Ln_1$ may be represented by one of Formulae 11-1 to 11-12:

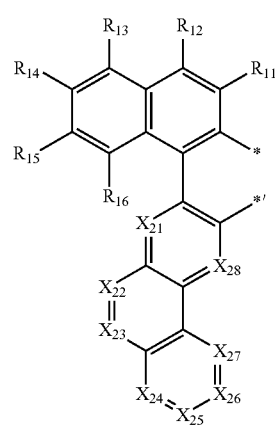

11-1

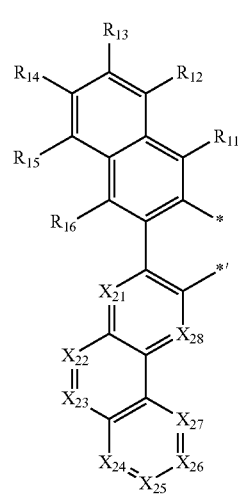

11-2

11-3
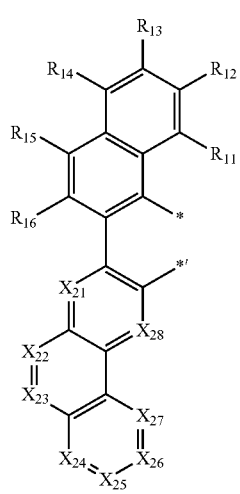
11-4
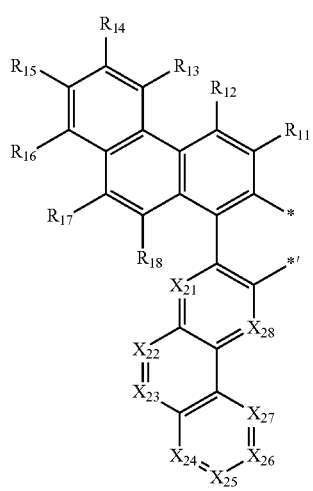
11-5
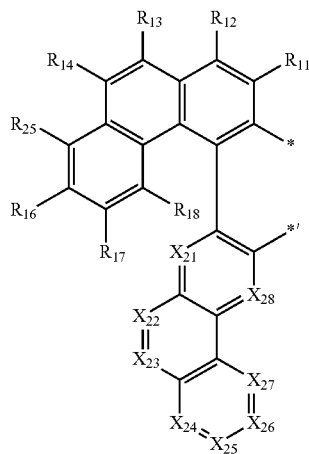
11-6
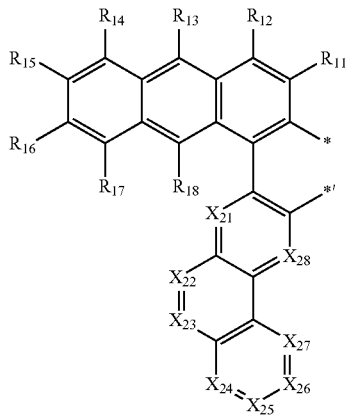
11-7
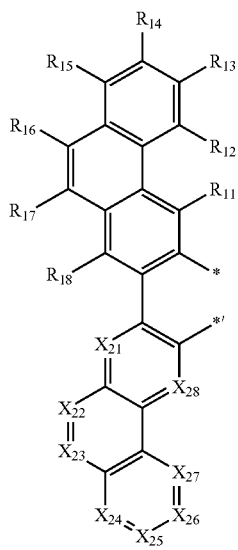
11-8
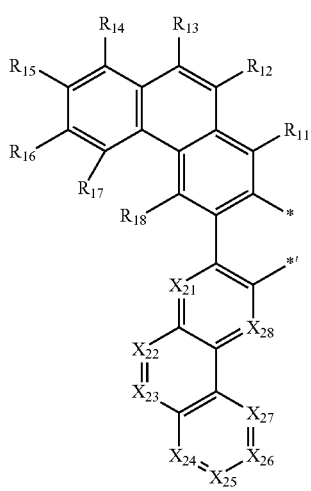

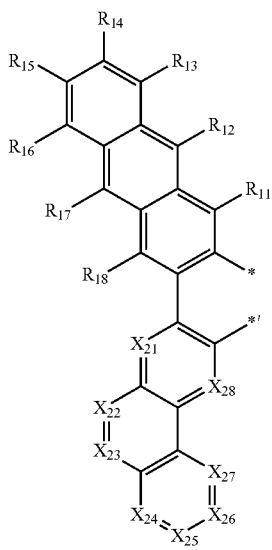
11-9
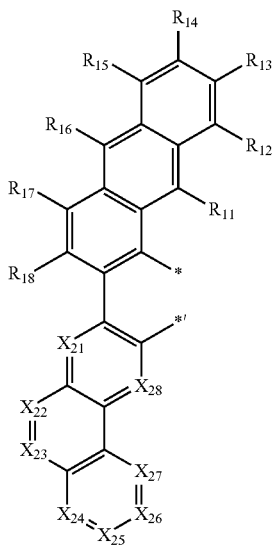
11-12
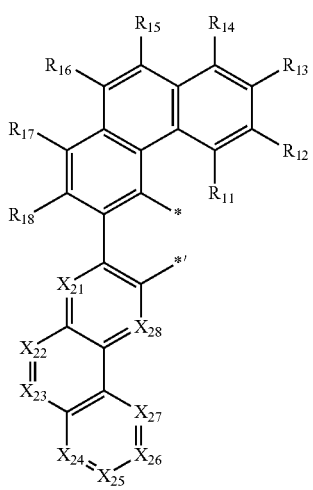
11-10
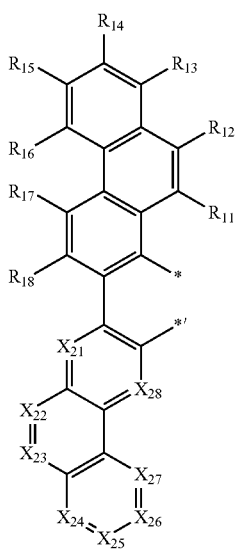
11-11
wherein, in Formulae 11-1 to 11-12,
$M_1$, n1, n2, and $X_{21}$ to $X_{28}$ may respectively be as described herein,
$R_{11}$ to $R_{18}$ may respectively be as described in connection with $R_{10}$ and
* and *' each indicate a binding site to $M_1$.
In one or more embodiments, each $Ln_2$ may be represented by one of Formulae 21-1 to 21-4:
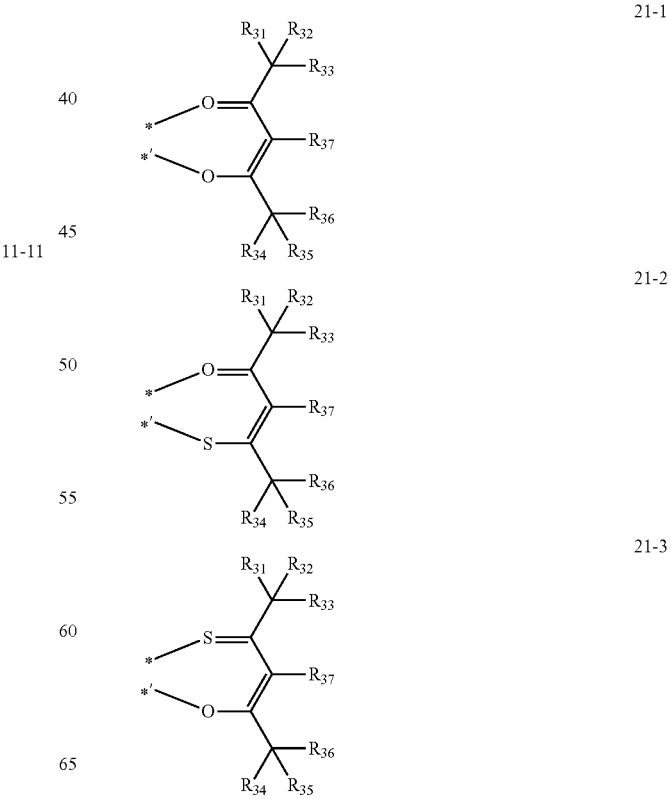

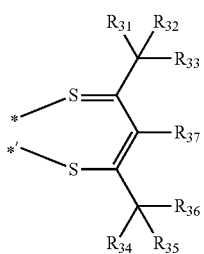
wherein, in Formulae 21-1 to 21-4,
$R_{31}$ to $R_{37}$ may respectively be as described herein, and * and *' each indicate a binding site to $M_1$.
In one or more embodiments, each $Ln_2$ may be represented by one of Formulae 22-1 to 22-16:
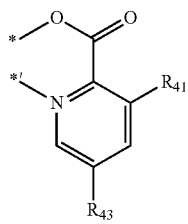
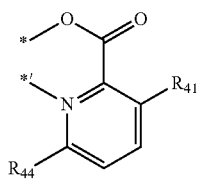
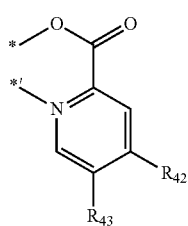
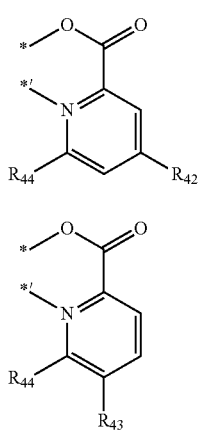
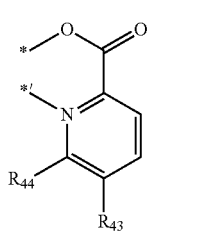
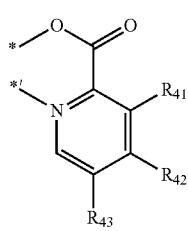
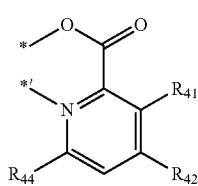

-continued
22-14
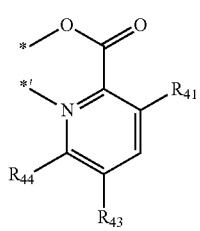
22-15
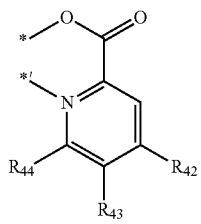
22-16
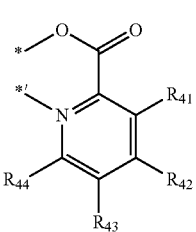
wherein, in Formulae 22-1 to 22-16,
R$_{41}$ to R$_{44}$ may respectively be as described herein, and may not each independently be hydrogen, and
* and *' each indicate a binding site to M$_1$.
In one or more embodiments, the organometallic compound may be a compound represented by one or more of Formulae 31-1 to 31-24:
31-1
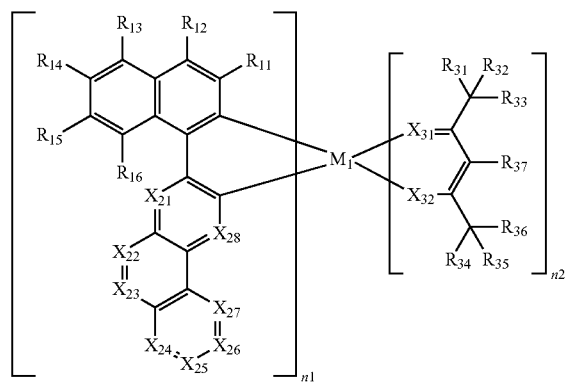
31-2
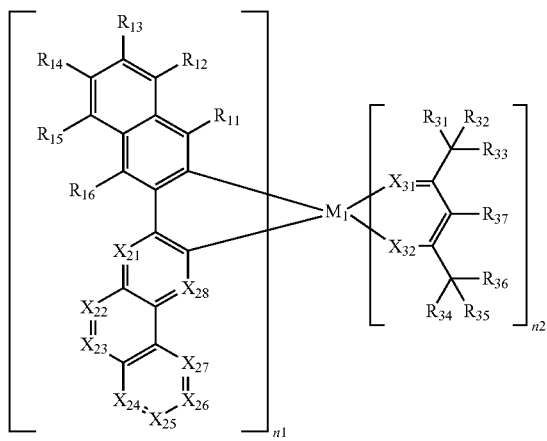

31-3
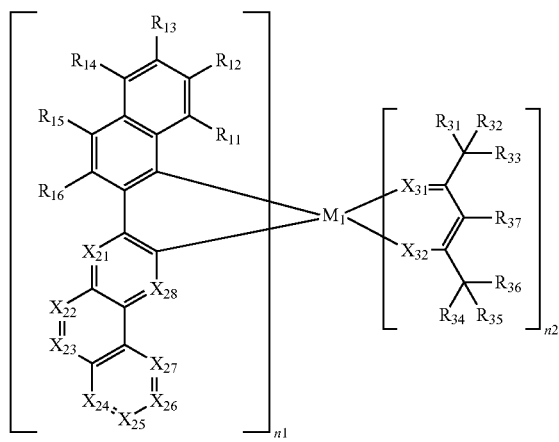
31-4
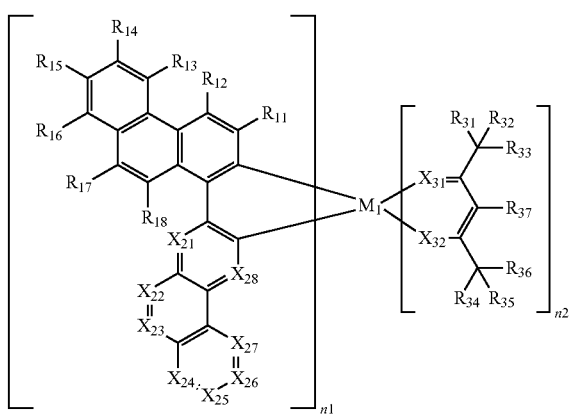
31-5
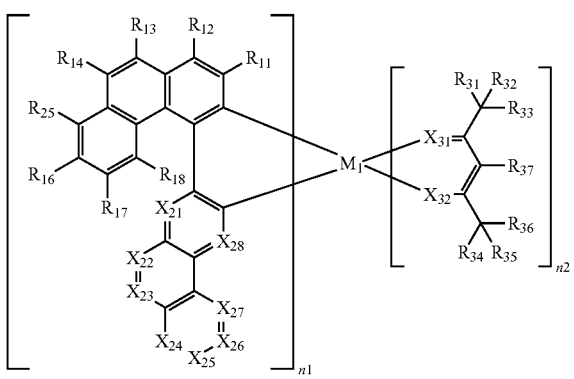
31-6
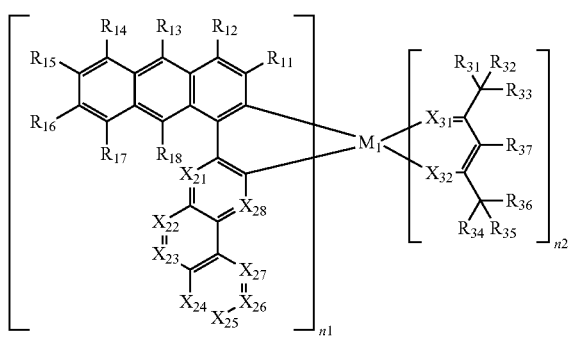

31-7
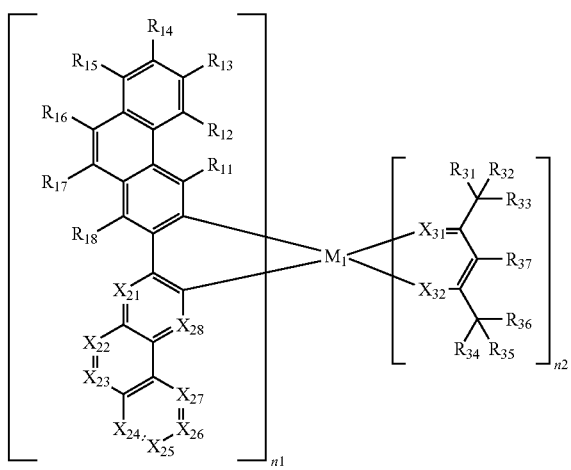
31-8
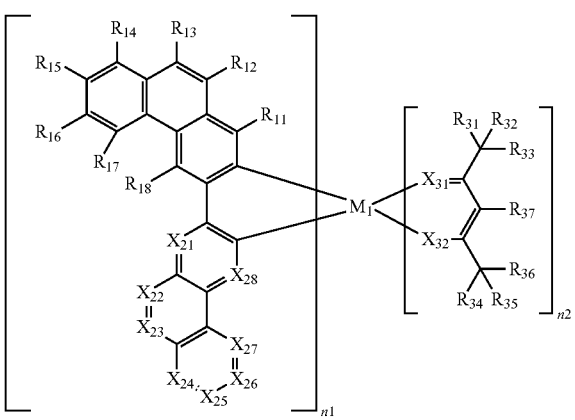
31-9
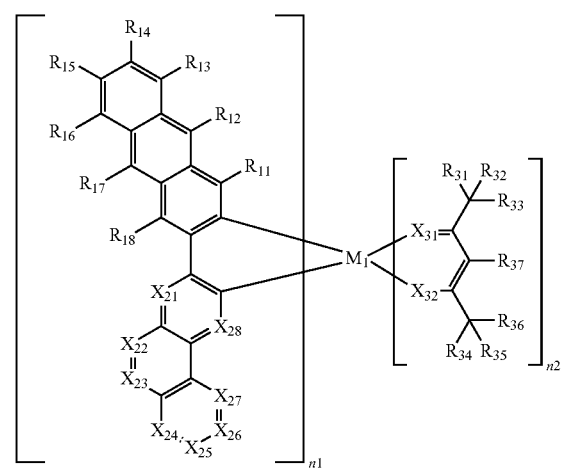

31-10
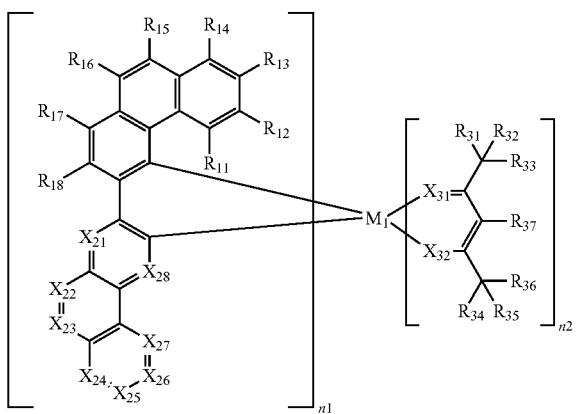
31-11
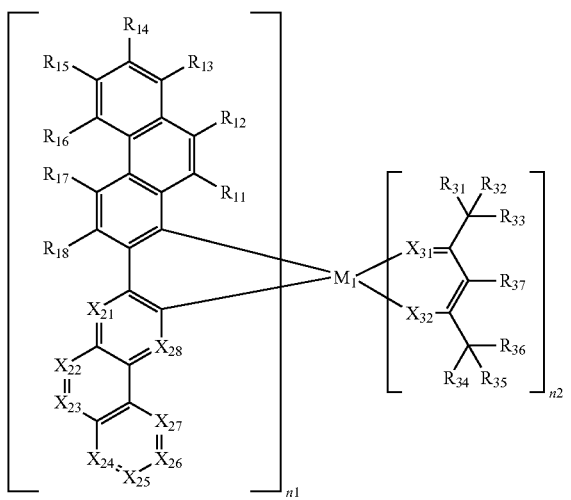
31-12
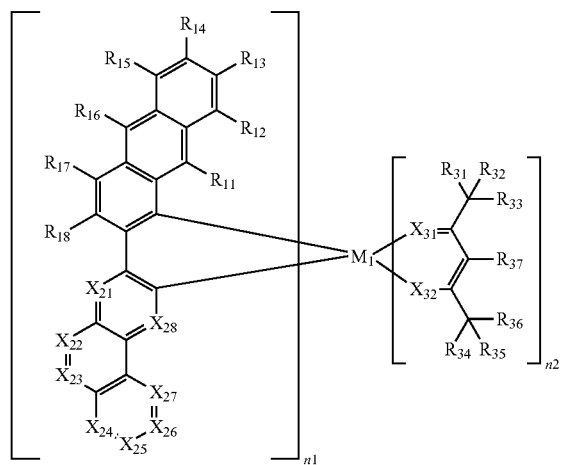

31-13
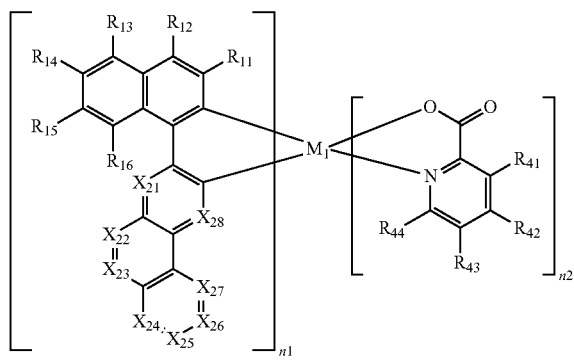
31-14
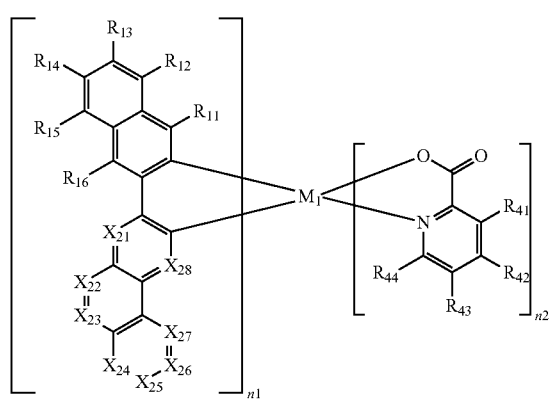
31-15
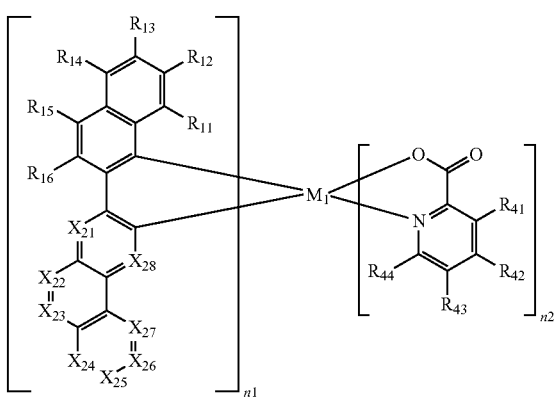
31-16
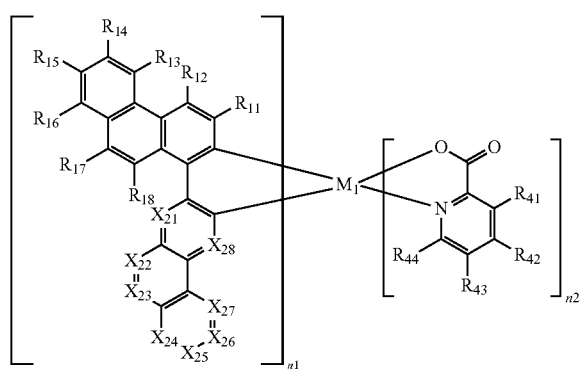

-continued
31-17
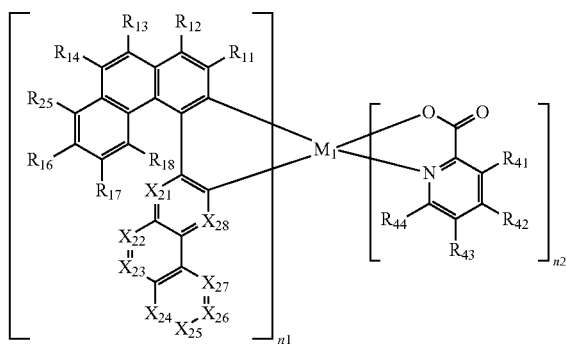
31-18
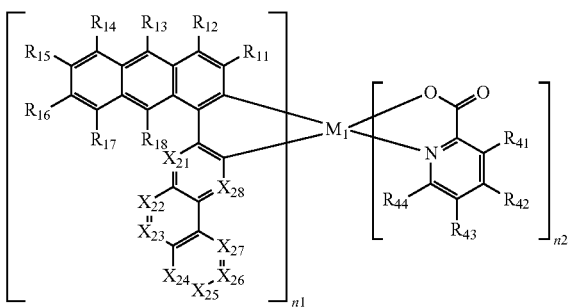
31-19
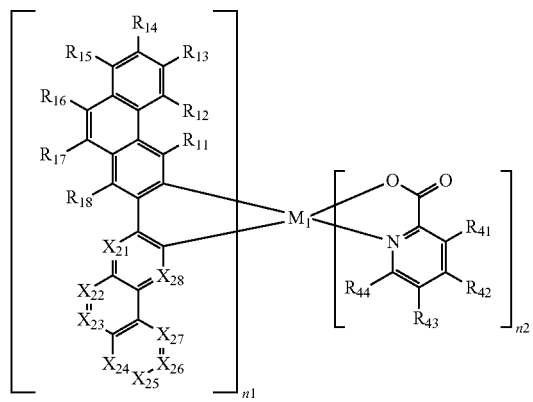
31-20
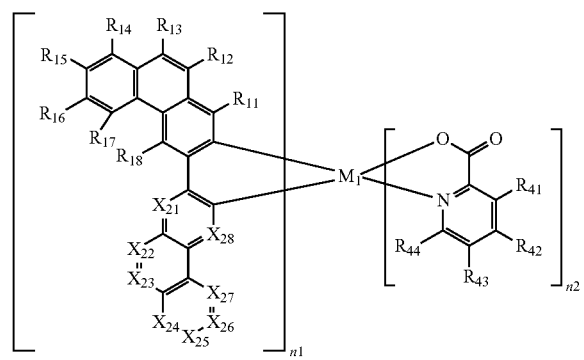

31-21
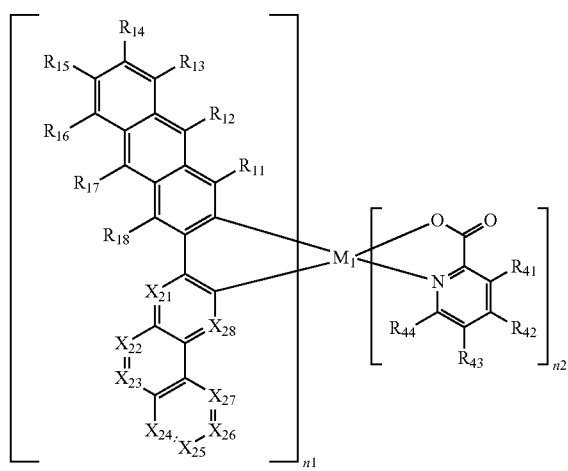
31-22
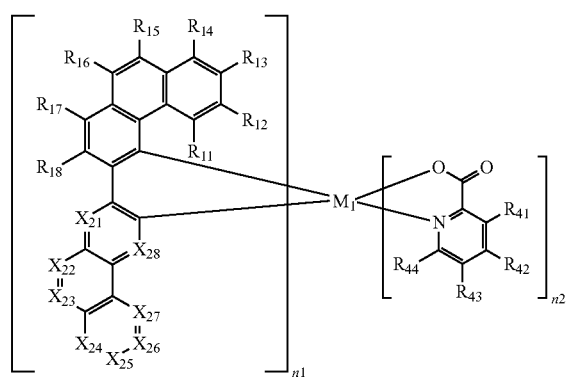
31-23
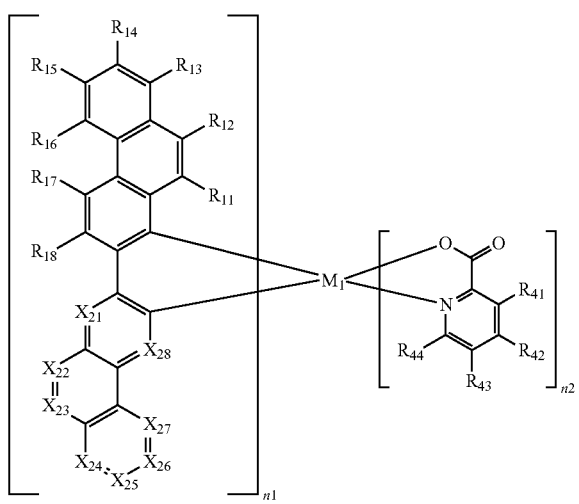

31-24
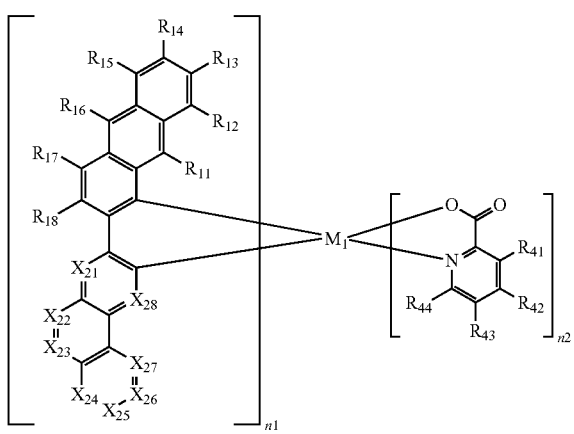
wherein, in Formulae 31-1 to 31-24,
$M_1$, n1, n2, $X_{21}$ to $X_{28}$, $R_{31}$ to $R_{37}$, and $R_{41}$ to $R_{44}$ may respectively be as described herein, and
$R_{11}$ to $R_{18}$ may respectively be as described in connection with $R_{10}$.
In one or more embodiments, the organometallic compound may be electrically neutral.
In one or more embodiments, the organometallic compound may be one or more of Compounds 1 to 17:
1
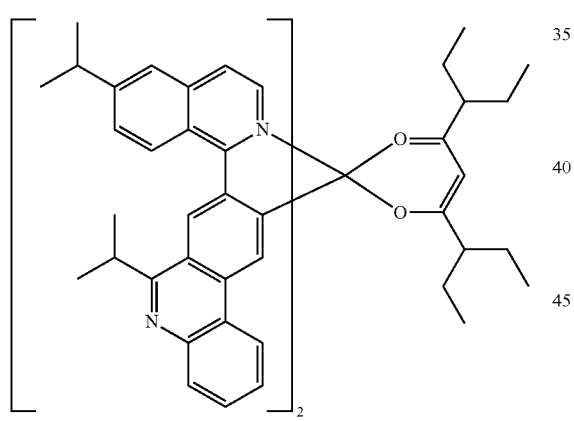
2
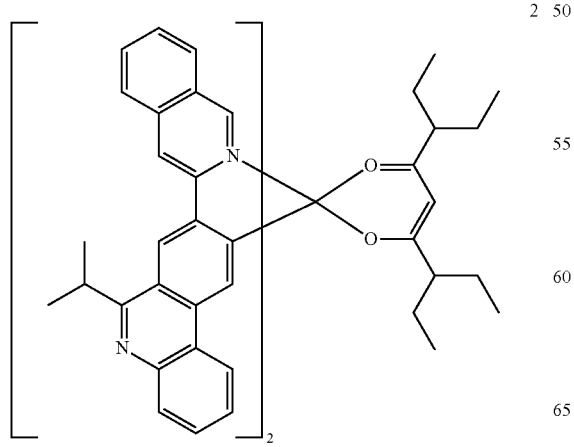
-continued
3
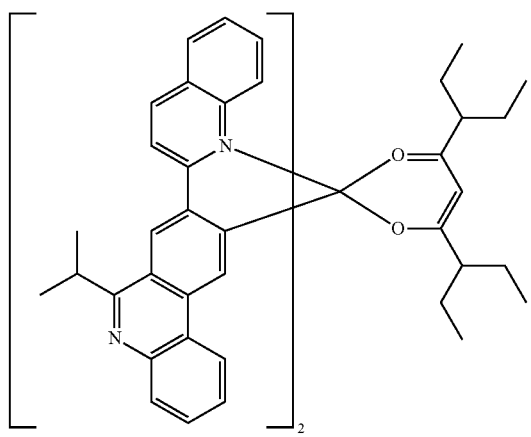
4
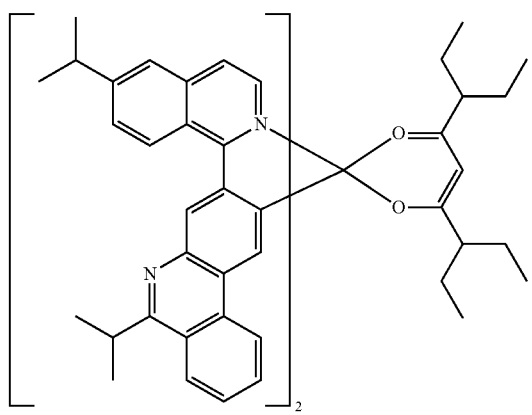

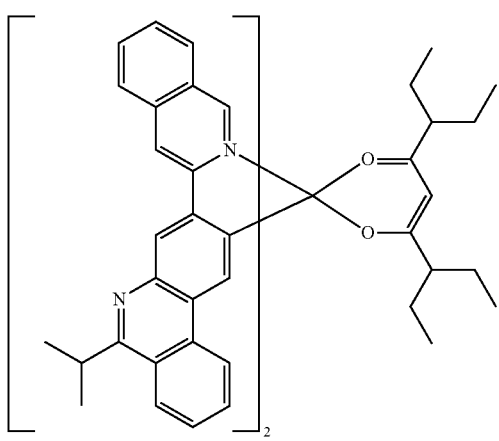
5
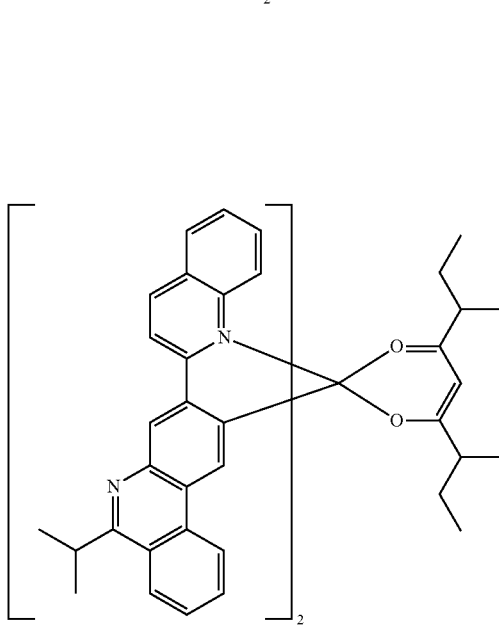
6
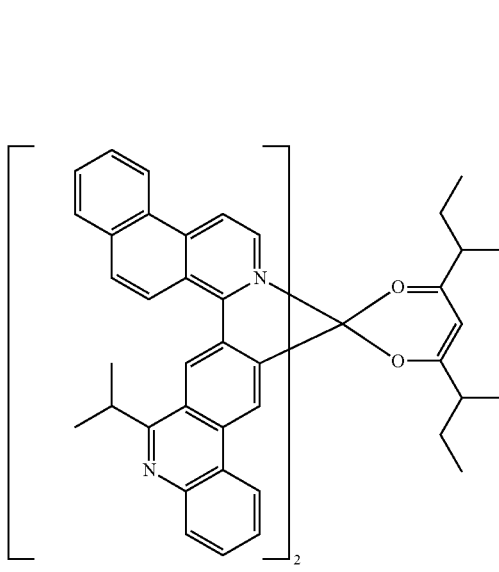
7
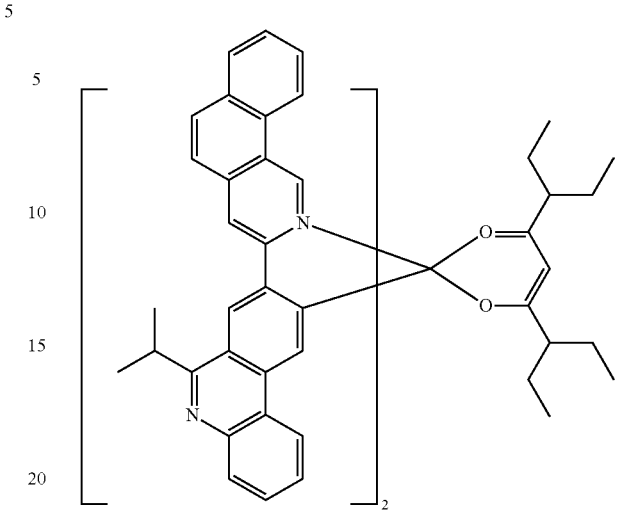
8
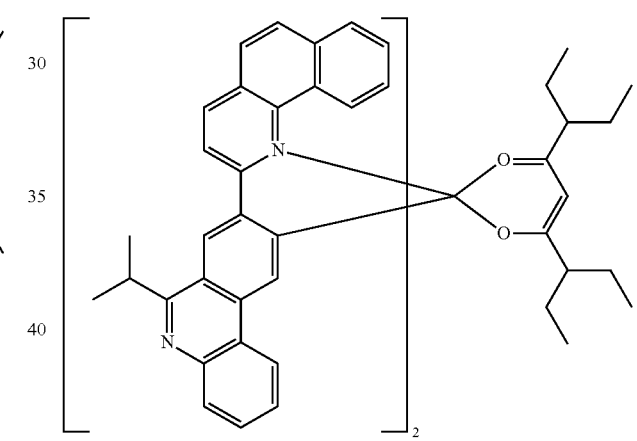
9
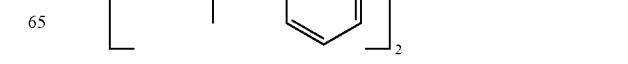
10

83
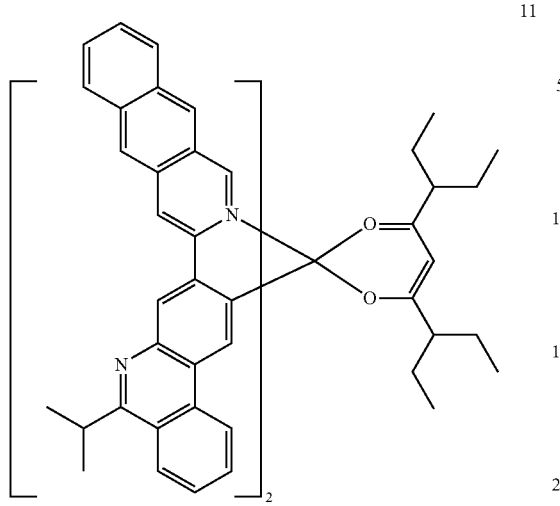
11
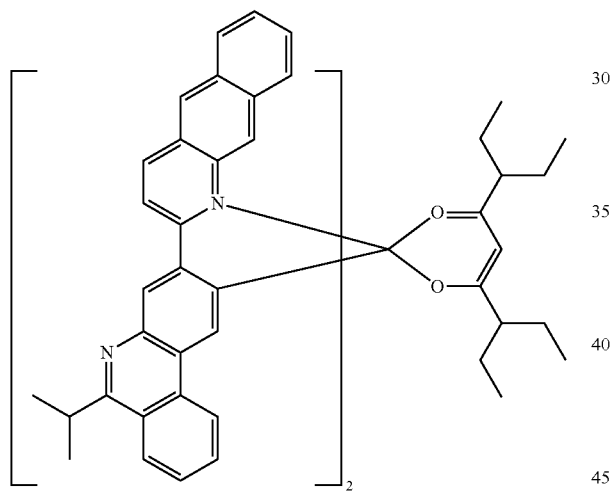
12
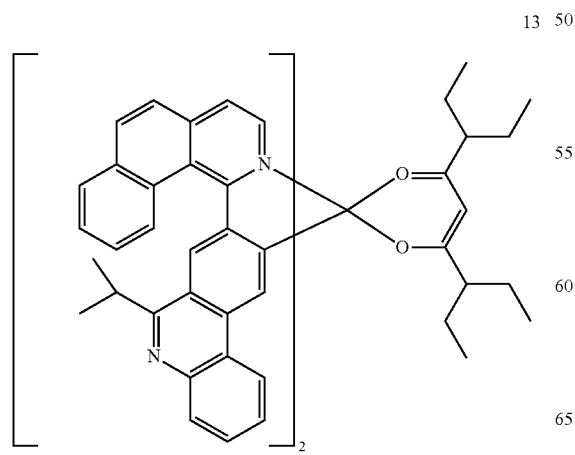
13
84
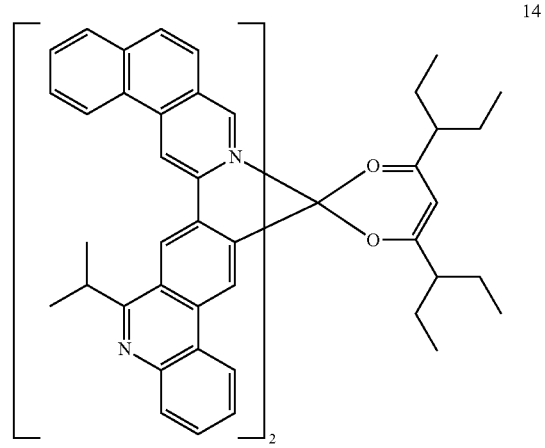
14
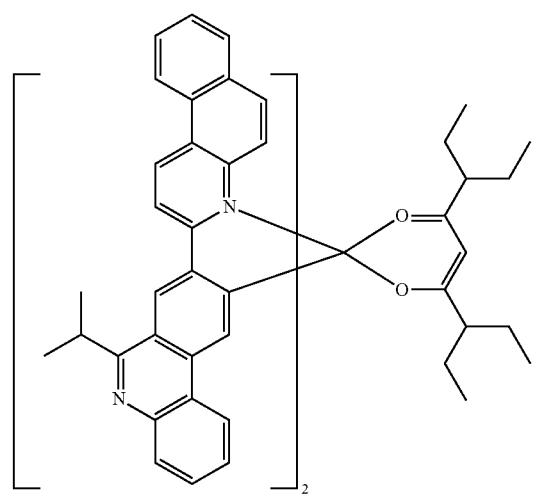
15
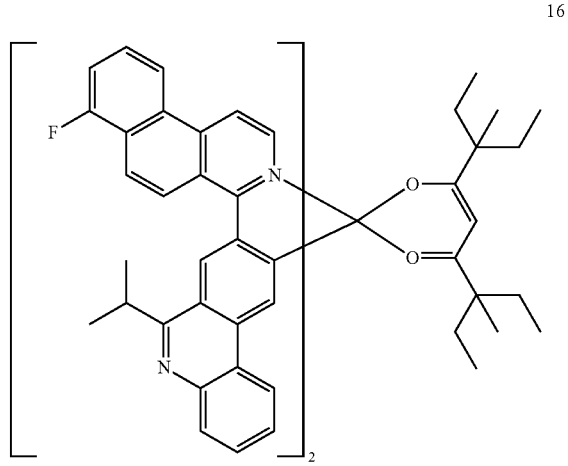
16

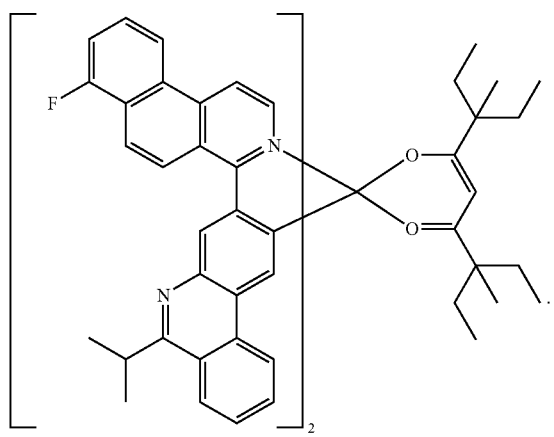

17

The organometallic compound represented by Formula 1 may satisfy the structure of Formula 1 described above. In detail, and without withing to be bound to theory, the ligand represented by Formula 1-1 may have a lowest unoccupied molecular orbital (LUMO) ring with a bicyclic to tricyclic structure of quinoline, isoquinoline, benzoquinoline, or benzoisoquinoline and a highest occupied molecular orbital (HOMO) ring with an N-containing tricyclic structure, and in this regard, the organometallic compound may have a long-conjugated structure, thereby improving molecular stability and photoalignment. In addition, the organometallic compound may include the ligand represented by Formula 2-1 or 2-2. Due to this structure, an electronic device, for example, an organic light-emitting device, including the organometallic compound represented by Formula 1 may exhibit low driving voltage, high efficiency, and long lifespan, and may have a reduced full-width at half maximum (FWHM).

The HOMO energy level (electron volts, eV), LUMO energy level (eV), lowest excited triplet (Ti) energy level (eV), and lowest excited singlet (Si) energy level (eV) of exemplary organometallic compounds represented by Formula 1 were calculated using a density functional theory (DFT) method of the Gaussian 09 program with the molecular structure optimized at the B3LYP level, and results thereof are shown in Table 1.

TABLE 1

| Compound | HOMO (eV) | LUMO (eV) | $T_1$ (eV) | $S_1$ (eV) |
|---|---|---|---|---|
| Compound 1 | −4.984 | −2.059 | 2.282 | 2.115 |
| Compound 4 | −4.699 | −1.914 | 2.159 | 1.989 |
| Compound 16 | −5.098 | −2.175 | 2.291 | 2.147 |
| Compound 17 | −4.812 | −2.040 | 2.157 | 2.000 |

TABLE 1-continued

| Compound | HOMO (eV) | LUMO (eV) | $T_1$ (eV) | $S_1$ (eV) |
|---|---|---|---|---|

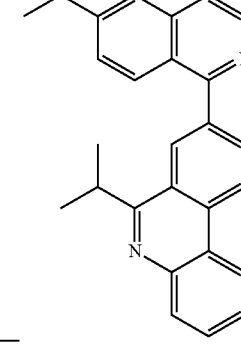

1

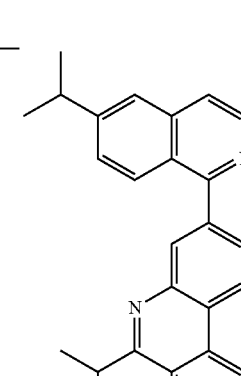

4

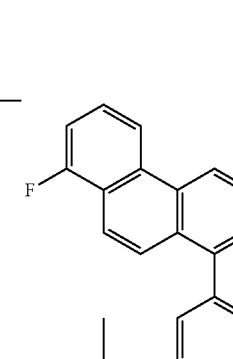

16

TABLE 1-continued

| Compound | HOMO (eV) | LUMO (eV) | $T_1$ (eV) | $S_1$ (eV) |
| --- | --- | --- | --- | --- |

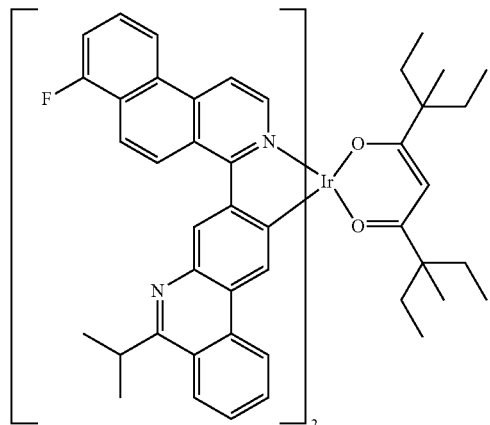

17

Referring to Table 1, it was confirmed that the organometallic compound represented by Formula 1 has suitable electrical characteristics for use as a dopant in an electric device, for example, an organic light-emitting device.

In one or more embodiments, the FWHM of an emission peak of an emission spectrum or an electroluminescence (EL) spectrum of the organometallic compound may be equal to or less than 75 nanometer (nm). In one or more embodiments, the FWHM of an emission peak of an emission spectrum or an EL spectrum of the organometallic compound may be in a range of about 30 nm to about 75 nm, about 40 nm to about 70 nm, or about 45 nm to about 68 nm.

In one or more embodiments, a maximum emission wavelength (also referred to as an emission peak wavelength, $\lambda_{max}$) of an emission peak of an emission spectrum or an EL spectrum of the organometallic compound may be in a range of about 600 nm to about 750 nm.

Synthesis methods of the organometallic compound represented by Formula 1 may be recognizable by one of ordinary skill in the art by referring to Synthesis Examples described below.

Accordingly, the organometallic compound represented by Formula 1 may be suitable for use as a dopant in an organic layer, for example, an emission layer, of an organic light-emitting device. Thus, another aspect provides an organic light-emitting device including: a first electrode; a second electrode; and an organic layer that is arranged between the first electrode and the second electrode, wherein the organic layer includes an emission layer, and wherein the organic layer further includes at least one organometallic compound represented by Formula 1.

Since the organic light-emitting device includes the organic layer including the organometallic compound represented by Formula 1 as described above, excellent characteristics in terms of driving voltage, current efficiency, external quantum efficiency, roll-off ratio, and lifespan, and relatively narrow FWHM of the emission peak of the EL spectrum may be exhibited.

The organometallic compound represented by Formula 1 may be used (i.e., arranged or located) between a pair of electrodes of the organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 in the emission layer may be less than an amount of the host included in the emission layer).

In one or more embodiments, the emission layer may emit red light. For example, the emission layer may emit red light having a maximum emission wavelength in a range of about 600 nm to about 750 nm.

The expression "(an organic layer) includes at least one organometallic compound represented by Formula 1" as used herein may include a case in which "(an organic layer) includes identical organometallic compounds represented by Formula 1" and a case in which "(an organic layer) includes two or more different organometallic compounds represented by Formula 1".

In one or more embodiments, the organic layer may include, as the organometallic compound, only Compound 1. In this embodiment, Compound 1 may be included in the emission layer of the organic light-emitting device. In one or more embodiments, the organic layer may include, as the organometallic compound, Compound 1 and Compound 2. In this embodiment, Compound 1 and Compound 2 may exist in an identical layer (for example, Compound 1 and Compound 2 may all exist in the emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In one or more embodiments, in the organic light-emitting device, the first electrode may be an anode, the second electrode may be a cathode, and the organic layer may further include a hole transport region between the first electrode and the emission layer and an electron transport region between the emission layer and the second electrode, wherein the hole transport region may include a hole injection layer, a hole transport layer, an electron blocking layer, a buffer layer, or a combination thereof, and the electron transport region may include a hole blocking layer, an electron transport layer, an electron injection layer, or a combination thereof.

The term "organic layer" as used herein refers to a single layer and/or a plurality of layers located between the first electrode and the second electrode of the organic light-emitting device. The "organic layer" may include, in addition to an organic compound, an organometallic complex including metal.

FIGURE is a schematic cross-sectional view of an organic light-emitting device 10 according to one or more embodiments. Hereinafter, the structure and manufacturing method of the organic light-emitting device 10 according to one or more embodiments of the present disclosure will be described in connection with the FIGURE. The organic light-emitting device 10 includes a first electrode 11, an organic layer 15, and a second electrode 19, which are sequentially stacked in the stated order.

A substrate may be additionally arranged under the first electrode 11 or above the second electrode 19. For use as the substrate, any substrate that is generally used in organic light-emitting devices, including those available in the art, may be used, and the substrate may be, for example, a glass substrate or a transparent plastic substrate, each having excellent mechanical strength, thermal stability, transparency, surface smoothness, ease of handling, and/or water resistance.

The first electrode 11 may be, for example, formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. In one or more embodiments, the material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be a metal, such as magnesium (Mg), aluminum (Al), silver (Ag), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO, but the structure of the first electrode 11 is not limited thereto.

The organic layer 15 is arranged on the first electrode 11.

The organic layer 15 may include: the hole transport region; the emission layer; and the electron transport region.

The hole transport region may be arranged between the first electrode 11 and the emission layer.

The hole transport region may include a hole injection layer, a hole transport layer, an electron blocking layer, a buffer layer, or a combination thereof.

The hole transport region may include only either a hole injection layer or a hole transport layer. The hole transport region may have a hole injection layer/hole transport layer structure, or a hole injection layer/hole transport layer/electron blocking layer structure, wherein constituting layers for each structure are sequentially stacked in this stated order from the first electrode 11.

When the hole transport region includes a hole injection layer, the hole injection layer may be formed on the first electrode 11 by using one or more suitable methods such as vacuum deposition, spin coating, casting, and/or Langmuir-Blodgett (LB) deposition.

When the hole injection layer is formed by vacuum deposition, the deposition conditions may be adjusted by the person having ordinary skill in the art according to a material that is used to form the hole injection layer, and the structure and thermal characteristics of the hole injection layer. For example, the deposition conditions may include a deposition temperature in a range of about 100° C. to about 500° C., a vacuum pressure in a range of about $10^{-8}$ torr to about $10^{-3}$ torr, and a deposition rate in a range of about 0.01 angstrom per second, (Å/sec) to about 100 Å/sec. However, the deposition conditions are not limited thereto.

When the hole injection layer is formed by spin coating, the coating conditions may adjusted by the person having ordinary skill in the art according to a material that is used to form the hole injection layer, and the structure and thermal properties of the hole injection layer. For example, the coating conditions may include a coating speed in a range of about 2,000 revolutions per minute (rpm) to about 5,000 rpm and a heat treatment temperature for removing a solvent after coating in a range of about 80° C. to about 200° C. However, the coating conditions are not limited thereto.

Conditions for forming the hole transport layer and the electron blocking layer may be similar to or the same as the conditions for forming the hole injection layer.

The hole transport region may include at least one of 4,4',4''-tris(3-methylphenylphenylamino)triphenylamine (m-MTDATA), 4,4',4''-tris(N,N-diphenylamino)triph-enylamine (TDATA), 4,4',4''-tris{N-(2-naphthyl)-N-phenylamino}-triphenylamine (2-TNATA), N,N'-di(1-naphthyl)-N,N'-diphenylbenzidine (NPB), p-NPB, N,N'-bis(3-methylphenyl)-N,N'-diphenyl-[1,1-biphenyl]-4,4'-diamine (TPD), Spiro-TPD, Spiro-NPB, methylated NPB, 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 4,4',4''-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, or a compound represented by Formula 202:

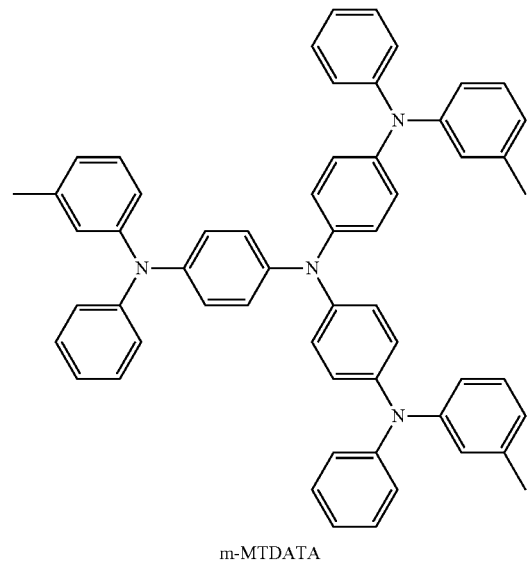

m-MTDATA

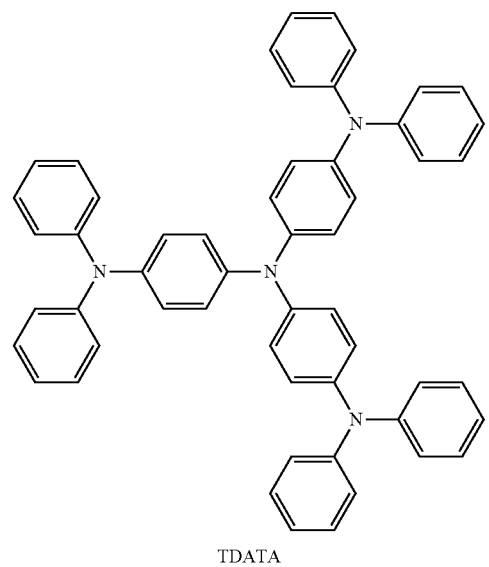

TDATA

-continued
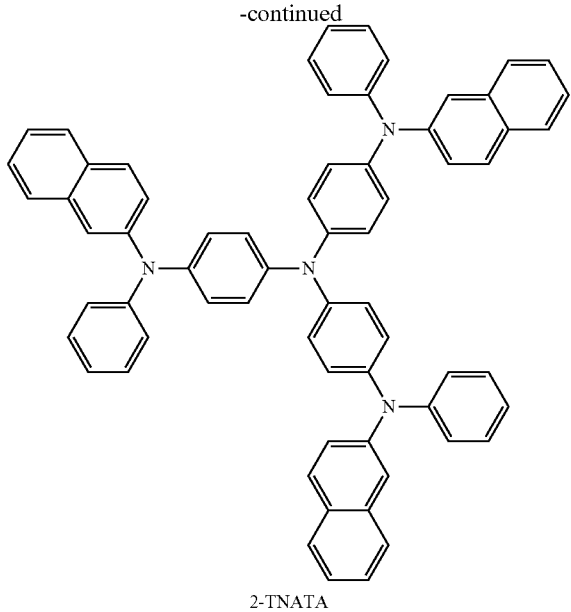
2-TNATA
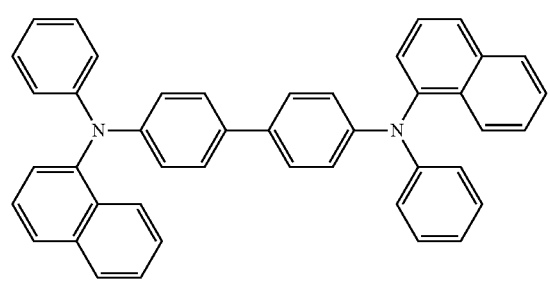
NPB
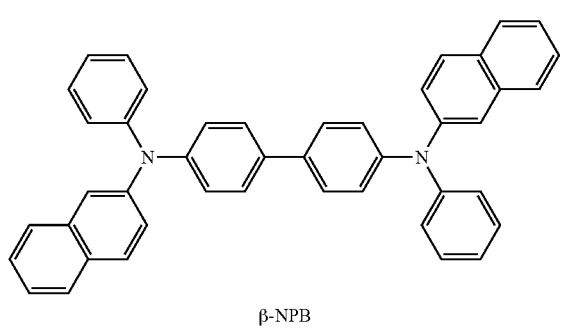
β-NPB
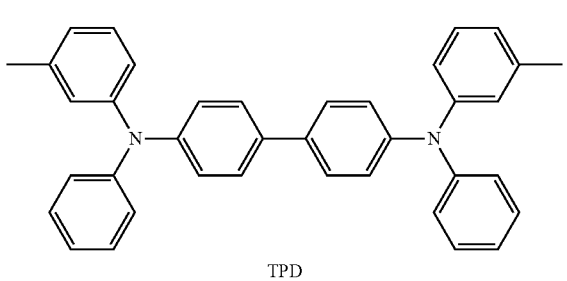
TPD
-continued
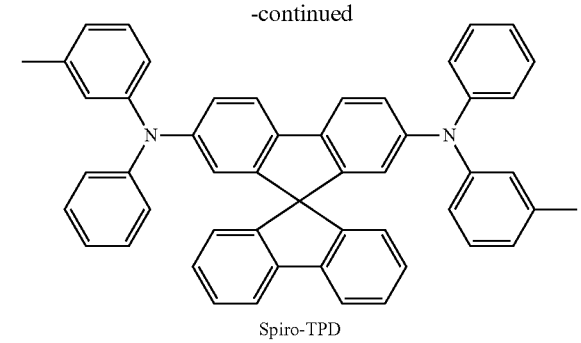
Spiro-TPD
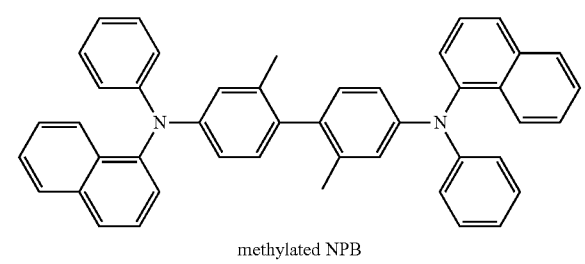
Spiro-NPB
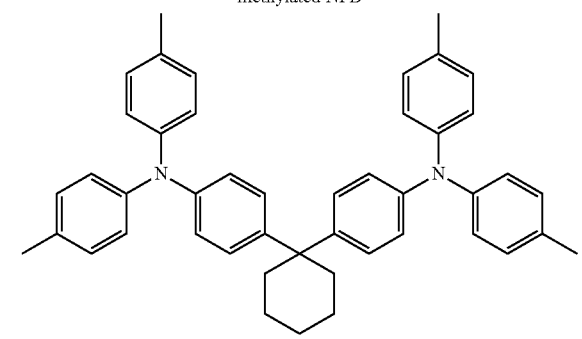
methylated NPB
TAPC
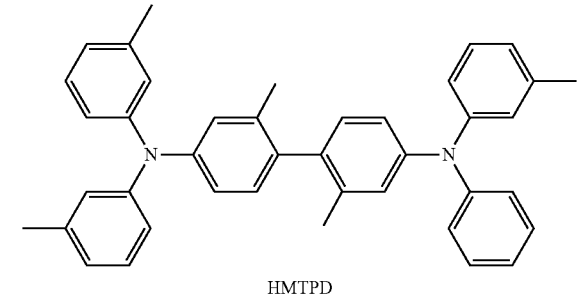
HMTPD Formula 201

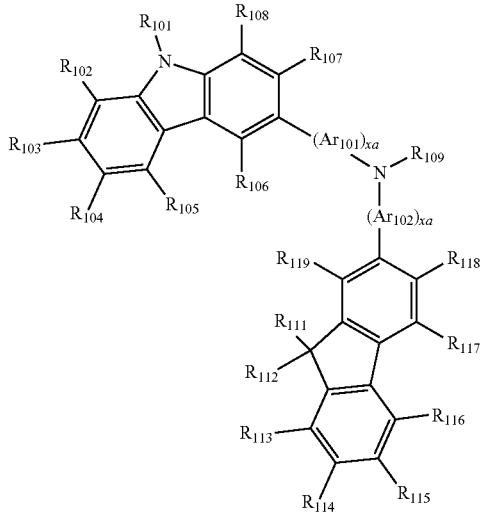

Formula 202 wherein, in Formula 201, $Ar_{101}$ and $Ar_{102}$ may each independently be:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, or a combination thereof.

In Formula 201, xa and xb may each independently be an integer from 0 to 5, or may each independently be 0, 1, or 2. For example, xa may be 1 and xb may be 0, but xa and xb are not limited thereto.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and the like), a $C_1$-$C_{10}$ alkoxy group (for example, a methoxy group, an ethoxy group, a propoxy group, a butoxy group, a pentoxy group, and the like), or a $C_1$-$C_{10}$ alkylthio group;

a $C_1$-$C_{10}$ alkyl group, a $C_1$-$C_{10}$ alkoxy group, or a $C_1$-$C_{10}$ alkylthio group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof;

a phenyl group, a naphthyl group, an anthracenyl group, a fluorenyl group, or a pyrenyl group; and a phenyl group, a naphthyl group, an anthracenyl group, a fluorenyl group, or a pyrenyl group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a $C_1$-$C_{60}$ alkylthio group, or a combination thereof, but embodiments are not limited thereto.

In Formula 201, $R_{109}$ may be:

a phenyl group, a naphthyl group, an anthracenyl group, or a pyridinyl group; or a phenyl group, a naphthyl group, an anthracenyl group, or a pyridinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a phenyl group, a naphthyl group, an anthracenyl group, a pyridinyl group, or a combination thereof.

In one or more embodiments, the compound represented by Formula 201 may be represented by Formula 201A, but embodiments are not limited thereto:

Formula 201A

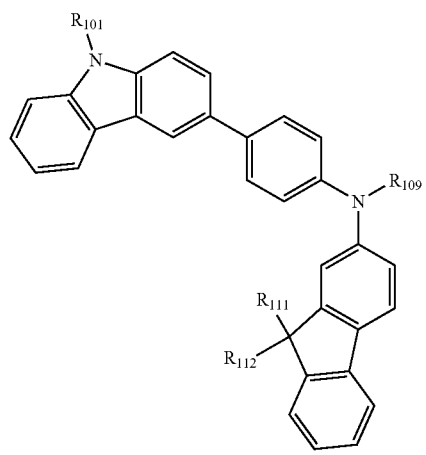

wherein, in Formula 201A, $R_{101}$, $R_{111}$, $R_{112}$, and $R_{109}$ may respectively be as described herein.

For example, the compound represented by Formula 201 and the compound represented by Formula 202 may include one of Compounds HT1 to HT20, but embodiments are not limited thereto:

HT1

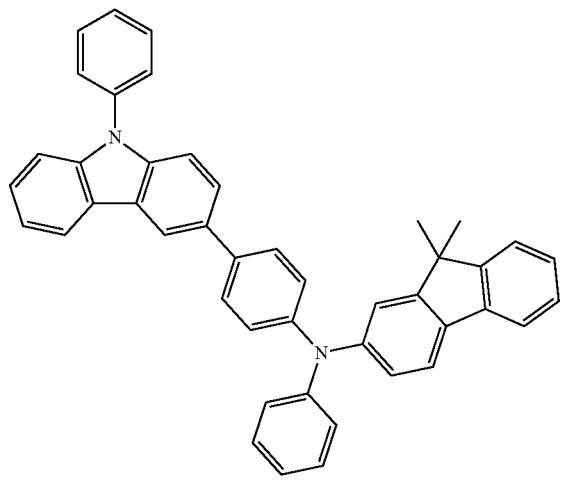

HT2

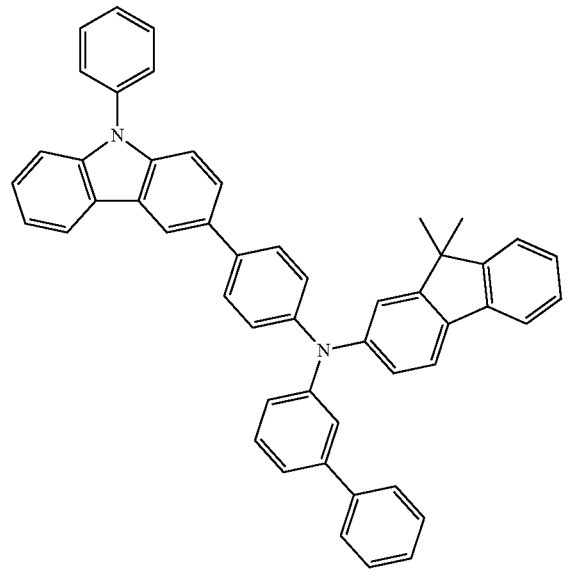

HT3

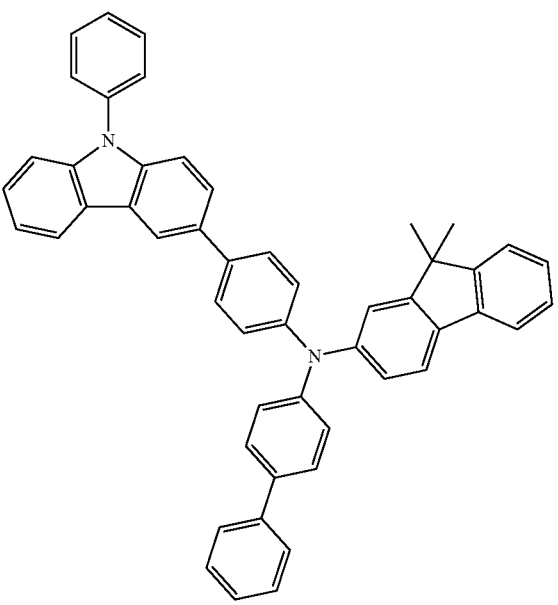

HT4
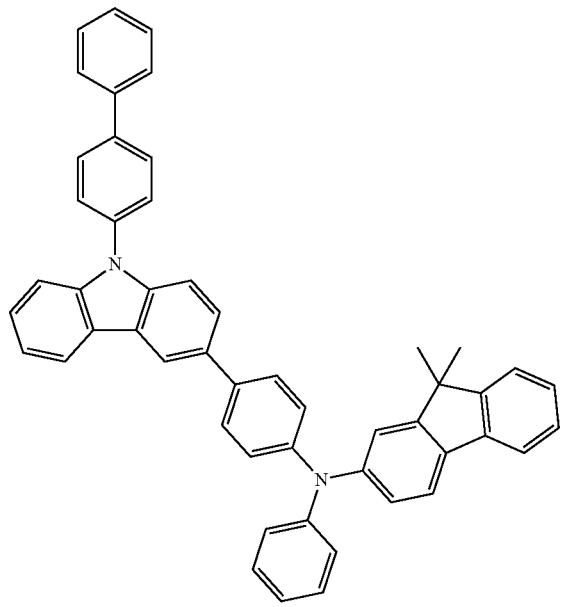
HT6
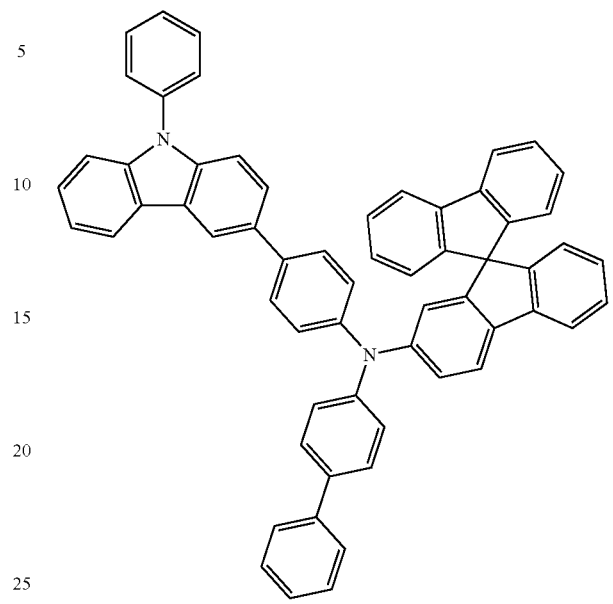
HT5
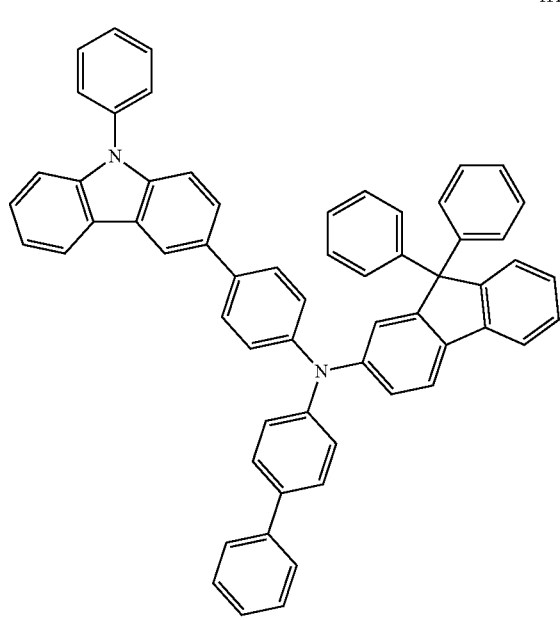
HT7
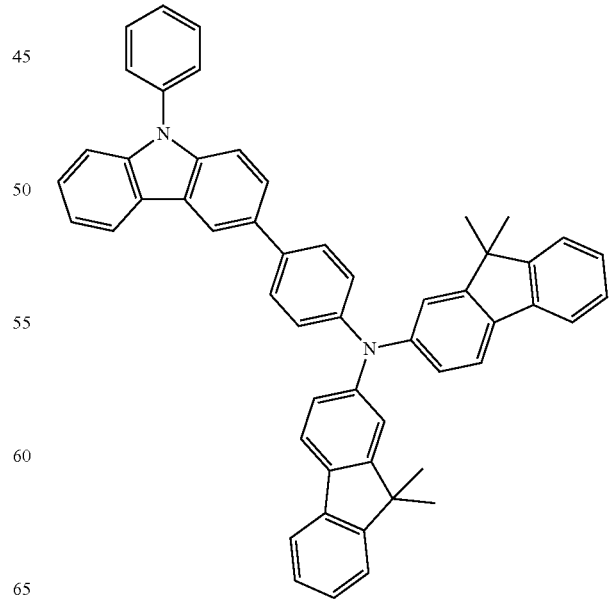

HT8
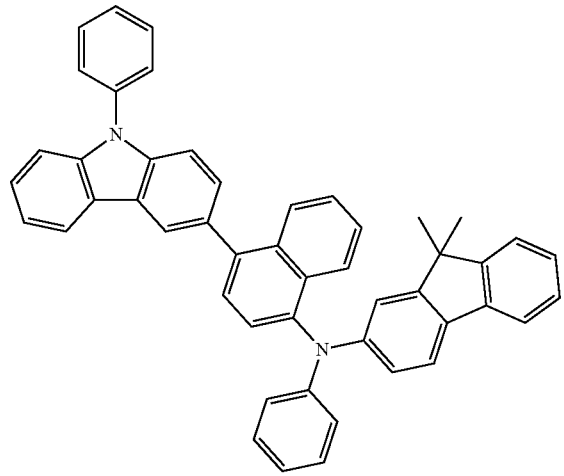
HT9
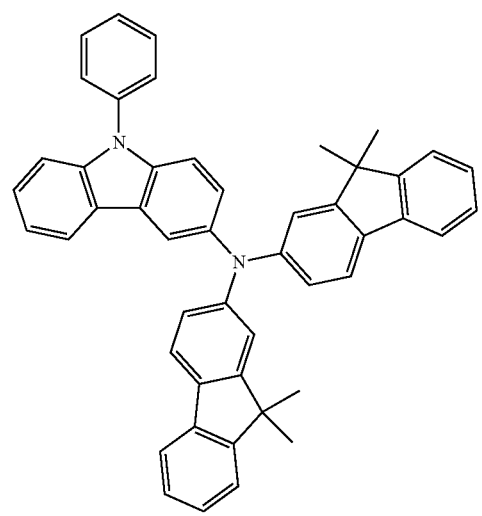
HT10
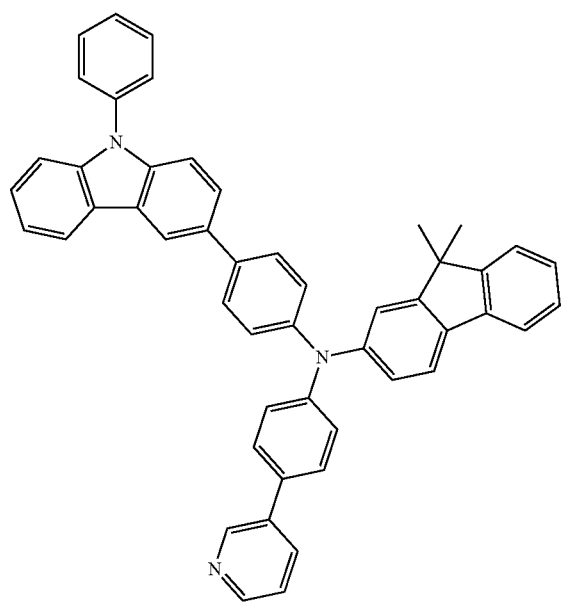
HT11
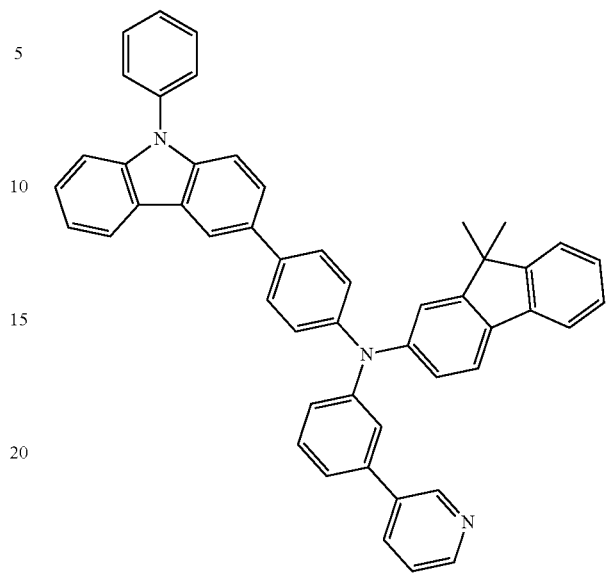
HT12
HT13
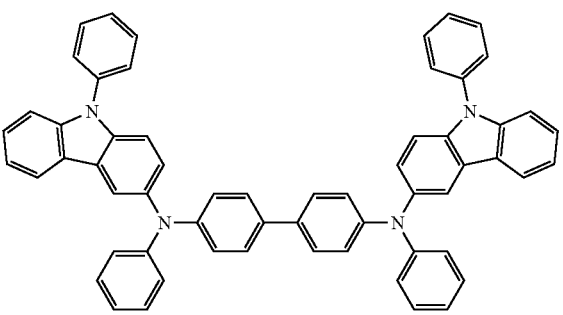

-continued

HT14
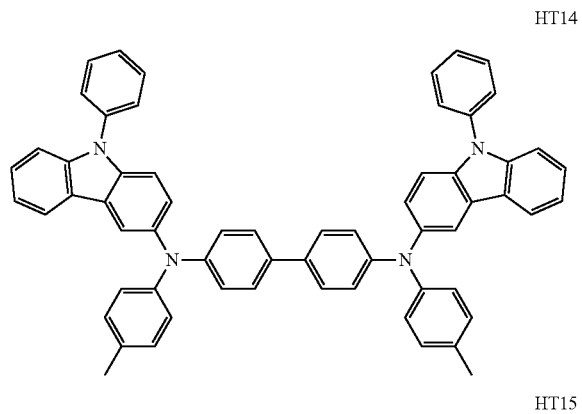

HT15
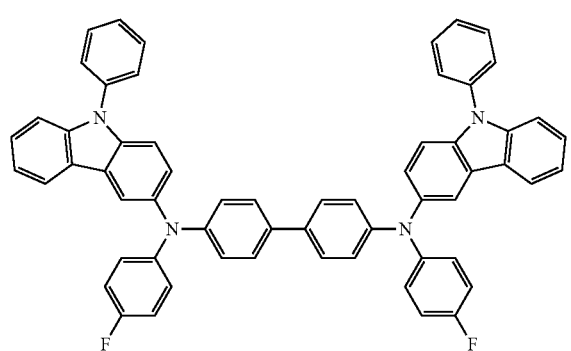

HT16
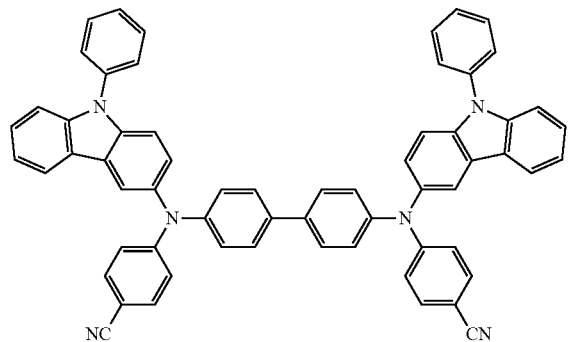

HT17
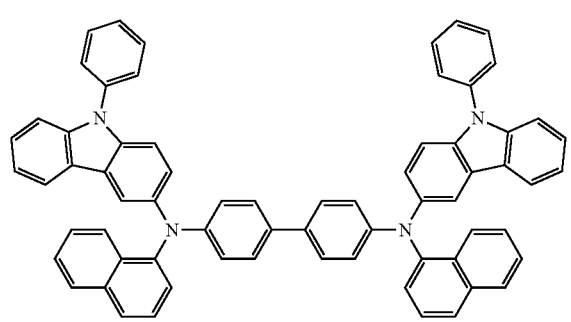

-continued

HT18
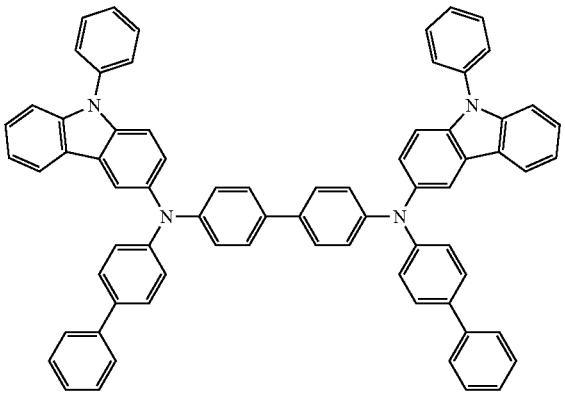

HT19
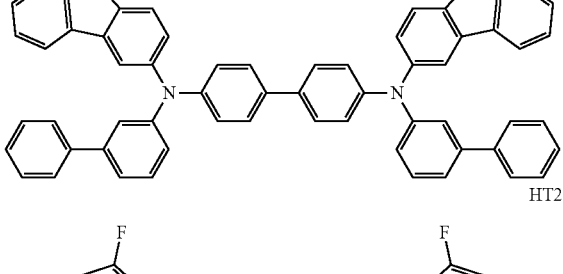

HT20
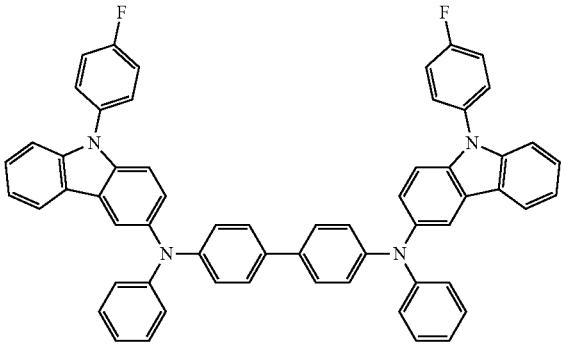

A thickness of the hole transport region may be in a range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one of a quinone derivative, a metal oxide, and a cyano group-containing compound, but embodiments of the present disclosure are not limited thereto. For example, non-limiting examples of the p-dopant are: a quinone derivative, such as tetracyanoquinodimethane (TCNQ), 2,3,5,6-tetrafluoro-tetracyano-1,4-benzoquinonedimethane (F4-TCNQ), and F6-TCNQ; a metal oxide, such as a tungsten oxide, or a molybdenum oxide; or a cyano group-containing compound, such as one or more Compounds HT-D1 and F12, but embodiments are not limited thereto:

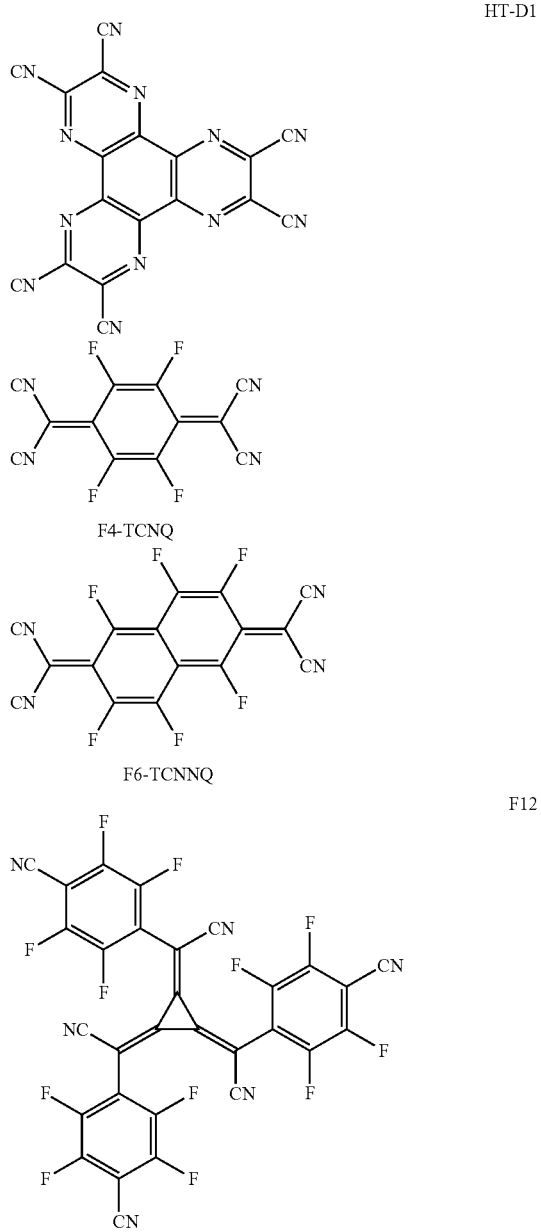

The hole transport region may include a buffer layer.

Also, the buffer layer may compensate for an optical resonance distance according to a wavelength of light emitted from the emission layer, and thus, efficiency of a formed organic light-emitting device may be improved.

Then, the emission layer may be formed on the hole transport region by using one or more suitable methods such as vacuum deposition, spin coating, casting, and/or L-B deposition. When the emission layer is formed by vacuum deposition or spin coating, the deposition or coating conditions may be similar to those applied in forming the hole injection layer although the deposition, or the coating conditions may be varied according to a material that is used to form the hole transport layer.

Meanwhile, when the hole transport region includes an electron blocking layer, a material for forming the electron blocking layer may be chosen from materials for the hole transport region described above and host materials to be explained later. However, the material for forming the electron blocking layer is not limited thereto. For example, when the hole transport region includes an electron blocking layer, the material for forming the electron blocking layer may be mCP, which will be described below.

The emission layer may include a host and a dopant, and the dopant may include the organometallic compound represented by Formula 1.

In one or more embodiments, the host may include at least one of 1,3,5-tri(1-phenyl-1H-benzo[d]imidazol-2-yl)phenyl (TPBi), 3-tert-butyl-9,10-di(naphth-2-yl)anthracene (TBADN), 9,10-di(naphthalene-2-yl)anthracene (ADN) (also referred to as "DNA"), 4,4'-bis(N-carbazolyl)-1,1'-biphenyl (CBP), 4,4'-bis(9-carbazolyl)-2,2'-dimethylbiphenyl (CDBP), TCP, mCP, Compound H50, or Compound H51:

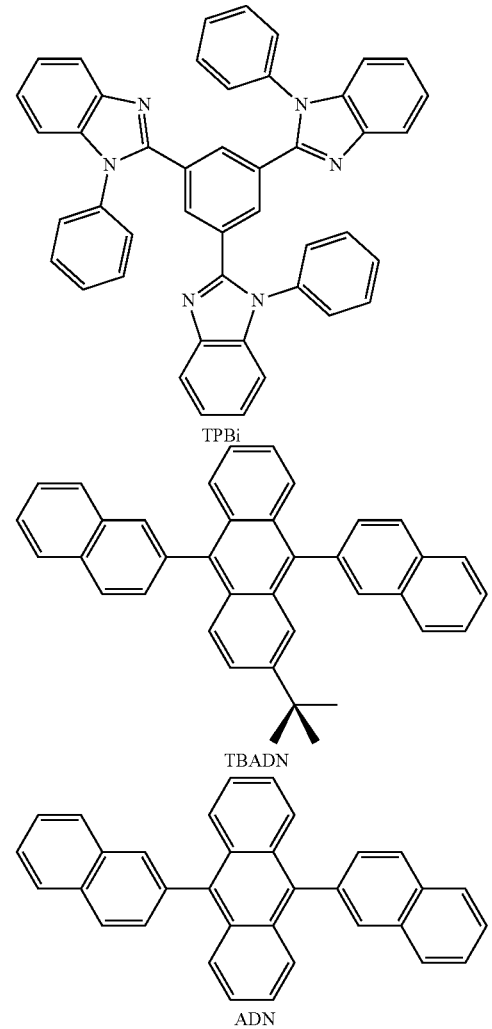

-continued

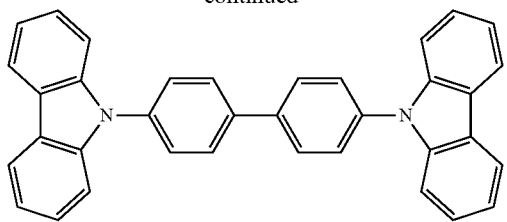
CBP

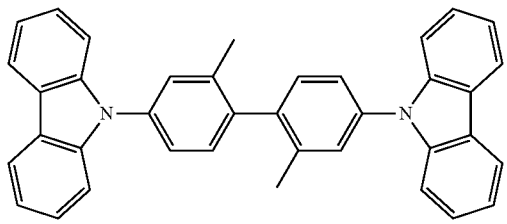
CDBP

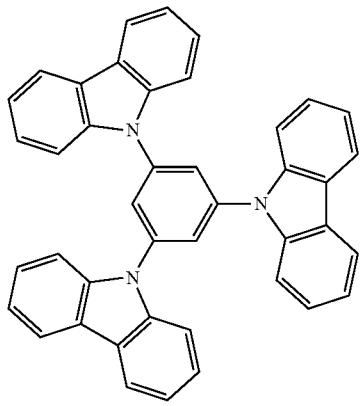
TCP

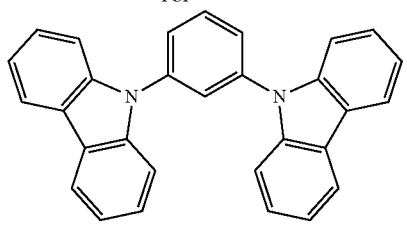
mCP

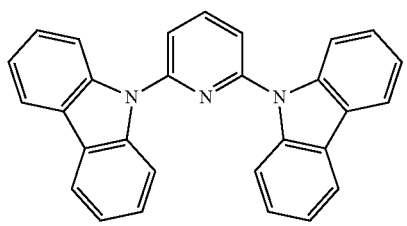
H50

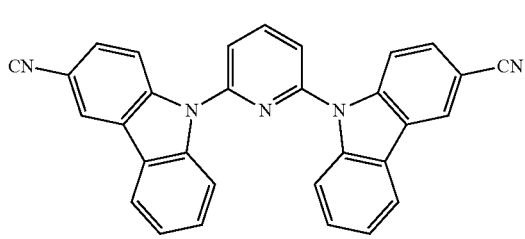
H51

In one or more embodiments, the host may include a compound represented by Formula 301:

Formula 301

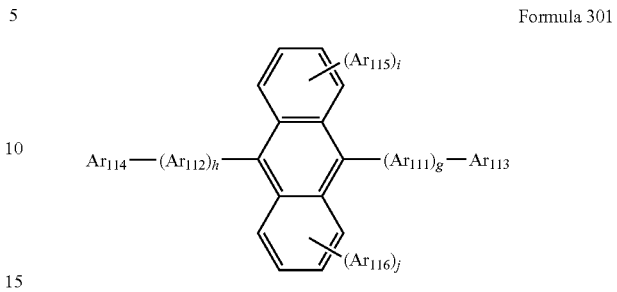

wherein, in Formula 301, $Ar_{111}$ and $Ar_{112}$ may each independently be:
  a phenylene group, a naphthylene group, a phenanthrenylene group, or a pyrenylene group; or
  a phenylene group, a naphthylene group, a phenanthrenylene group, or a pyrenylene group, each substituted with at least one of a phenyl group, a naphthyl group, an anthracenyl group, or a combination thereof.

In Formula 301, $Ar_{113}$ to $Ar_{116}$ may each independently be:
  a $C_1$-$C_{10}$ alkyl group, a phenyl group, a naphthyl group, a phenanthrenyl group, or a pyrenyl group; or
  a phenyl group, a naphthyl group, a phenanthrenyl group, or a pyrenyl group, each substituted with at least one of a phenyl group, a naphthyl group, or an anthracenyl group.

In Formula 301, g, h, i, and j may each independently be an integer from 0 to 4, and for example, may each independently be 0, 1, or 2.

In Formula 301, $Ar_{113}$ to $Ar_{116}$ may each independently be:
  a $C_1$-$C_{10}$ alkyl group substituted with at least one of a phenyl group, a naphthyl group, or an anthracenyl group;
  a phenyl group, a naphthyl group, an anthracenyl group, a pyrenyl, a phenanthrenyl group, or a fluorenyl group;
  a phenyl group, a naphthyl group, an anthracenyl group, a pyrenyl group, a phenanthrenyl group, or a fluorenyl group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a phenyl group, a naphthyl group, an anthracenyl group, a pyrenyl group, a phenanthrenyl group, a fluorenyl group, or a combination thereof; or

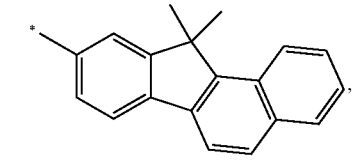 [SMILES: Cc1ccc2c(c1)C(C)(C)c1c-2ccc2ccccc12]

but embodiments are not limited thereto.

In one or more embodiments, the host may include a compound represented by Formula 302:

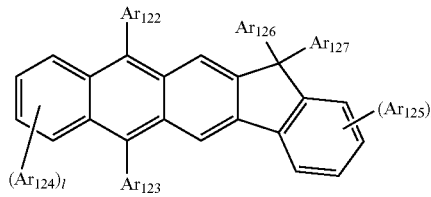

Formula 302 wherein, in Formula 302, $Ar_{122}$ to $Ar_{125}$ may respectively be as described in connection with $Ar_{113}$ in Formula 301.

In Formula 302, $Ar_{126}$ and $Ar_{127}$ may each independently be a $C_1$-$C_{10}$ alkyl group (for example, a methyl group, an ethyl group, or a propyl group).

In Formula 302, k and l may each independently be an integer from 0 to 4. For example, k and l may each independently be 0, 1, or 2.

When the organic light-emitting device 10 is a full-color organic light-emitting device 10, the emission layer may be patterned into a red emission layer, a green emission layer, and a blue emission layer. In one or more embodiments, based on a stacked structure including a red emission layer, a green emission layer, and/or a blue emission layer, the emission layer may emit white light, and various modifications are possible.

When the emission layer includes a host and a dopant, an amount of the dopant may be in a range of about 0.01 parts by weight to about 15 parts by weight based on 100 parts by weight of the host, but embodiments are not limited thereto.

A thickness of the emission layer may be in a range of about 100 Å to about 1,000 Å, for example, about 200 Å to about 600 Å. When the thickness of the emission layer is within these ranges, excellent luminescence characteristics may be obtained without a substantial increase in driving voltage.

Next, the electron transport region is arranged on the emission layer.

The electron transport region may include a hole blocking layer, an electron transport layer, an electron injection layer, or a combination thereof.

For example, the electron transport region may have a hole blocking layer/electron transport layer/electron injection layer structure, or an electron transport layer/electron injection layer structure, but the structure of the electron transport region is not limited thereto. The electron transport layer may have a single-layered structure, or a multi-layered structure including two or more different materials.

Conditions for forming the hole blocking layer, the electron transport layer, and the electron injection layer which constitute the electron transport region may be similar to or the same as the conditions for forming the hole injection layer.

When the electron transport region includes a hole blocking layer, the hole blocking layer may include, for example, at least one of 2,9-dimethyl-4,7-diphenyl-1,10-phenanthroline (BCP), 4,7-diphenyl-1,10-phenanthroline (Bphen), or bis(2-methyl-8-quinolinolato-N1,O8)-(1,1'-biphenyl-4-olato)aluminum (Balq), but embodiments are not limited thereto:

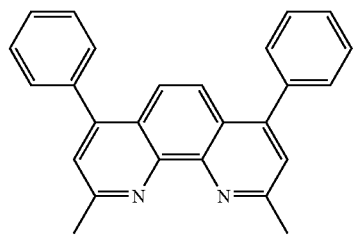

BCP

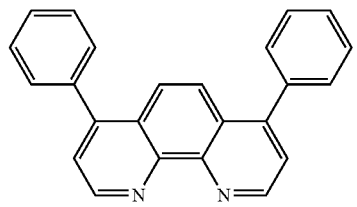

Bphen

A thickness of the hole blocking layer may be in a range of about 20 Å to about 1,000 Å, for example, about 30 Å to about 300 Å. When the thickness of the hole blocking layer is within these ranges, excellent hole blocking characteristics may be obtained without a substantial increase in driving voltage.

The electron transport layer may further include at least one of BCP, Bphen, tris(8-hydroxyquinolinato)aluminum ($Alq_3$), BAlq, 3-(4-biphenylyl)-4-phenyl-5-tert-butylphenyl-1,2,4-triazole (TAZ), or 4-(naphthalen-1-yl)-3,5-diphenyl-4H-1,2,4-triazole (NTAZ):

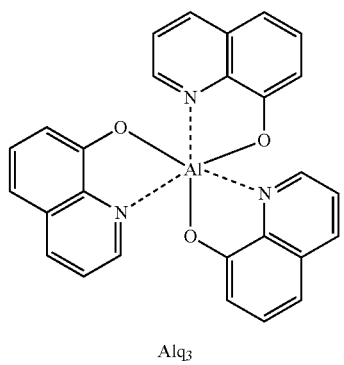

$Alq_3$

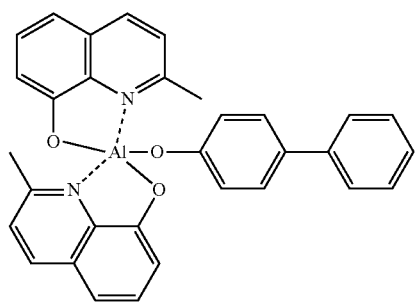

BAlq

-continued
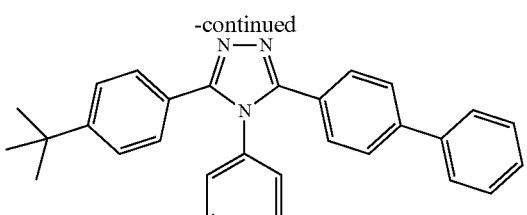
TAZ
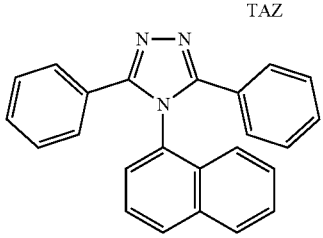
NTAZ
In one or more embodiments, the electron transport layer may include at least one of Compounds ET1 to ET25, but embodiments are not limited thereto:
ET1
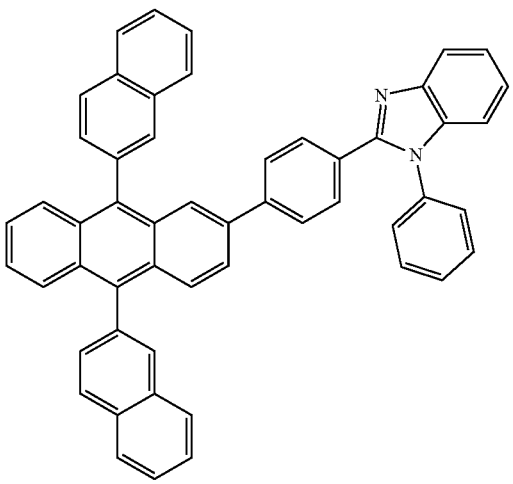
ET2
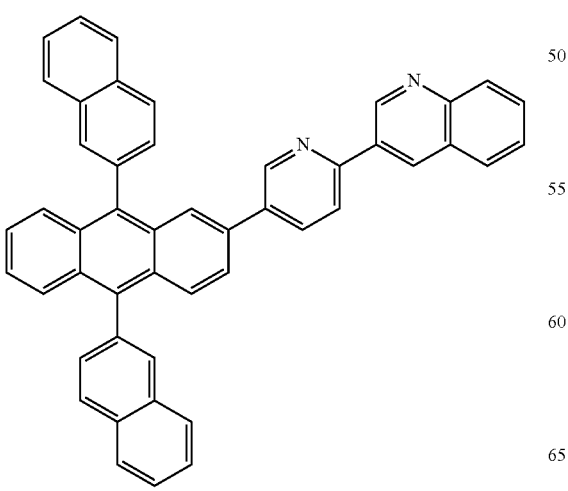
-continued
ET3
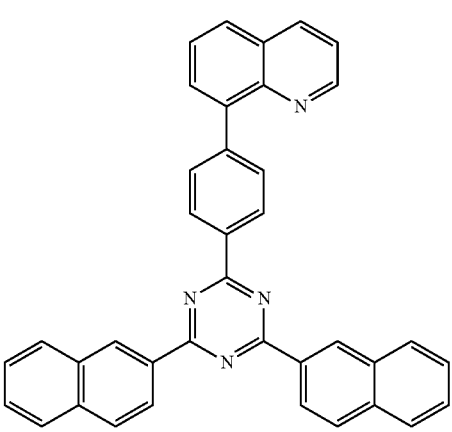
ET4
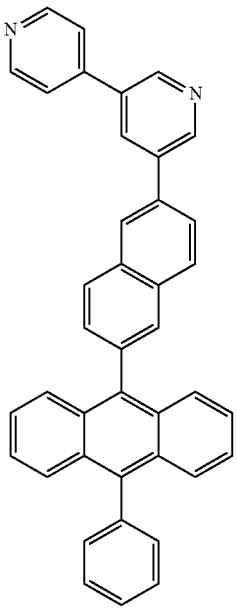
ET5
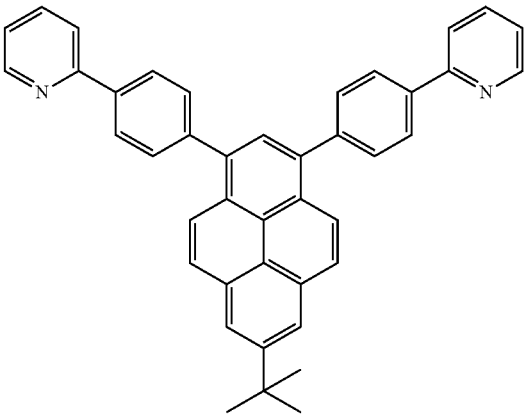

ET6
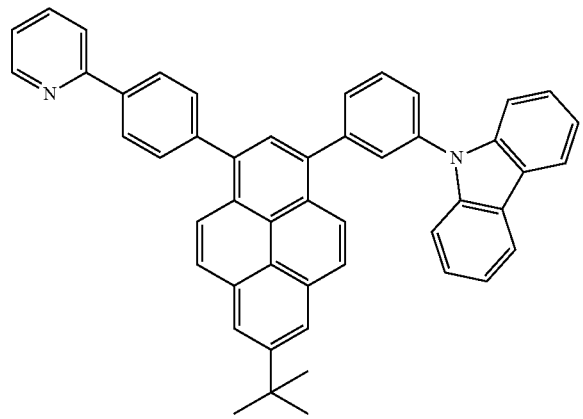
ET7
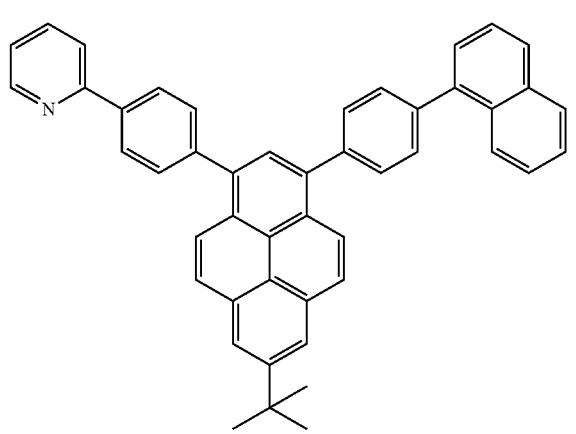
ET8
ET9
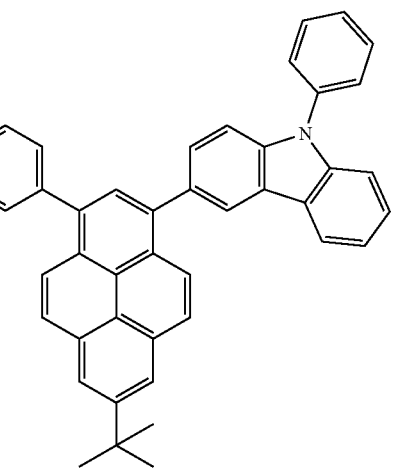
ET10
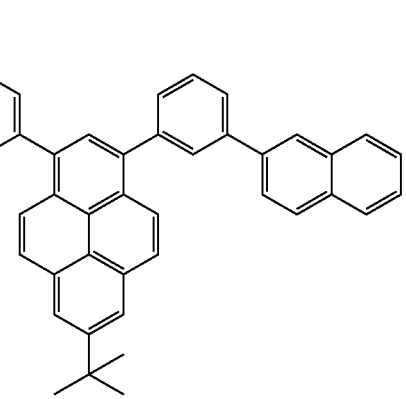
ET11
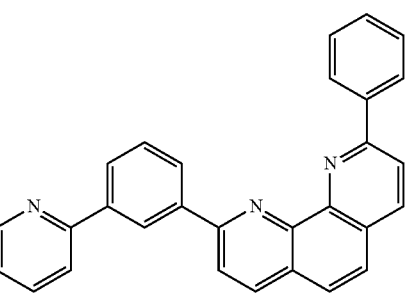
ET12
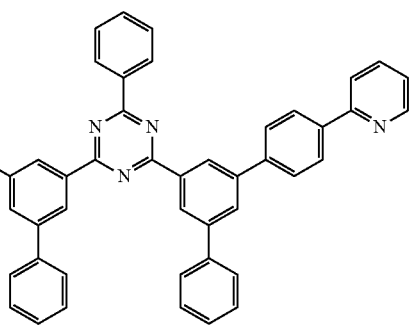

ET13
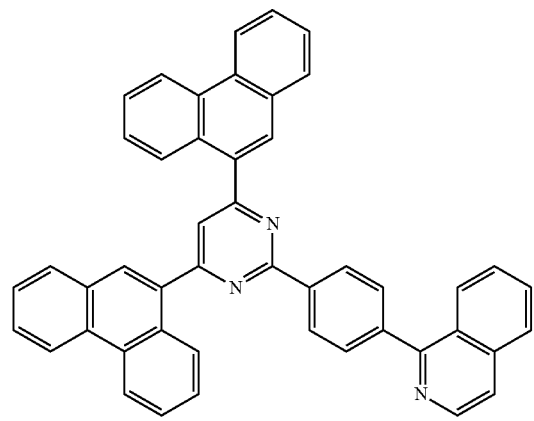
ET14
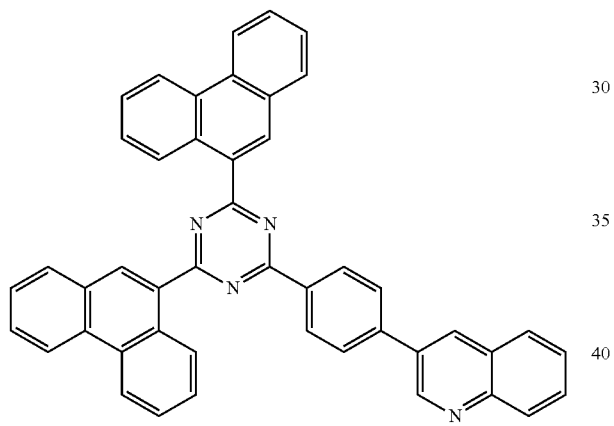
ET15
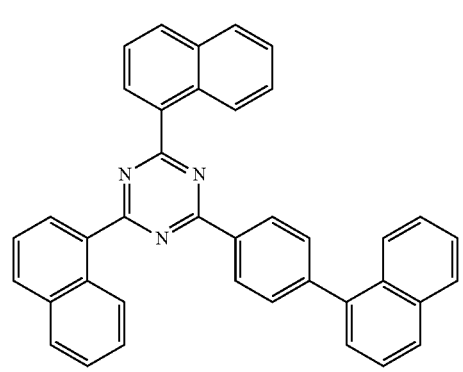
ET16
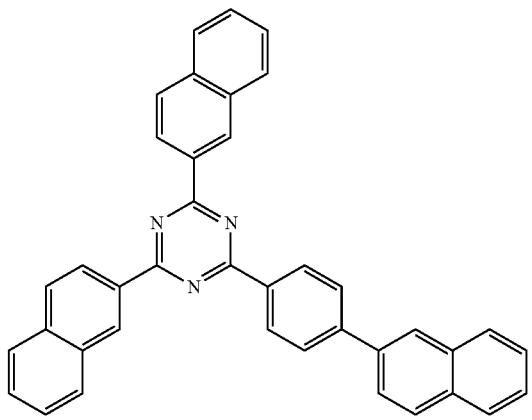
ET17
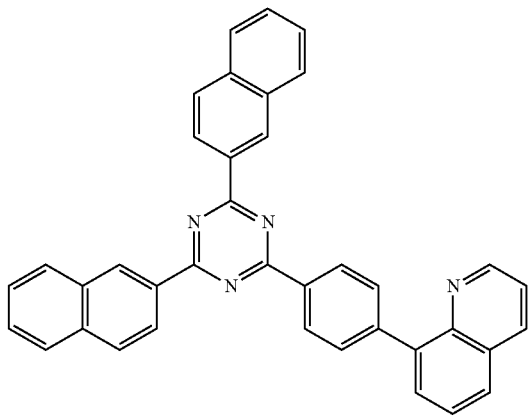
ET18
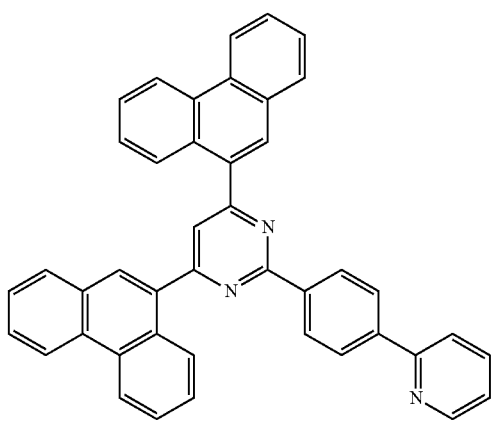

ET19
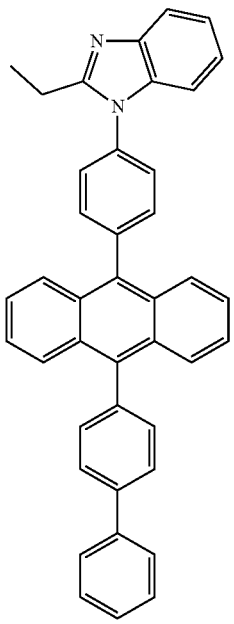
ET22
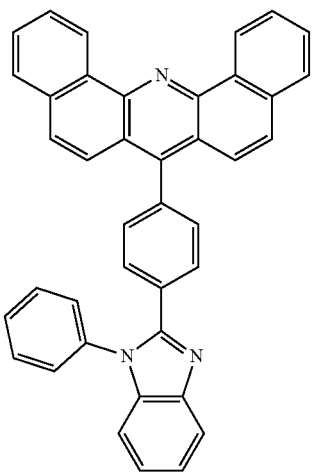
ET20
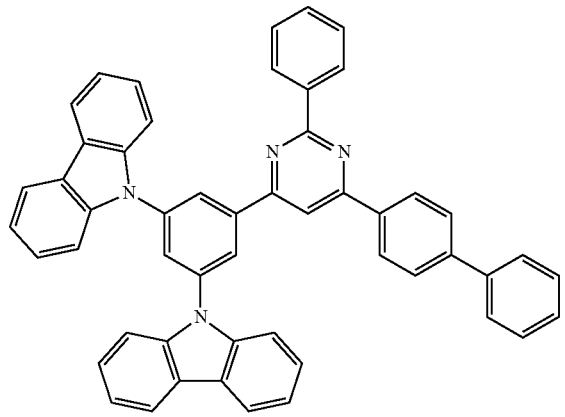
ET23
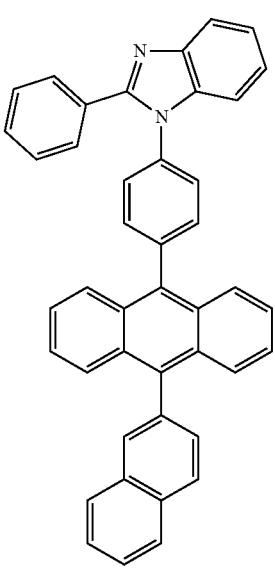
ET21
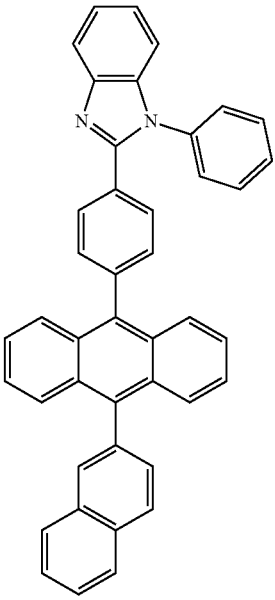
ET24

ET25

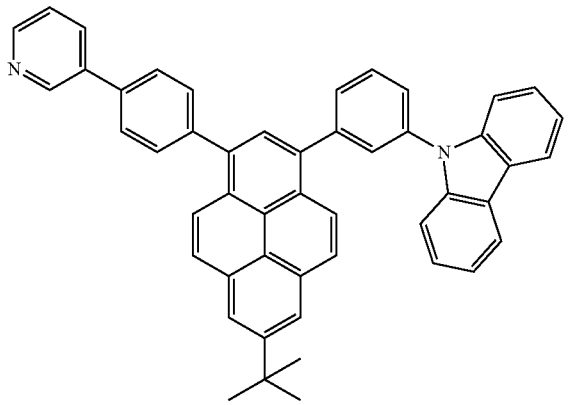

A thickness of the electron transport layer may be in a range of about 100 Å to about 1,000 Å, for example, about 150 Å to about 500 Å. When the thickness of the electron transport layer is within these ranges, satisfactory electron transporting characteristics may be obtained without a substantial increase in driving voltage.

The electron transport layer may include a metal-containing material in addition to the material as described above.

The metal-containing material may include a Li complex. The Li complex may include, for example, Compound ET-D1 (lithium quinolate (LiQ)) or ET-D2:

ET-D1

ET-D2

The electron transport region may include an electron injection layer that promotes the flow of electrons from the second electrode 19 thereinto.

The electron injection layer may include at least one of LiF, NaCl, CsF, $Li_2O$, BaO, or a combination thereof.

A thickness of the electron injection layer may be in a range of about 1 Å to about 100 Å, and, for example, about 3 Å to about 90 Å. When the thickness of the electron injection layer is within these ranges, satisfactory electron injection characteristics may be obtained without a substantial increase in driving voltage.

The second electrode 19 is arranged on the organic layer 15. The second electrode 19 may be a cathode. A material for forming the second electrode 19 may be metal, an alloy, an electrically conductive compound, or a combination thereof, which has a relatively low work function. For example, the material for forming the second electrode 19 may be lithium (Li), magnesium (Mg), aluminum (Al), silver (Ag), aluminum-lithium (Al—Li), calcium (Ca), magnesium-indium (Mg—In), or magnesium-silver (Mg—Ag). In one or more embodiments, to manufacture a top-emission type light-emitting device, a transmissive electrode formed using ITO or IZO may be used as the second electrode 19.

Hereinbefore, the organic light-emitting device has been described with reference to the FIGURE, but embodiments are not limited thereto.

Another aspect of the present disclosure provides a diagnostic composition including at least one organometallic compound represented by Formula 1.

The organometallic compound represented by Formula 1 provides high luminescence efficiency, and accordingly, the diagnostic composition including the at least one organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and examples thereof are a methyl group, an ethyl group, a propyl group, an isobutyl group, a sec-butyl group, a tert-butyl group, a pentyl group, an isoamyl group, a hexyl group, and the like. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof are a methoxy group, an ethoxy group, an isopropyloxy group, and the like. The term "$C_1$-$C_{60}$ alkylthio group" as used herein refers to a monovalent group represented by —$SA_{102}$ (wherein $A_{102}$ is the $C_1$-$C_{60}$ alkyl group).

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof are an ethenyl group, a propenyl group, a butenyl group, and the like. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof are an ethynyl group, a propynyl group, and the like. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof are a cyclopropyl group, a cyclobutyl group, a cyclopentyl group, a cyclohexyl group, a cycloheptyl group, and the like. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si, S, Se, Ge, or B as a ring-forming atom and 1 to 10 carbon atoms, and examples thereof are a tetrahydrofuranyl group, a tetrahydrothiophenyl group, and the like. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and examples thereof are a cyclopentenyl group, a cyclohexenyl group, a cycloheptenyl group, and the like. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, S, Se, Ge, or B as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group, a 2,3-dihydrothiophenyl group, and the like. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group are a phenyl group, a naphthyl group, an anthracenyl group, a phenanthrenyl group, a pyrenyl group, a chrysenyl group, and the like. When the $C_6$-$C_{60}$ aryl group and the $C_6$-$C_{60}$ arylene group each include two or more rings, the two or more rings may be fused to each other.

The term "$C_7$-$C_{60}$ alkyl aryl group" as used herein refers to a $C_6$-$C_{60}$ aryl group substituted with at least one $C_1$-$C_{60}$ alkyl group. The term "$C_7$-$C_{60}$ aryl alkyl group" as used herein refers to a $C_1$-$C_{60}$ alkyl group substituted with at least one $C_6$-$C_{60}$ aryl group.

The term "$C_1$-$C_{60}$ heteroaryl group" as used herein refers to a monovalent group having a carbocyclic aromatic system that has at least one heteroatom selected from N, O, P, Si, S, Se, Ge, or B as a ring-forming atom, and 1 to 60 carbon atoms. The term "$C_1$-$C_{60}$ heteroarylene group" as used herein refers to a divalent group having a carbocyclic aromatic system that has at least one heteroatom selected from N, O, P, Si, S, Se, Ge, or B as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, an isoquinolinyl group, and the like. When the $C_6$-$C_{60}$ heteroaryl group and the $C_6$-$C_{60}$ heteroarylene group each include two or more rings, the two or more rings may be fused to each other.

The term "$C_2$-$C_{60}$ alkyl heteroaryl group" as used herein refers to a $C_1$-$C_{60}$ heteroaryl group substituted with at least one $C_1$-$C_{60}$ alkyl group. The term "$C_2$-$C_{60}$ heteroaryl alkyl" as used herein refers to a $C_1$-$C_{60}$ alkyl group substituted with at least one $C_1$-$C_{60}$ heteroaryl group.

The term "$C_6$-$C_{60}$ aryloxy group" as used herein indicates —$OA_{102}$ (wherein $A_{102}$ is a $C_6$-$C_{60}$ aryl group). The term "$C_6$-$C_{60}$ arylthio group" as used herein indicates —$SA_{103}$ (wherein $A_{103}$ is a $C_6$-$C_{60}$ aryl group).

The term "$C_1$-$C_{60}$ heteroaryloxy group" as used herein indicates —$OA_{106}$ (wherein $A_{106}$ is a $C_1$-$C_{60}$ heteroaryl group). The term "$C_1$-$C_{60}$ heteroarylthio group" as used herein indicates —$SA_{107}$ (wherein $A_{107}$ is a $C_1$-$C_6$ heteroaryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group are a fluorenyl group and the like. The term "divalent non-aromatic condensed polycyclic group" as used herein refers to a divalent group having the same structure as the monovalent non-aromatic condensed polycyclic group described above.

The term "monovalent non-aromatic condensed heteropolycyclic group" as used herein refers to a monovalent group (for example, having 2 to 60 carbon atoms) having two or more rings condensed with each other, a heteroatom selected from N, O, P, Si, S, Se, Ge, or B, other than carbon atoms, as a ring-forming atom, and no aromaticity in its entire molecular structure. Examples of the monovalent non-aromatic condensed heteropolycyclic group are a carbazolyl group and the like. The term "divalent non-aromatic condensed heteropolycyclic group" as used herein refers to a divalent group having the same structure as the monovalent non-aromatic condensed heteropolycyclic group described above.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, S, Se, Ge, or B, other than 1 to 30 carbon atoms. The $C_1$-$C_{30}$ heterocyclic group may be a monocyclic group or a polycyclic group.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —$CD_3$, —$CD_2H$, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_7$-C$_{60}$ alkyl aryl group, a C$_6$-C$_{60}$ aryloxy group, a C$_6$-C$_{60}$ arylthio group, a C$_1$-C$_{60}$ heteroaryl group, a C$_2$-C$_{60}$ alkyl heteroaryl group, a C$_1$-C$_{60}$ heteroaryloxy group, a C$_1$-C$_{60}$ heteroarylthio group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{15}$), —B(Q$_{16}$)(Q$_{17}$), —P(Q$_{18}$)(Q$_{19}$), —P(=O)(Q$_{18}$)(Q$_{19}$), or a combination thereof;

a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_7$-C$_{60}$ alkyl aryl group, a C$_6$-C$_{60}$ aryloxy group, a C$_6$-C$_{60}$ arylthio group, a C$_1$-C$_{60}$ heteroaryl group, a C$_2$-C$_{60}$ alkyl heteroaryl group, a C$_1$-C$_{60}$ heteroaryloxy group, a C$_1$-C$_{60}$ heteroarylthio group, a monovalent non-aromatic condensed polycyclic group, or a monovalent non-aromatic condensed heteropolycyclic group;

a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_7$-C$_{60}$ alkyl aryl group, a C$_6$-C$_{60}$ aryloxy group, a C$_6$-C$_{60}$ arylthio group, a C$_1$-C$_{60}$ heteroaryl group, a C$_2$-C$_{60}$ alkyl heteroaryl group, a C$_1$-C$_{60}$ heteroaryloxy group, a C$_1$-C$_{60}$ heteroarylthio group, a monovalent non-aromatic condensed polycyclic group, or a monovalent non-aromatic condensed heteropolycyclic group, each substituted with at least one of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_1$-C$_6$ alkylthio group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_7$-C$_{60}$ alkyl aryl group, a C$_7$-C$_{60}$ aryl alkyl group, a C$_6$-C$_{60}$ aryloxy group, a C$_6$-C$_{60}$ arylthio group, a C$_1$-C$_{60}$ heteroaryl group, a C$_2$-C$_{60}$ alkyl heteroaryl group, a C$_2$-C$_{60}$ heteroaryl alkyl group, a C$_1$-C$_{60}$ heteroaryloxy group, a C$_1$-C$_{60}$ heteroarylthio group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), —B(Q$_{26}$)(Q$_{27}$), —P(Q$_{28}$)(Q$_{29}$), —P(=O)(Q$_{28}$)(Q$_{29}$), or a combination thereof; or —N(Q$_{31}$)(Q$_{32}$), —Si(Q$_{33}$)(Q$_{34}$)(Q$_{35}$), —B(Q$_{36}$)(Q$_{37}$), —P(Q$_{38}$)(Q$_{39}$), or —P(=O)(Q$_{38}$)(Q$_{39}$), and Q$_1$ to Q$_9$, Q$_{11}$ to Q$_{19}$, Q$_{21}$ to Q$_{29}$, and Q$_{31}$ to Q$_{39}$ may each independently be hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a C$_1$-C$_{60}$ alkyl group; a C$_1$-C$_{60}$ alkyl group substituted with at least one of deuterium, a C$_1$-C$_{60}$ alkyl group, or a C$_6$-C$_{60}$ aryl group; a C$_2$-C$_{60}$ alkenyl group; a C$_2$-C$_{60}$ alkynyl group; a C$_1$-C$_{60}$ alkoxy group; a C$_1$-C$_{60}$ alkylthio group; a C$_3$-C$_{10}$ cycloalkyl group; a C$_1$-C$_{10}$ heterocycloalkyl group; a C$_3$-C$_{10}$ cycloalkenyl group; a C$_1$-C$_{10}$ heterocycloalkenyl group; a C$_6$-C$_{60}$ aryl group; a C$_6$-C$_{60}$ aryl group substituted with at least one of deuterium, a C$_1$-C$_{60}$ alkyl group, or a C$_6$-C$_{60}$ aryl group; a C$_6$-C$_{60}$ aryloxy group; a C$_6$-C$_{60}$ arylthio group; a C$_1$-C$_{60}$ heteroaryl group; a C$_2$-C$_{60}$ alkyl heteroaryl group; a C$_1$-C$_{60}$ heteroaryloxy group; a C$_1$-C$_{60}$ heteroarylthio group; a monovalent non-aromatic condensed polycyclic group; or a monovalent non-aromatic condensed heteropolycyclic group.

Hereinafter, a compound and an organic light-emitting device according to one or more exemplary embodiments are described with reference to Synthesis Examples and Examples. However, the compound and the organic light-emitting device are not limited thereto. The wording "'B' was used instead of 'A'" used in describing Synthesis Examples means that an amount of 'A' used was identical to an amount of 'B' used, in terms of a molar equivalent.

EXAMPLES

Synthesis Example 1: Synthesis of Compound 1

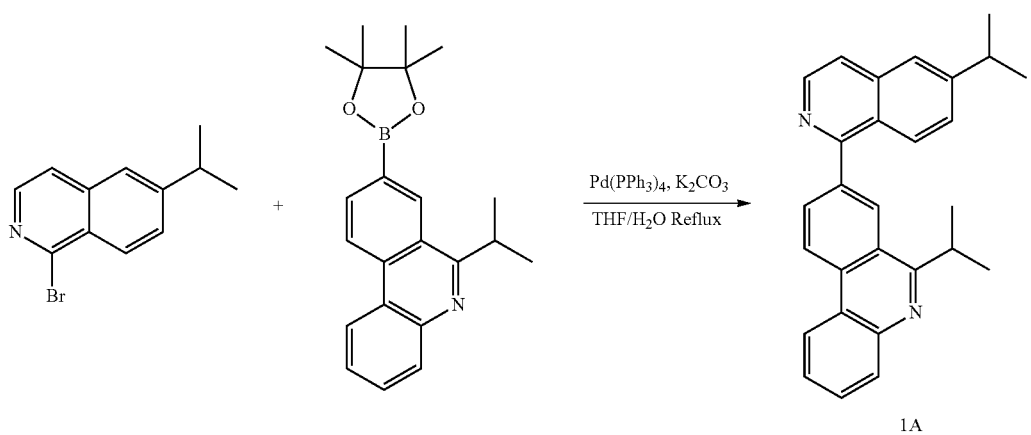

1A

-continued
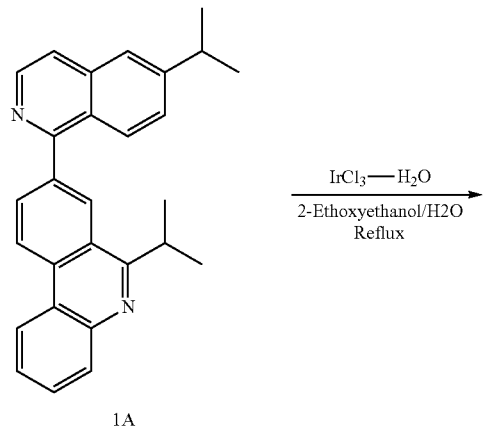
1A
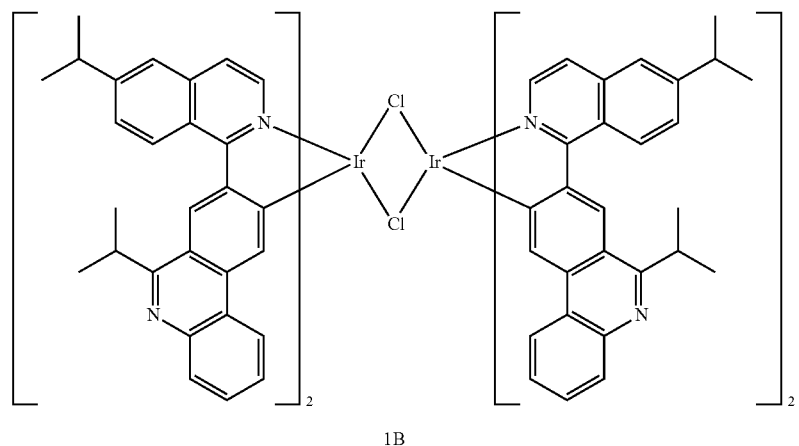
1B
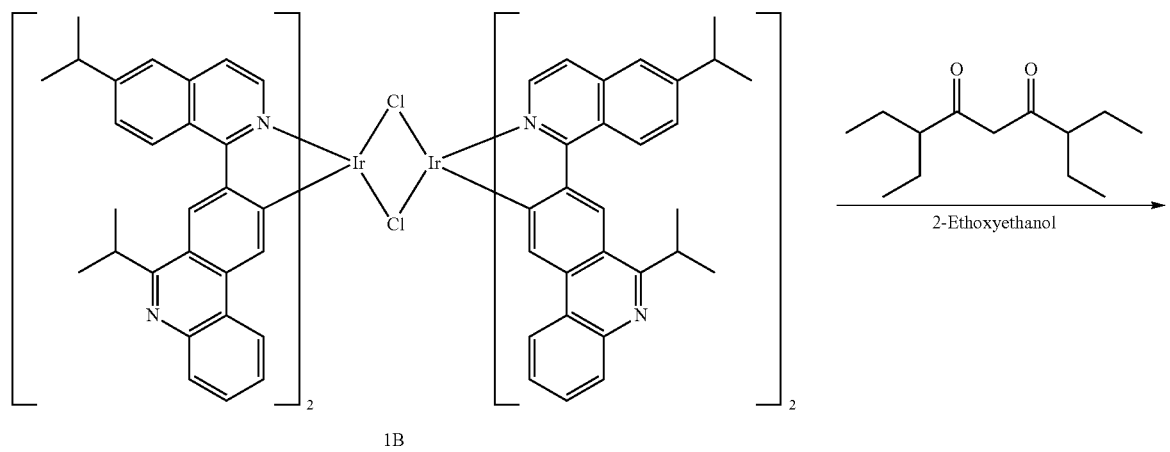
1B

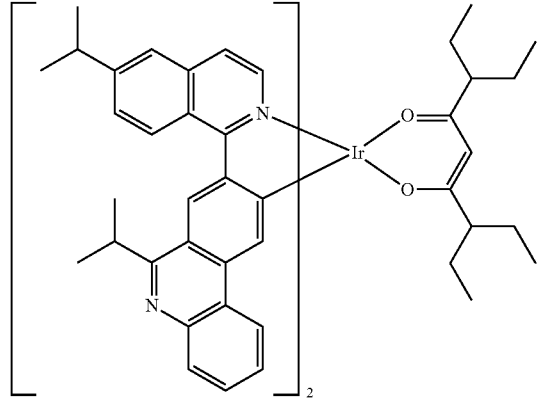

(1) Synthesis of Compound 1A

Under nitrogen environment, 1-bromo-6-isopropylisoquinoline (1.1 gram (g), 4.4 millimoles (mmol)) and 6-isopropyl-8-(4,4,5,5-tetramethyl-1,3,2-dioxoborolane-2-yl)phenanthridine (1.7 g, 4.8 mmol) were dissolved in 90 milliliters (mL) of 1,4-dioxane to prepare a reaction mixture. Then, potassium carbonate ($K_2CO_3$) (1.4 g, 13.2 mmol) was dissolved in 35 mL of deionize (DI) water, and this salt solution was added to the reaction mixture. Next, a palladium catalyst ($Pd(PPh_3)_4$) (0.25 g, 0.22 mmol) was added thereto. Afterwards, the resultant reaction mixture was stirred under reflux at a temperature of 100° C. After an extraction process was performed thereon, the solid thus obtained was subjected to column chromatography (eluent: methylene chloride (MC) and hexanes), so as to obtain 1.4 g (yield of 80%) of Compound 1A (6-isopropyl-8-(6-isopropylisoquinolin-1-yl)phenanthridine). The obtained compound was identified by higher resolution mass spectrometry (HRMS) using matrix assisted laser desorption ionization (MALDI) and high-performance liquid chromatography (HPLC) analysis.

HRMS (MALDI) calcd for $C_{28}H_{26}N_2$: m/z: 390.53 Found: 391.32.

(2) Synthesis of Compound 1B

Compound 1A (1.4 g, 3.56 mmol) and iridium chloride (0.6 g, 1.62 mmol) were mixed with 30 mL of 2-ethoxyethanol and 10 mL of DI water, and the resultant mixed solution was stirred under reflux for 24 hours. Then, the reaction temperature was lowered to room temperature. The solid thus obtained was separated by filtration, washed sufficiently with water, methanol, and hexane, in this stated order, and then, dried in a vacuum oven, so as to obtain 1.6 g (yield of 88%) of Compound 1B. Compound 1B thus obtained was used in the next reaction without performing an additional purification process thereon.

(3) Synthesis of Compound 1

Potassium carbonate ($K_2CO_3$) (0.33 g, 2.35 mmol) was added to Compound 1B (1.6 g, 0.78 mmol) and 3,7-diethylnonane-4,6-dione (0.5 g, 2.35 mmol), and 20 mL of 2-ethoxyethanol was added thereto. The resultant mixed solution was then stirred at room temperature for 24 hours. The solid thus obtained was filtered, and the filtrate was subjected to column chromatography (eluent: MC and hexanes), so as to obtain 0.5 g (yield of 37%) of Compound 1. The obtained compound was identified by HRMS and HPLC analysis.

HRMS (MALDI) calcd for $C_{69}H_{73}IrN_4O_2$: m/z: 1182.59 Found: 1183.61.

Example 1

As an anode, an ITO-patterned glass substrate was cut to a size of 50 millimeter (mm)×50 mm×0.5 mm, sonicated with isopropyl alcohol and DI water, each for 5 minutes, and then cleaned by exposure to ultraviolet rays and ozone for 30 minutes. The resultant ITO-patterned glass substrate was loaded onto a vacuum deposition apparatus.

Compounds HT3 and F12 (p-dopant) were vacuum-co-deposited on the anode at a weight ratio of 98:2 to form a hole injection layer having a thickness of 100 Å, and then, Compound HT3 was vacuum-deposited on the hole injection layer to form a hole transport layer having a thickness of 1,600 Å.

Next, Compounds RH3 (host) and 1 (dopant) were co-deposited at a weight ratio of 97:3 on the hole transport layer to form an emission layer having a thickness of 400 Å.

Then, Compounds ET3 and LiQ (n-dopant) were co-deposited at a volume ratio of 50:50 on the emission layer to form an electron transport layer having a thickness of 350 Å, LiQ was vacuum-deposited on the electron transport layer to form an electron injection layer having a thickness of 10 Å, and Al was vacuum-deposited on the electron injection layer to form a cathode having a thickness of 1,000 Å, thereby completing the manufacture of an organic light-emitting device.

HT3

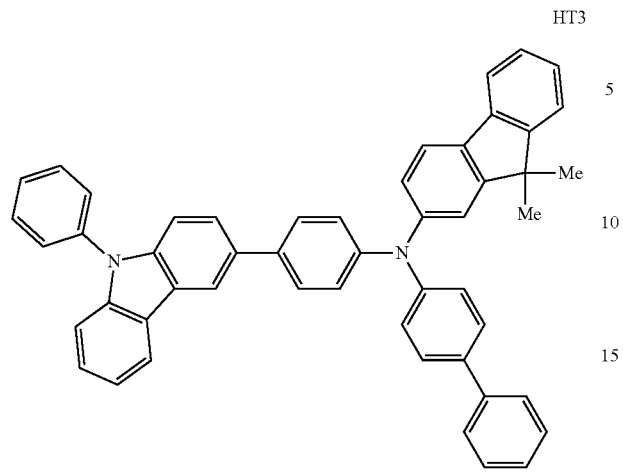

F12

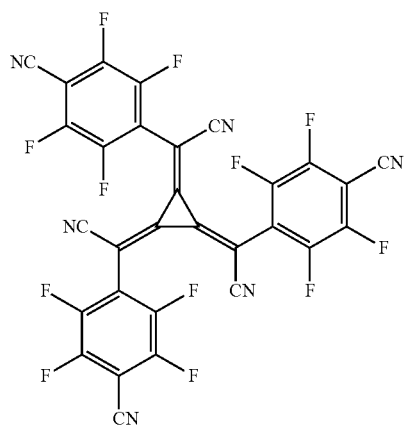

RH3

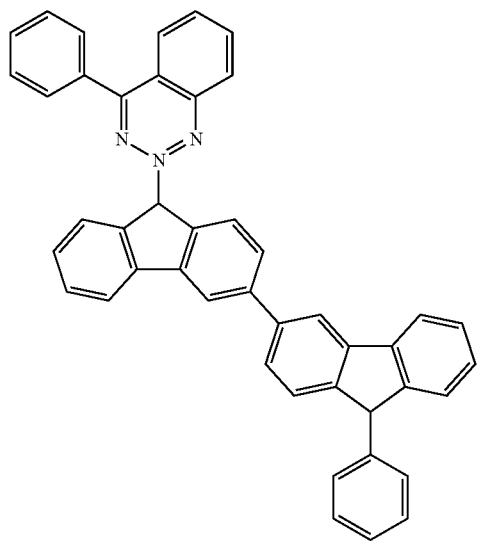

ET3

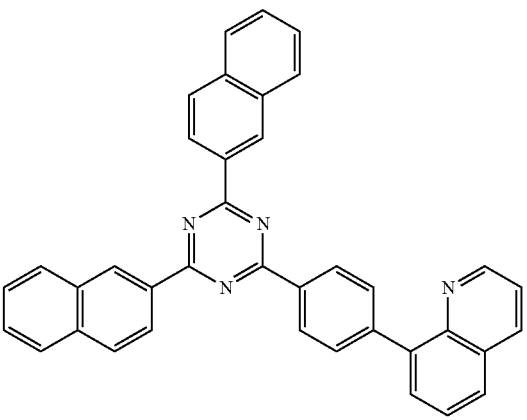

LiQ

Example 2 and Comparative Examples 1 to 3

Organic light-emitting devices were manufactured in a similar manner as in Example 1, except that compounds shown in Table 2 were each used instead of Compound 1 as a dopant in forming an emission layer.

For each of the organic light-emitting devices manufactured in Example 1 and 2 and Comparative Examples 1 to 3, the driving voltage (volts, V), roll-off ratio (%), lifespan (relative value, %), and maximum emission wavelength ($\lambda_{max}$, nm) of an emission spectrum were evaluated, and the results are shown in Table 2. As evaluation apparatuses, a current-voltage meter (Keithley 2400) and a luminance meter (Minolta Cs-1000A) were used. The roll-off ratio (%) was calculated according to Equation 20:

Roll-off ratio={1−(efficiency/maximum luminescence efficiency)}×100%   Equation 20

TABLE 2

| | Dopant in emission layer | Driving voltage (V) | Roll-off ratio (%) | Lifespan (%) (relative value) | $\lambda_{max}$ (nm) |
|---|---|---|---|---|---|
| Example 1 | Compound 1 | 4.6 | 12 | 110 | 618 |
| Example 2 | Compound 4 | 4.6 | 11 | 125% | 632 |
| Comparative Example 1 | Compound A | 4.9 | 13 | 100% | 624 |
| Comparative Example 2 | Compound B | 5.2 | 16 | 60% | 590 |
| Comparative Example 3 | Compound C | 5.0 | 14 | 85% | 625 |

TABLE 2-continued

| Dopant in emission layer | Driving voltage (V) | Roll-off ratio (%) | Lifespan (%) (relative value) | $\lambda_{max}$ (nm) |
|---|---|---|---|---|

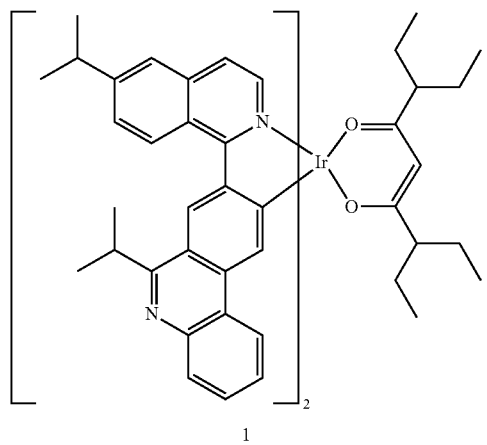

1

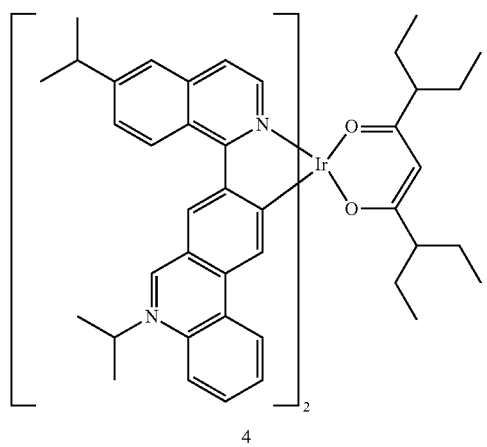

4

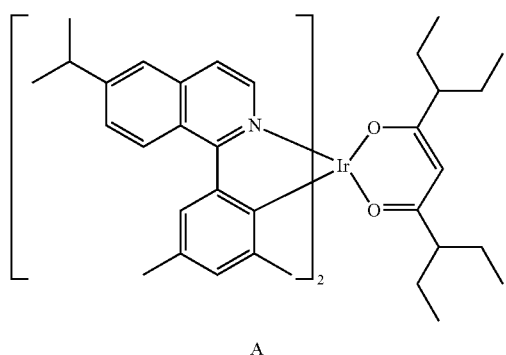

A

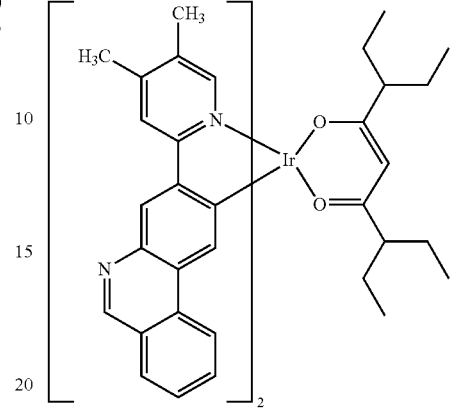

B

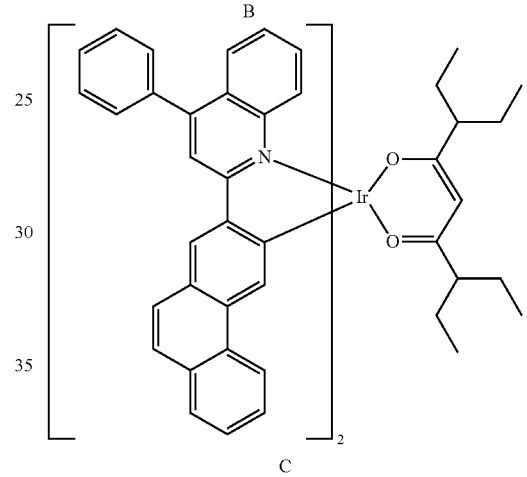

C

Referring to Table 2, it was confirmed that the organic light-emitting devices of Examples 1 and 2 had low driving voltage and roll-off ratio, and excellent lifespan characteristics. In addition, it was confirmed that the organic light-emitting devices of Examples 1 and 2 had lower driving voltage and roll-off ratio, and longer lifespan than the organic light-emitting devices of Comparative Examples 1 to 3.

According to the one or more embodiments, an organometallic compound may have excellent electrical characteristics and stability. Thus, an electronic device, for example, an organic light-emitting device, including the organometallic compound may have low driving voltage, high efficiency, long lifespan, a reduced roll-off ratio, and a relatively narrow FWHM of an emission peak of an EL spectrum. Thus, due to the use of the organometallic compound, a high-quality organic light-emitting device may be embodied.

It should be understood that the one or more embodiments described herein should be considered in a descriptive sense and not for purposes of limitation. Descriptions of features or aspects within each exemplary embodiment should typically be considered as available for other similar features or aspects in other exemplary embodiments. While one or more embodiments have been described with reference to the FIGURE, it will be understood by those of ordinary skill in the art that various changes in form and details may be made therein without departing from the spirit and scope as defined by the following claims.

What is claimed is:

1. An organometallic compound, represented by Formula 1:

$$M_1(Ln_1)_{n1}(Ln_2)_{n2} \quad \text{Formula 1}$$

wherein, in Formula 1,
$M_1$ is a transition metal,
$Ln_1$ is a ligand represented by Formula 1-1,
$Ln_2$ is a ligand represented by Formula 2-1 or 2-2,
n1 is 1 or 2,
n2 is 1 or 2,

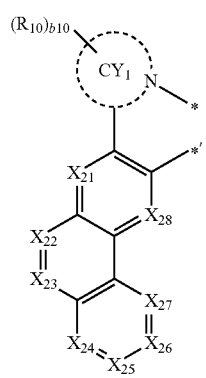

Formula 1-1

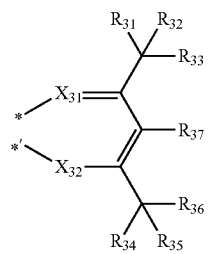

Formula 2-1

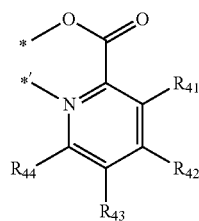

Formula 2-2 wherein, in Formulae 1-1, 2-1, and 2-2,
each bond between a *—N moiety in Formula 1-1 and $M_1$ is a coordinate bond, and each bond between a *'—C moiety and $M_1$ is a covalent bond,
each bond between a *—$X_{31}$ moiety in Formula 2-1 and $M_1$ in Formula 1 is a coordinate bond, each bond between a *'—$X_{32}$ moiety in Formula 2-1 and $M_1$ in Formula 1 is a covalent bond, each bond between a *—O moiety in Formula 2-2 and $M_1$ in Formula 1 is a covalent bond, and each bond between a *'—N moiety in Formula 2-2 and $M_1$ in Formula 1 is a coordinate bond,
$CY_1$ is a quinoline group, an isoquinoline group, a benzoquinoline group, or a benzoisoquinoline group,
$X_{21}$ is N or $C(R_{21})$, $X_{22}$ is N or $C(R_{22})$, $X_{23}$ is N or $C(R_{23})$, $X_{24}$ is N or $C(R_{24})$, $X_{25}$ is N or $C(R_{25})$, $X_{26}$ is N or $C(R_{26})$, $X_{27}$ is N or $C(R_{27})$, and $X_{28}$ is N or $C(R_{28})$,
at least one of $X_{21}$ to $X_{28}$ is N,
$X_{31}$ and $X_{32}$ are each independently O or S,
$R_{10}$, $R_{21}$ to $R_{28}$, $R_{31}$ to $R_{37}$, and $R_{41}$ to $R_{44}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —N($Q_4$)($Q_5$), —B($Q_6$)($Q_7$), —P($Q_8$)($Q_9$), or —P(=O)($Q_8$)($Q_9$),
two or more of $R_{10}$(s) are optionally linked together to form a substituted or unsubstituted $C_5$-$C_{30}$ carbocyclic group or a substituted or unsubstituted $C_1$-$C_{30}$ heterocyclic group,
two or more of $R_{21}$ to $R_{28}$ are optionally linked together to form a substituted or unsubstituted $C_5$-$C_{30}$ carbocyclic group or a substituted or unsubstituted $C_1$-$C_{30}$ heterocyclic group,
two or more of $R_{31}$ to $R_{37}$ are optionally linked together to form a substituted or unsubstituted $C_5$-$C_{30}$ carbocyclic group or a substituted or unsubstituted $C_1$-$C_{30}$ heterocyclic group,
two or more of $R_{41}$ to $R_{44}$ are optionally linked together to form a substituted or unsubstituted $C_5$-$C_{30}$ carbocyclic group or a substituted or unsubstituted $C_1$-$C_{30}$ heterocyclic group,
neighboring two or more of $R_{10}$, $R_{21}$ to $R_{28}$, $R_{31}$ to $R_{37}$, and $R_{41}$ to $R_{44}$ are optionally linked to form a substituted or unsubstituted $C_5$-$C_{30}$ carbocyclic group or a substituted or unsubstituted $C_5$-$C_{30}$ heterocyclic group,
b10 is 1, 2, 3, 4, 5, 6, 7, or 8,
* and *' each indicate a binding site to $M_1$,
at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{11}$)($Q_{12}$)($Q_{13}$), —Ge($Q_{11}$)($Q_{12}$)($Q_{13}$), —N($Q_{14}$)($Q_{15}$), —B($Q_{16}$)($Q_{17}$), —P($Q_{18}$)($Q_{19}$), —P(=O)($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{21}$)($Q_{22}$)($Q_{23}$), —Ge($Q_{21}$)($Q_{22}$)($Q_{23}$), —N($Q_{24}$)($Q_{25}$), —B($Q_{26}$)($Q_{27}$), —P($Q_{28}$)($Q_{29}$), —P(=O)($Q_{28}$)($Q_{29}$), or a combination thereof; or —Si($Q_{31}$)($Q_{32}$)($Q_{33}$), —Ge($Q_{31}$)($Q_{32}$)($Q_{33}$), —N($Q_{34}$)($Q_{35}$), —B($Q_{36}$)($Q_{37}$), —P($Q_{38}$)($Q_{39}$), or —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

2. The organometallic compound of claim 1, wherein $M_1$ is iridium (Ir), platinum (Pt), osmium (Os), titanium (Ti), zirconium (Zr), hafnium (Hf), europium (Eu), terbium (Tb), thulium (Tm), rhodium (Rh), palladium (Pd), or gold (Au).

3. The organometallic compound of claim 1, wherein $M_1$ is Ir, and the sum of n1 and n2 is 3.

4. The organometallic compound of claim 1, wherein $CY_1$ is a group represented by one of Formulae 3-1 to 3-12:

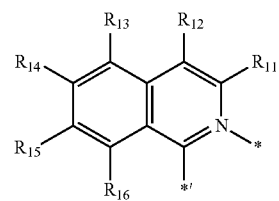

3-1

3-2
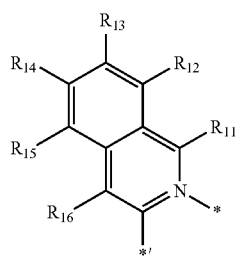
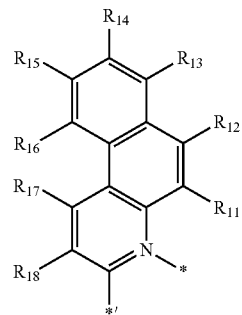
3-7
3-3
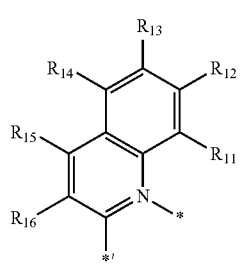
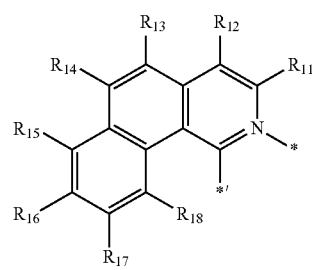
3-8
3-4
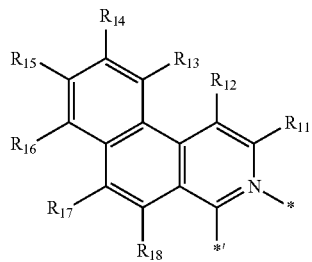
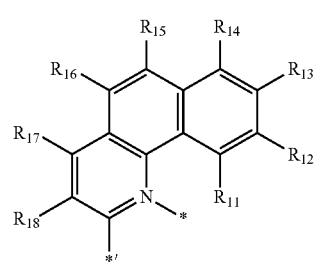
3-9
3-5
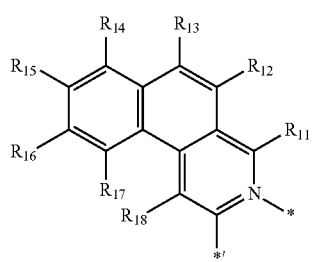
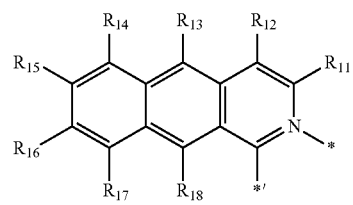
3-10
3-6
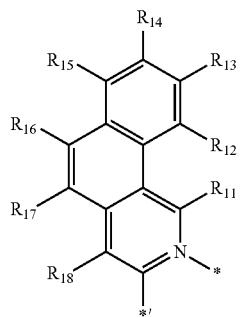
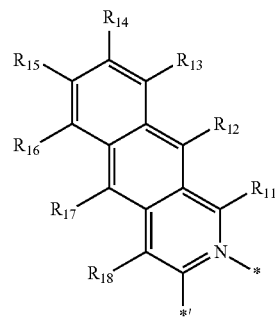
3-11

3-12 wherein, in Formulae 3-1 to 3-12,
$R_{11}$ to $R_{18}$ are respectively the same as described in connection with $R_{10}$ in claim 1, and
\* indicates a binding site to $M_1$, and \*' indicates a binding site to a neighboring atom.

5. The organometallic compound of claim 1, wherein one of $X_{21}$ to $X_{28}$ is N, or two of $X_{21}$ to $X_{28}$ are N.

6. The organometallic compound of claim 1, wherein $R_{10}$, $R_{21}$ to $R_{28}$, $R_{31}$ to $R_{37}$, and $R_{41}$ to $R_{44}$ are each independently: hydrogen, deuterium, —F, —Cl, —Br, —I, —CD$_3$, —CD$_2$H, —CDH$_2$, —CF$_3$, —CF$_2$H, —CFH$_2$, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, —Si(Q$_1$)(Q$_2$)(Q$_3$), or —Ge(Q$_1$)(Q$_2$)(Q$_3$), or a group represented by one of Formulae 9-1 to 9-67, 9-201 to 9-244, 10-1 to 10-154, or 10-201 to 10-350:

| | |
|---|---|
| 9-25 | 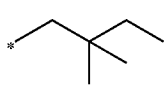 |
| 9-26 | 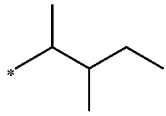 |
| 9-27 | 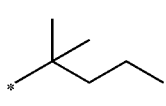 |
| 9-28 | 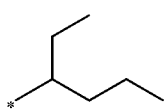 |
| 9-29 | 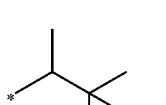 |
| 9-30 | 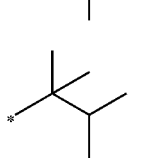 |
| 9-31 | 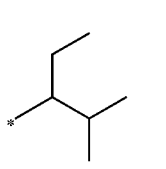 |
| 9-32 | 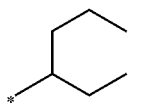 |
| 9-33 | 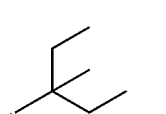 |
| 9-34 | 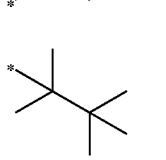 |
| 9-35 | 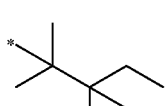 |
| 9-36 | 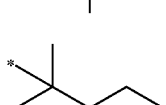 |
| 9-37 | 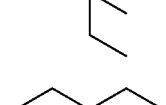 |
|  | 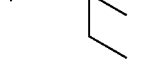 |
| | |
|---|---|
| 9-38 | 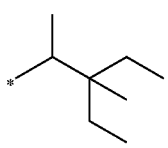 |
| 9-39 | 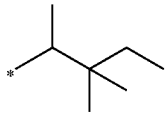 |
| 9-40 |  |
| 9-41 | 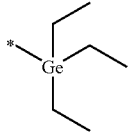 |
| 9-42 | 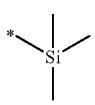 |
| 9-43 | 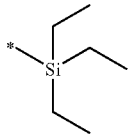 |
| 9-44 |  |
| 9-45 |  |
| 9-46 |  |
| 9-47 | 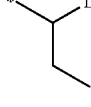 |
| 9-48 |  |
| 9-49 | 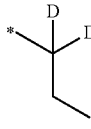 |

-continued
| | |
|---|---|
| 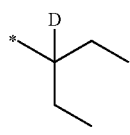 | 9-50 |
| 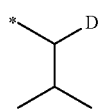 | 9-51 |
| 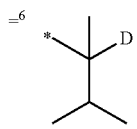 | 9-52 |
| 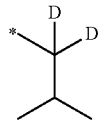 | 9-53 |
| 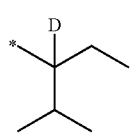 | 9-54 |
| 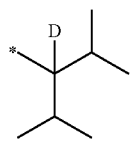 | 9-55 |
| 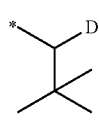 | 9-56 |
| 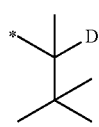 | 9-57 |
| 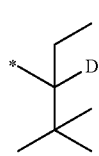 | 9-58 |
| 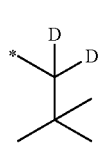 | 9-59 |
| 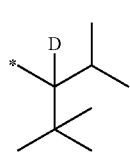 | 9-60 |
-continued
| | |
|---|---|
| 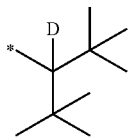 | 9-61 |
| 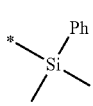 | 9-62 |
|  | 9-63 |
| 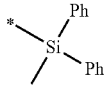 | 9-64 |
| 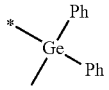 | 9-65 |
| 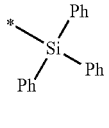 | 9-66 |
| 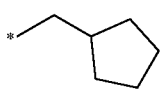 | 9-67 |
| 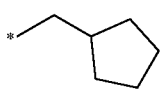 | 9-201 |
| 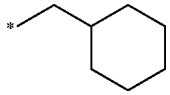 | 9-202 |
|  | 9-203 |
| 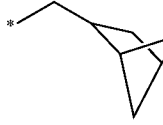 | 9-204 |
| 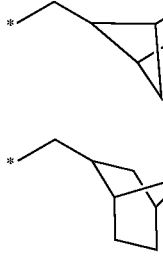 | 9-205 |
| | 9-206 |

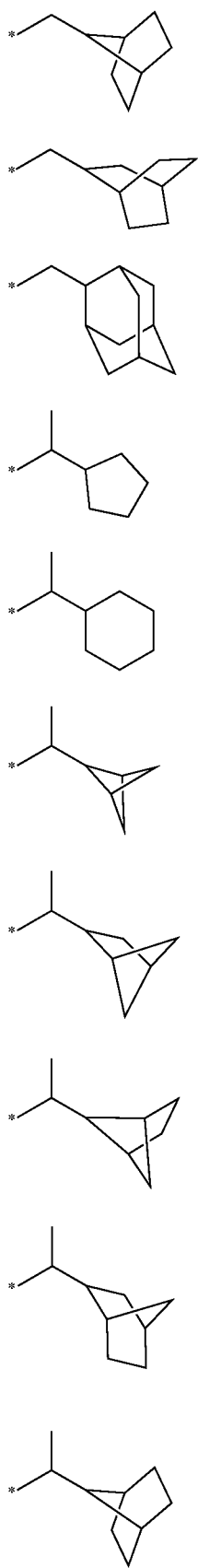
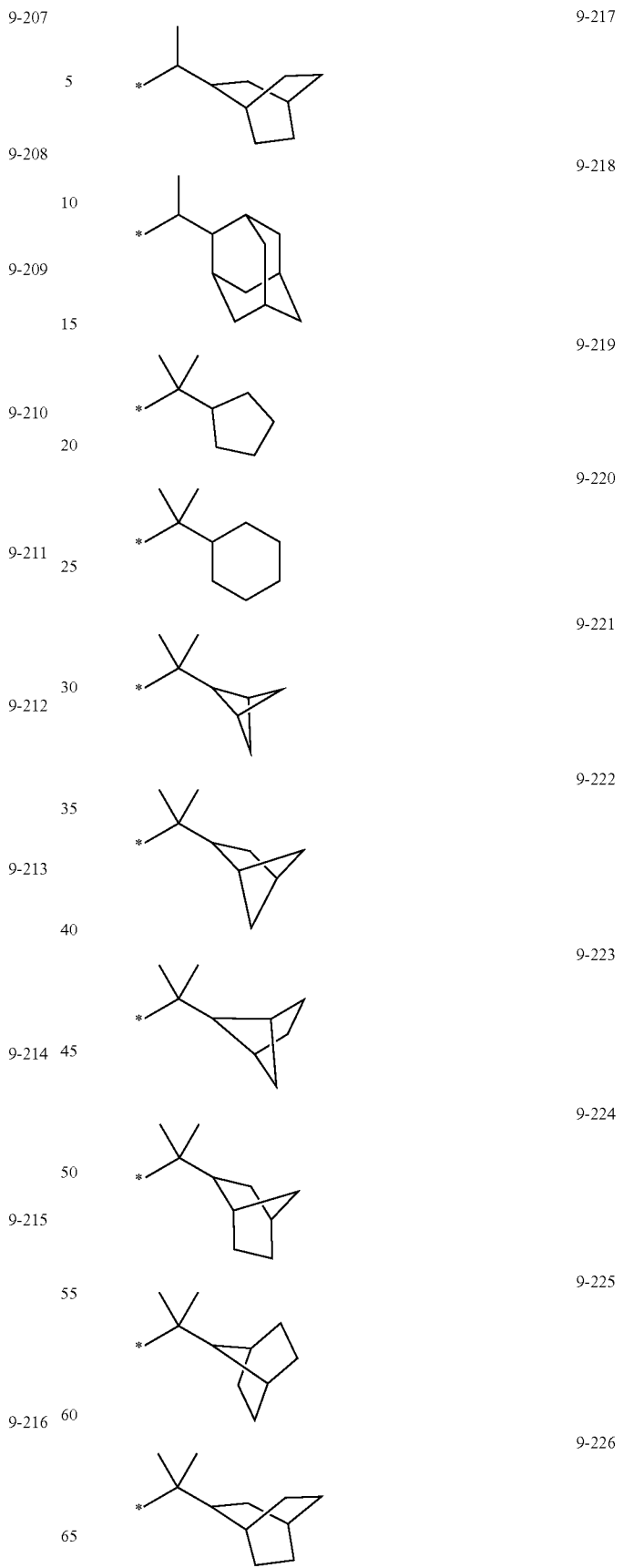

| | |
|---|---|
| 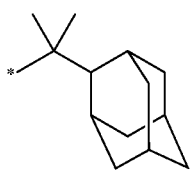 | |
| 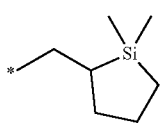 | |
| 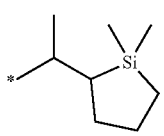 | |
| 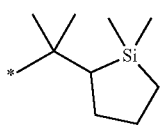 | |
| 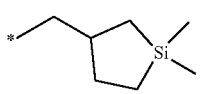 | |
| 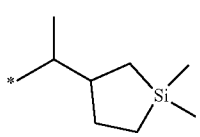 | |
| 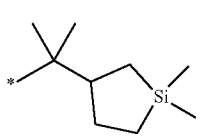 | |
| 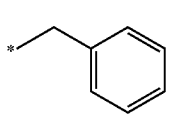 | |
| 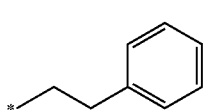 | |
|  | |
| 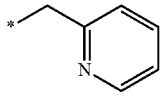 | |
| 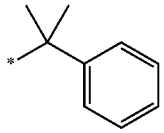 | |
| | |
|---|---|
| 9-227 | 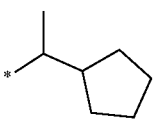 |
| 9-228 | 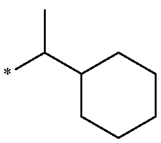 |
| 9-229 | 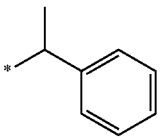 |
| 9-230 | 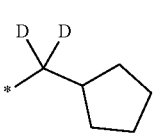 |
| 9-231 | 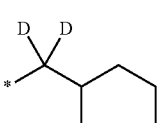 |
| 9-232 | 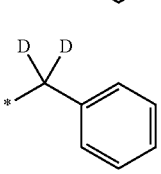 |
| 9-233 | 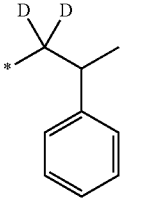 |
| 9-234 | 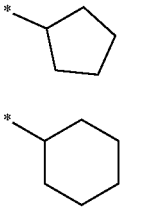 |
| 9-235 |  |
| 9-236 | 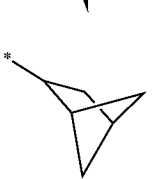 |
| 9-237 | |
9-238
9-239
9-240
9-241
9-242
9-243
9-244
10-1
10-2
10-3
10-4

-continued
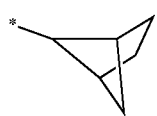
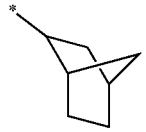
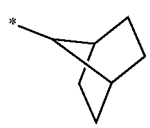
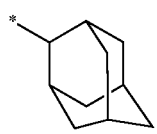
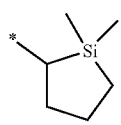
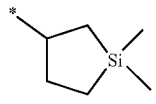
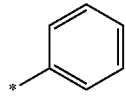
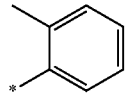
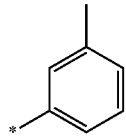
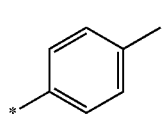
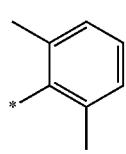
-continued
10-5
10-6
10-7
10-8
10-9
10-10
10-11
10-12
10-13
10-14
10-15
10-16
10-17
10-18
10-19
10-20
10-21
10-22
10-23
10-24
10-25
10-26
10-27

| | |
|---|---|
| 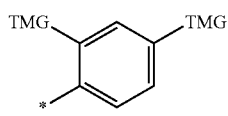 | 10-17 |
| 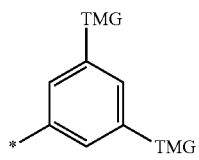 | 10-18 |
| 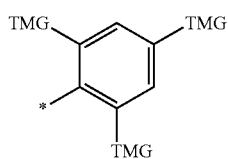 | 10-19 |
| 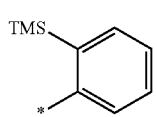 | 10-20 |
| 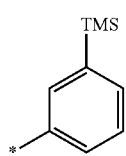 | 10-21 |
| 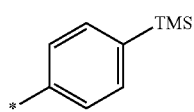 | 10-22 |
| 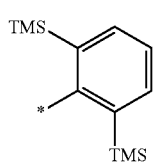 | 10-23 |
| 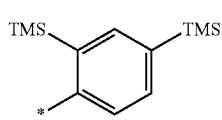 | 10-24 |
| 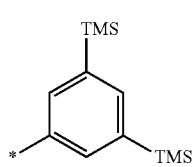 | 10-25 |
| 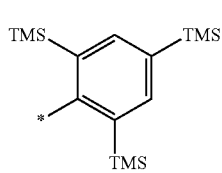 | 10-26 |
| 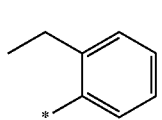 | 10-27 |
| | |
|---|---|
| 10-28 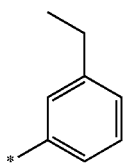 | 10-39 |
| 10-29 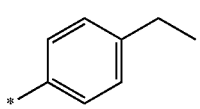 | 10-40 |
| 10-30 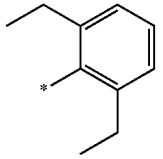 | 10-41 |
| 10-31 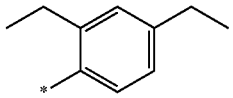 | 10-42 |
| 10-32 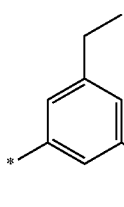 | 10-43 |
| 10-33 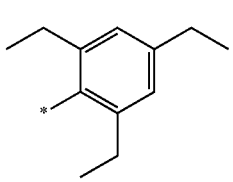 | 10-44 |
| 10-34 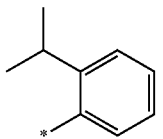 | 10-45 |
| 10-35 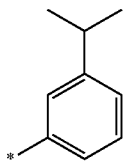 | 10-46 |
| 10-36 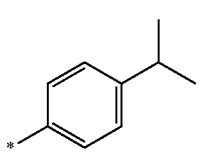 | 10-47 |
| 10-37 | |
| 10-38 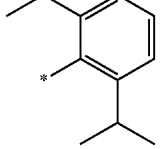 | 10-48 |

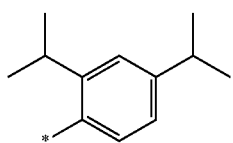
10-49
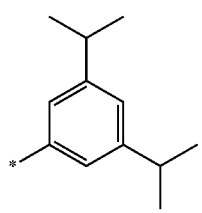
10-50
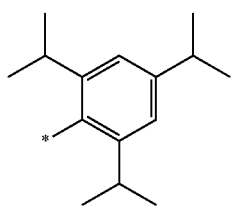
10-51
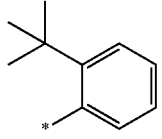
10-52
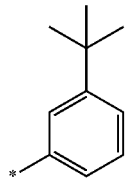
10-53
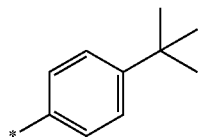
10-54
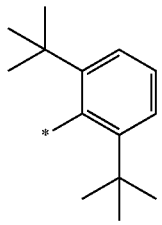
10-55
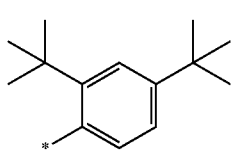
10-56
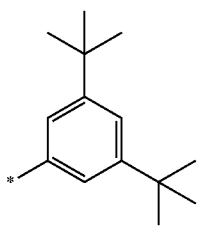
10-57
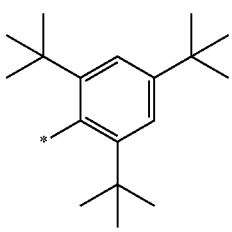
10-58
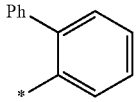
10-59
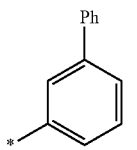
10-60
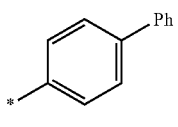
10-61
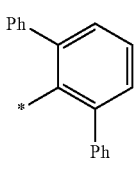
10-62
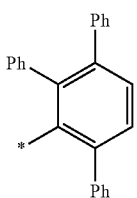
10-63
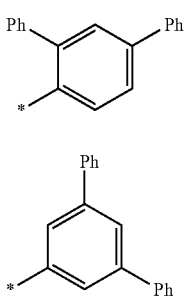
10-64
10-65

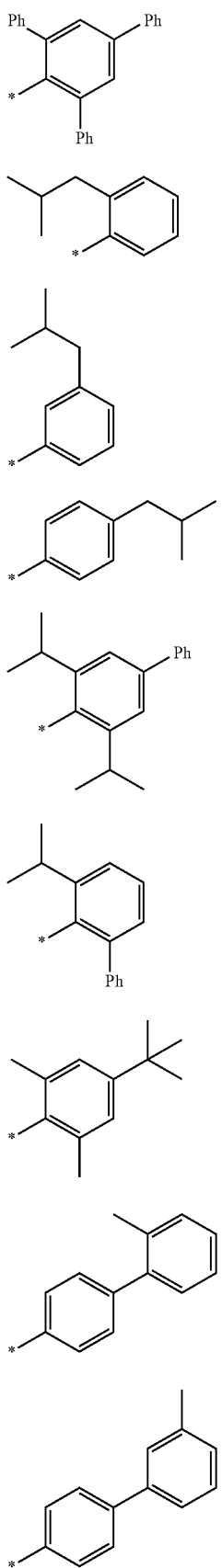
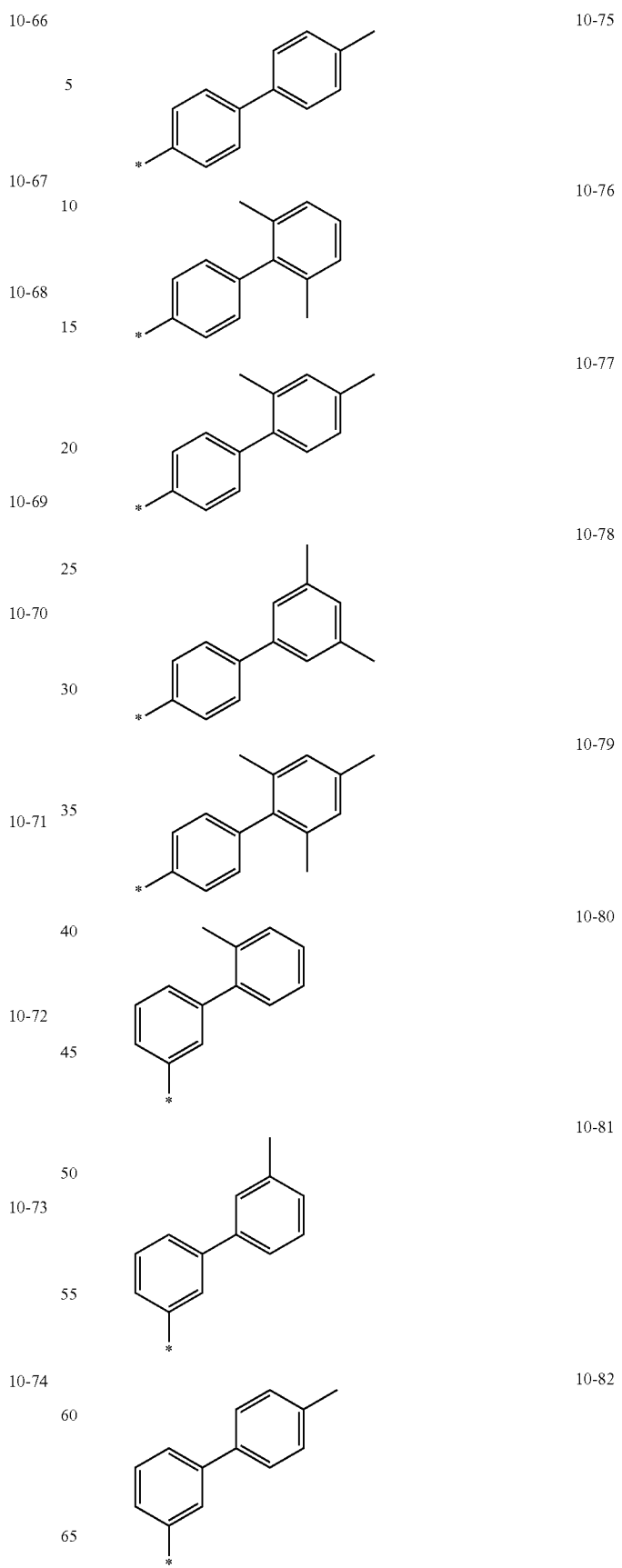

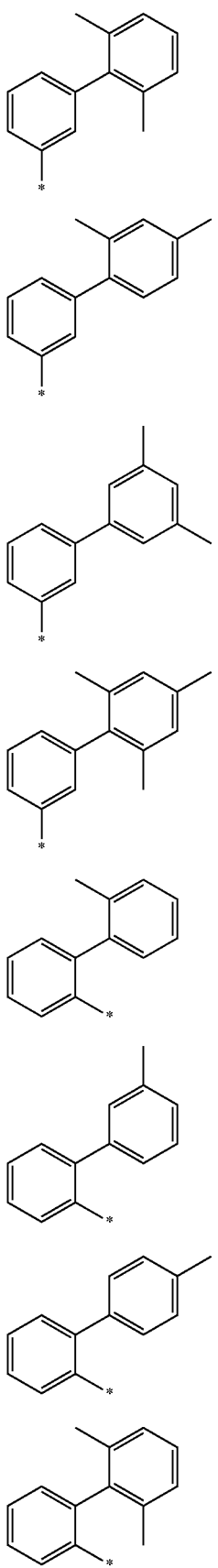
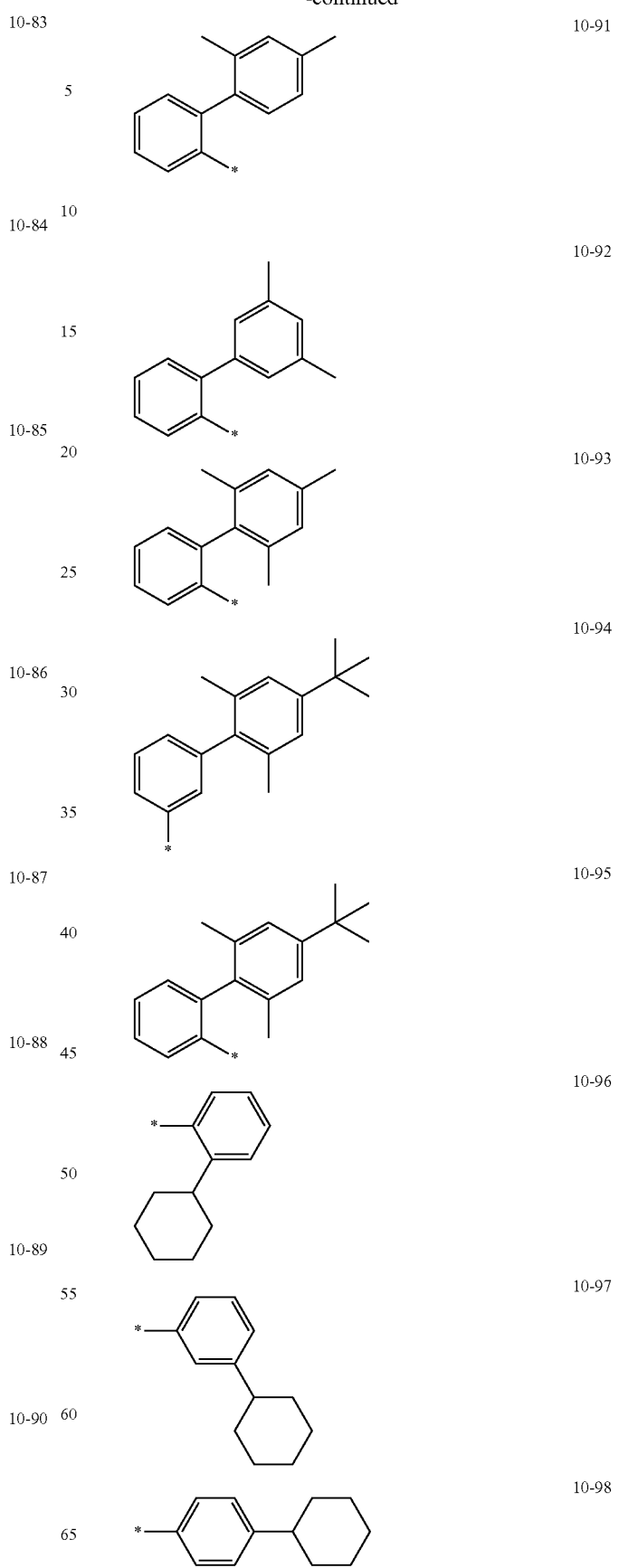

10-99 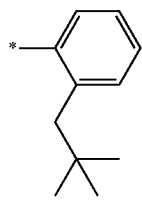
10-100 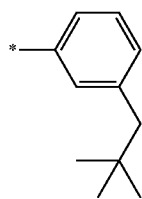
10-101 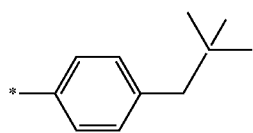
10-102 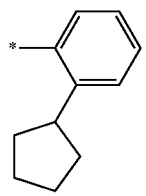
10-103 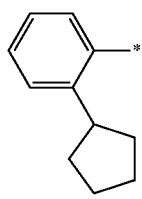
10-104 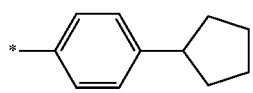
10-105 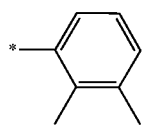
10-106 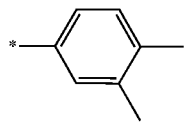
10-107 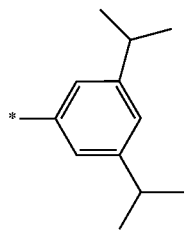
10-108 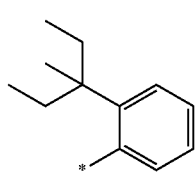
10-109 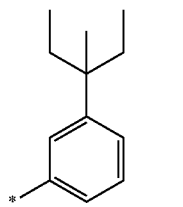
10-110 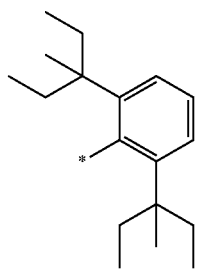
10-111 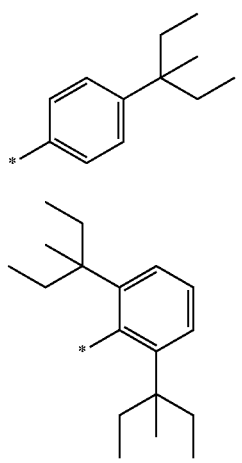
10-112 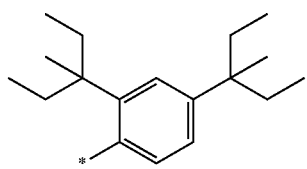
10-113 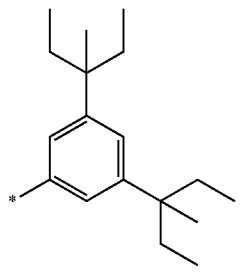

| | |
|---|---|
| 10-114 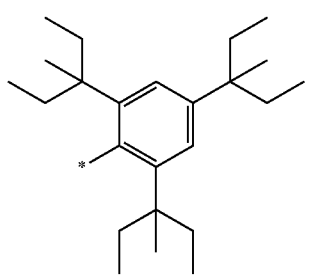 | 10-203 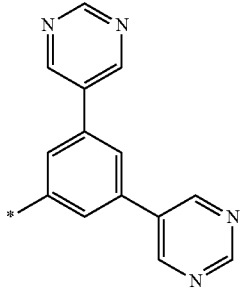 |
| 10-115 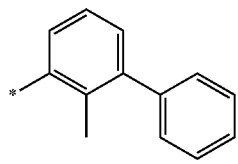 | |
| 10-116 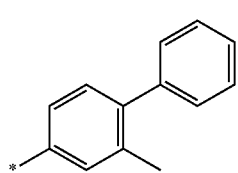 | 10-204 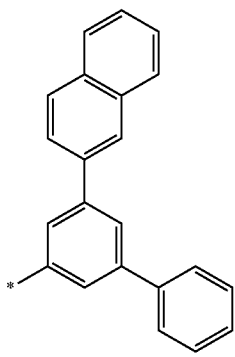 |
| 10-117 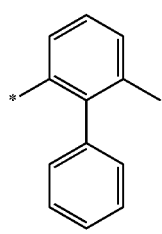 | 10-205 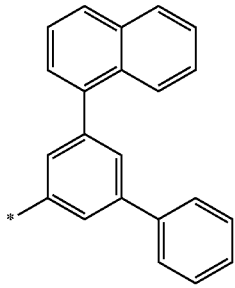 |
| 10-118 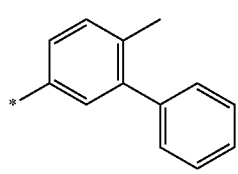 | 10-206 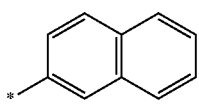 |
| 10-201 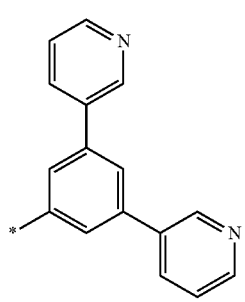 | 10-207 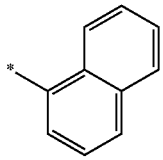 |
| 10-202 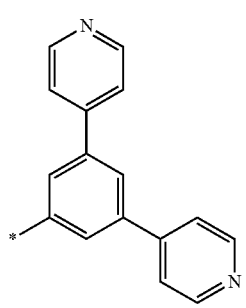 | 10-208 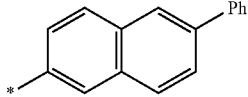 |
| | 10-209 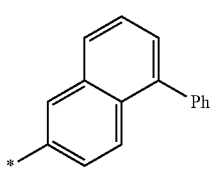 |

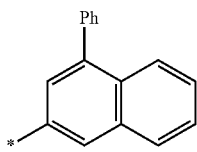
10-198
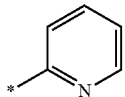
10-199
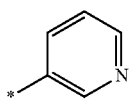
10-200
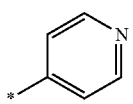
10-201
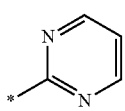
10-202
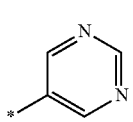
10-203
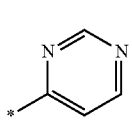
10-204
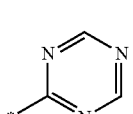
10-205
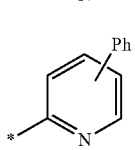
10-206
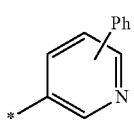
10-207
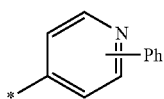
10-208
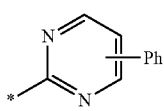
10-209
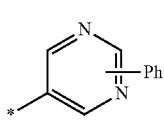
10-210
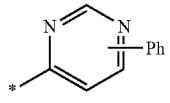
10-211
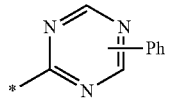
10-212
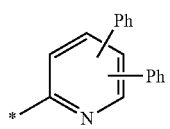
10-213
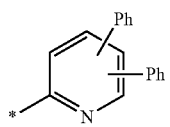
10-214
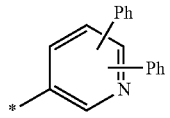
10-215
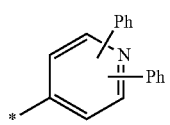
10-216
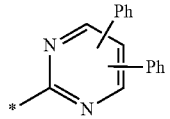
10-217
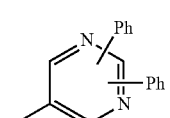
10-218
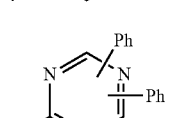
10-219
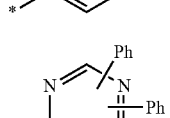
10-220
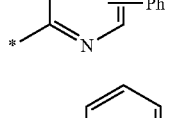
10-221
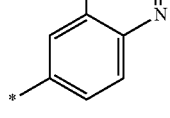
10-222
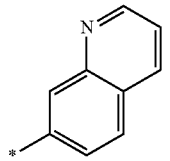
10-223
10-224
10-225
10-225
10-226
10-227
10-228
10-229
10-230
10-231
10-232
10-233

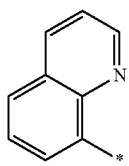
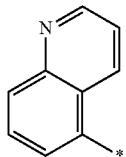
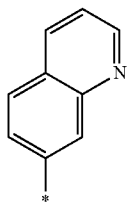
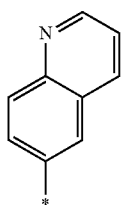
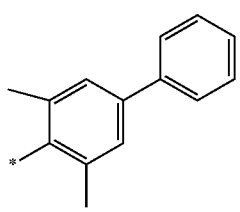
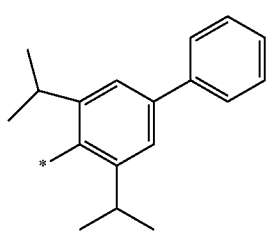
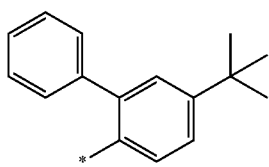
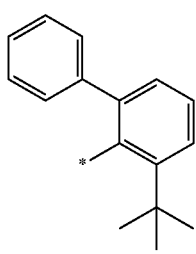
10-234
10-235
10-236
10-237
10-119
10-120
10-121
10-122
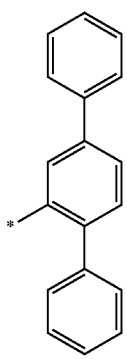
10-123
10-124
10-125
10-126
10-127
10-128

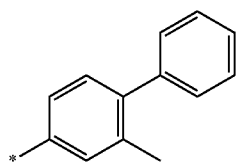
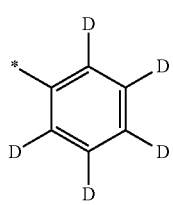
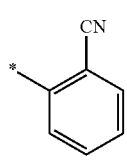
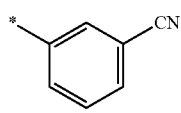
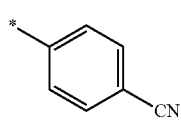
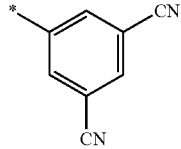
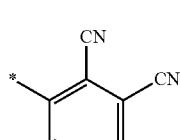
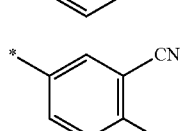
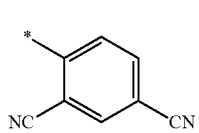
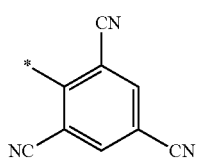
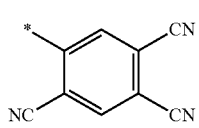
10-129
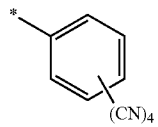
10-130
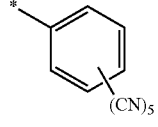
10-131
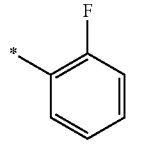
10-132
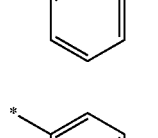
10-133
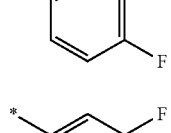
10-134
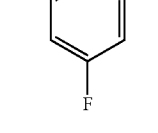
10-135
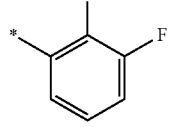
10-136
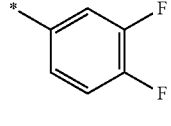
10-137
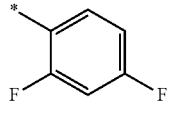
10-138
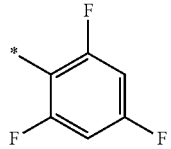
10-139
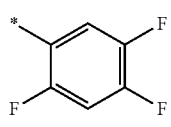
10-140
10-141
10-142
10-143
10-144
10-145
10-146
10-147
10-148
10-149
10-150

-continued 10-151

10-152

10-153

10-154

10-238

10-239

10-240

10-241

-continued 10-242

10-243

10-244

10-245

10-246

10-247

10-248

10-249

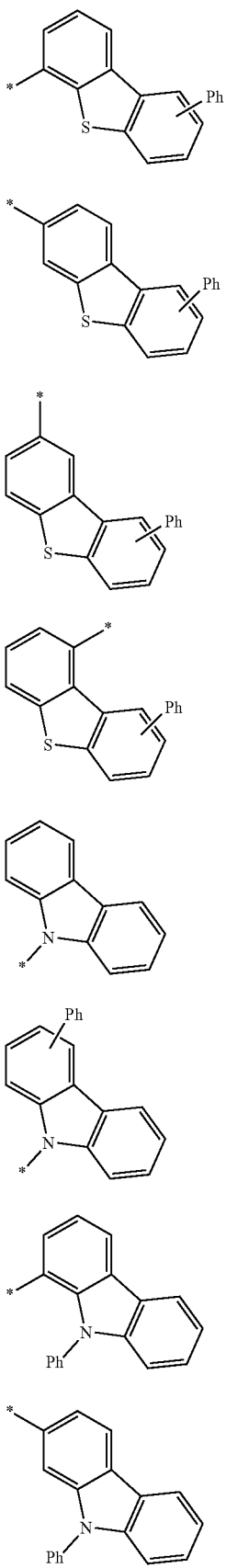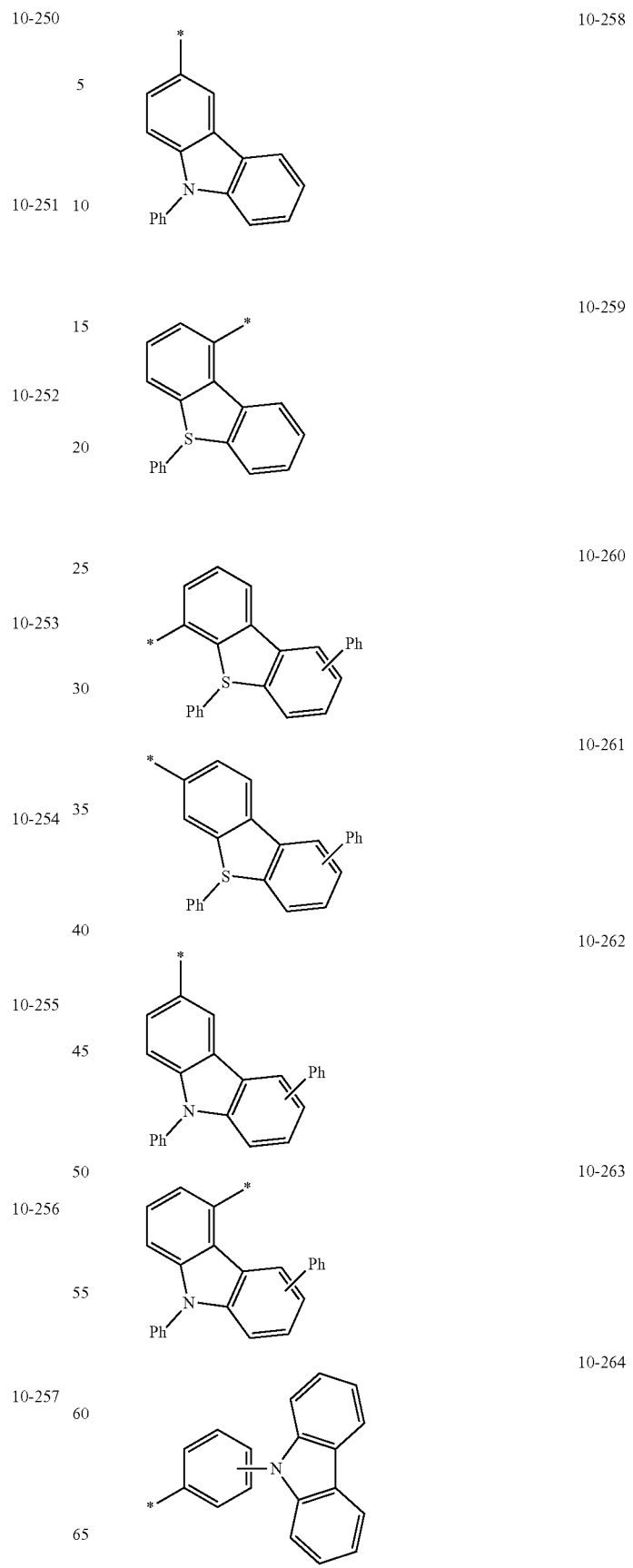

-continued
10-265 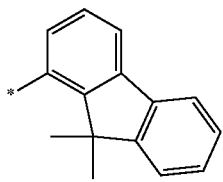
10-266 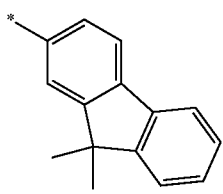
10-267 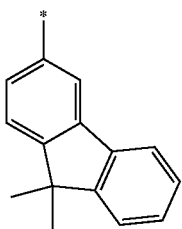
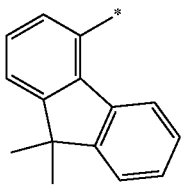
10-268
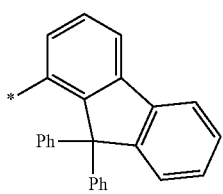
10-269
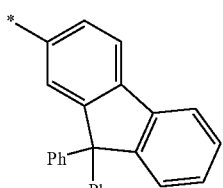
10-270
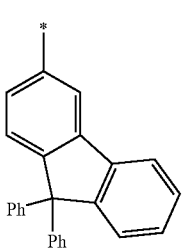
10-271
-continued
10-272 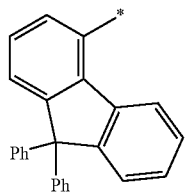
10-273 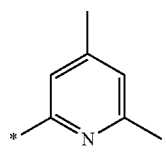
10-274
10-275 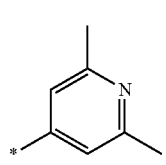
10-276 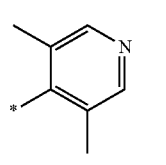
10-277 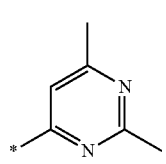
10-278
10-279 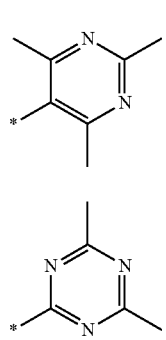
10-280
10-281 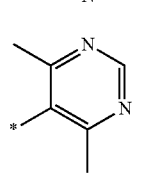

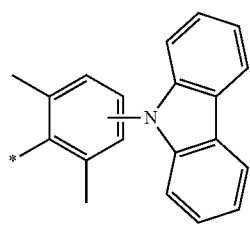
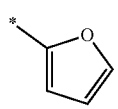
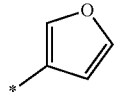
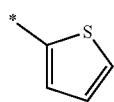
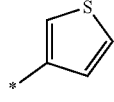
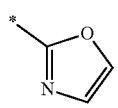
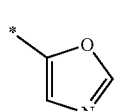
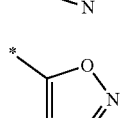
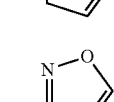
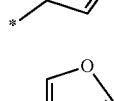
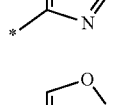
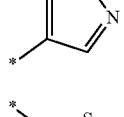
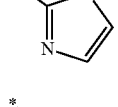
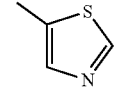
10-282
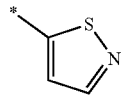
10-283
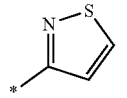
10-284
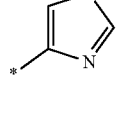
10-285
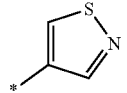
10-286
10-287
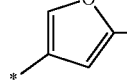
10-288
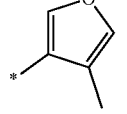
10-289
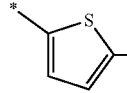
10-290
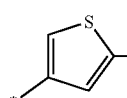
10-291
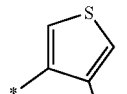
10-292
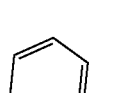
10-293
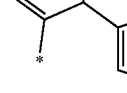
10-294
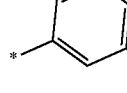
10-295
10-296
10-297
10-298
10-299
10-300
10-301
10-302
10-303
10-304
10-305
10-306

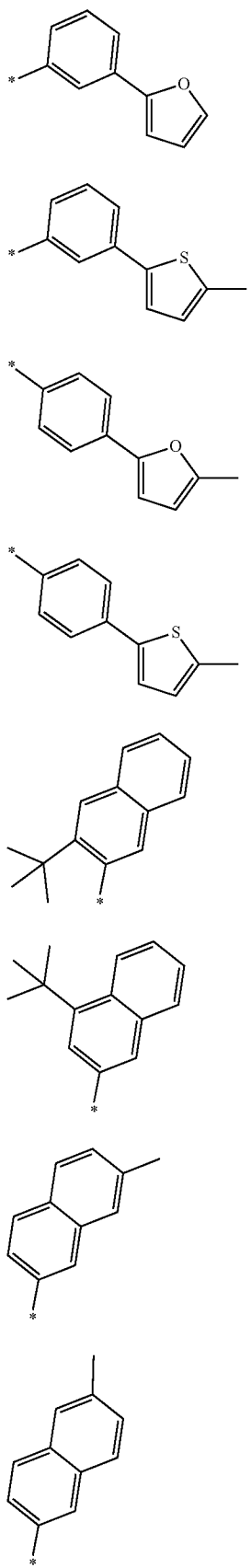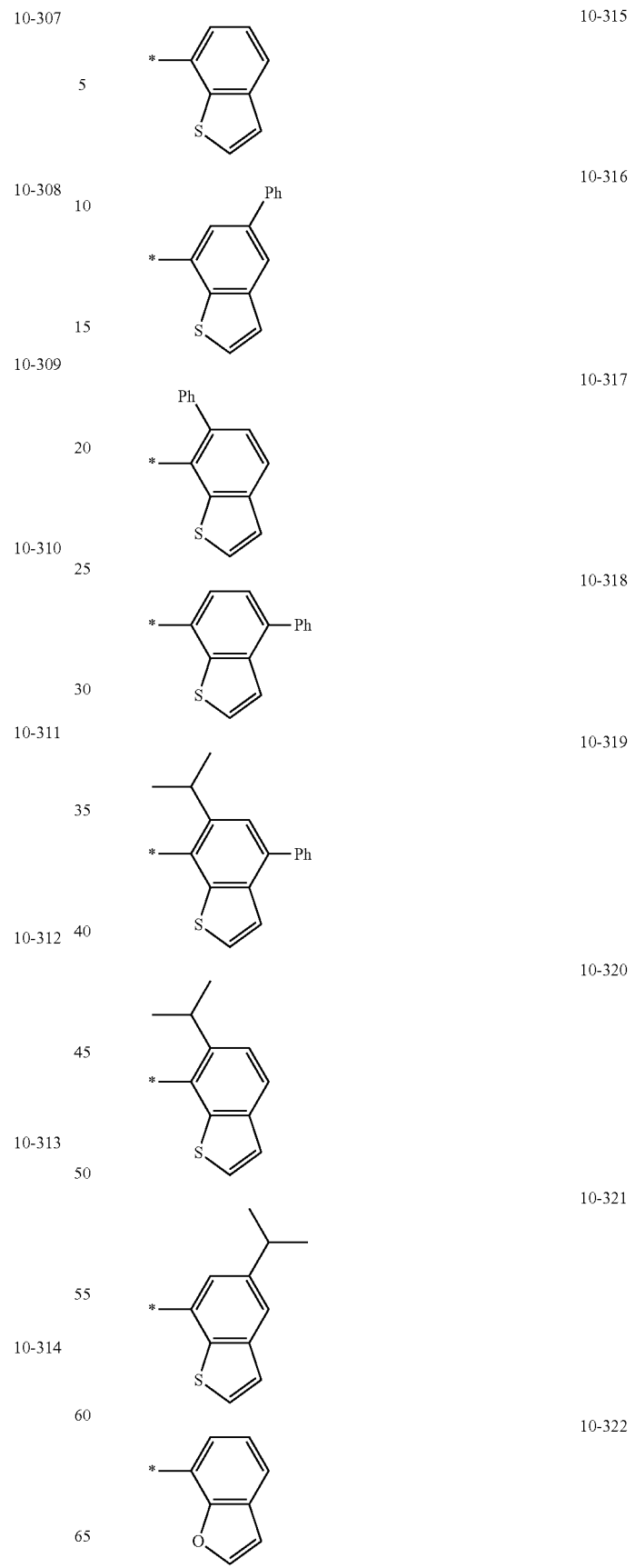

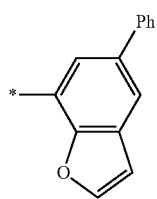
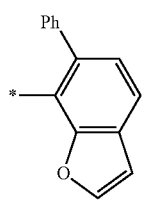
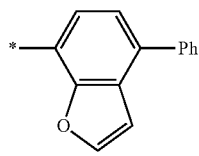
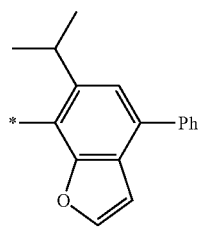
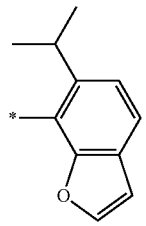
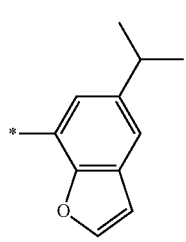
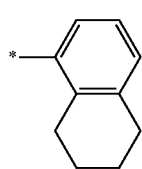
10-323
10-324
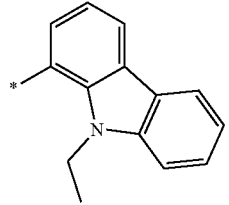
10-325
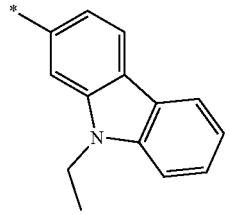
10-326
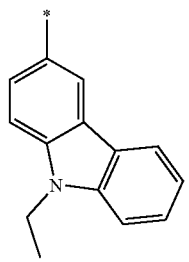
10-327
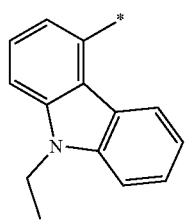
10-328
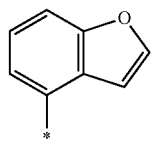
10-329
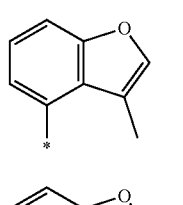
10-330
10-331
10-332
10-333
10-334
10-335
10-336
10-337

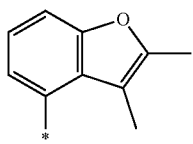 10-338

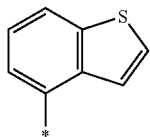 10-339

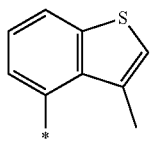 10-340

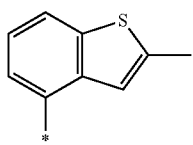 10-341

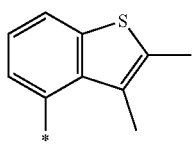 10-342

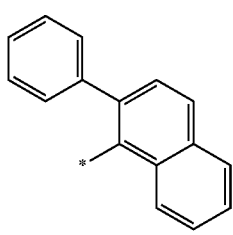 10-343

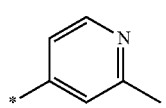 10-344

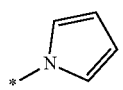 10-345

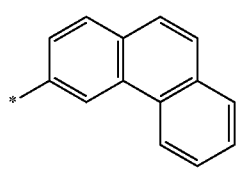 10-346

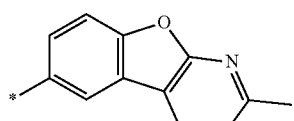 10-347

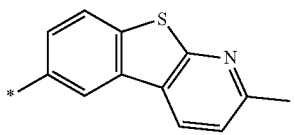 10-348

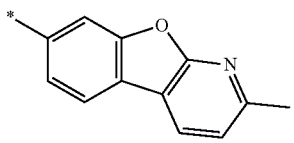 10-349

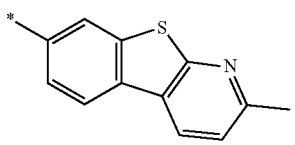 10-350 wherein, in Formulae 9-1 to 9-67, 9-201 to 9-244, 10-1 to 10-154, and 10-201 to 10-350, * indicates a binding site to a neighboring atom, Ph is a phenyl group, TMS is a trimethylsilyl group, and TMG is a trimethylgermyl group.

7. The organometallic compound of claim 1, wherein $R_{10}$ and $R_{21}$ to $R_{28}$ are each independently hydrogen, a $C_1$-$C_{60}$ alkyl group, a $C_1$-$C_{60}$ aryl group, a $C_2$-$C_{60}$ alkyl aryl group, a $C_2$-$C_{60}$ aryl alkyl group, —Si($Q_1$)($Q_2$)($Q_3$), or —Ge($Q_1$)($Q_2$)($Q_3$).

8. The organometallic compound of claim 1, wherein $R_{31}$ to $R_{37}$ are each independently hydrogen, deuterium, a methyl group, an ethyl group, a propyl group, a 1-methylethyl group, a butyl group, a 2-methylpropyl group, a 1-methylpropyl group, a 1,1-dimethylethyl group, a pentyl group, a 3-methylbutyl group, a 2-methylbutyl group, a 1-methylbutyl group, a 1,1-dimethylpropyl group, a 2,2-dimethyl propyl group, a 1-ethylpropyl group, or a 3-methyl-2-butyl group.

9. The organometallic compound of claim 1, wherein $R_{41}$ to $R_{44}$ are each independently hydrogen, deuterium, a methyl group, an ethyl group, a propyl group, a 1-methylethyl group, a butyl group, a 2-methylpropyl group, a 1-methylpropyl group, a 1,1-dimethylethyl group, a pentyl, a 3-methylbutyl group, a 2-methylbutyl group, a 1-methylbutyl group, a 1,1-dimethylpropyl group, a 2,2-dimethylpropyl group, a 1-ethylpropyl group, a 3-methyl-2-butyl group, a phenyl group, a biphenyl group, a $C_1$-$C_{20}$ alkylphenyl group, or a naphthyl group.

10. The organometallic compound of claim 1, wherein each $Ln_1$ is represented by one of Formulae 11-1 to 11-12:
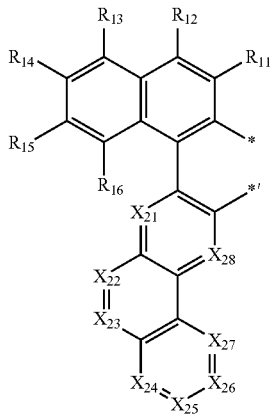
11-1
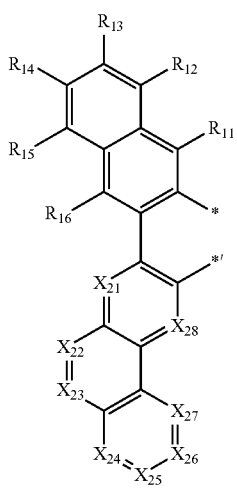
11-2
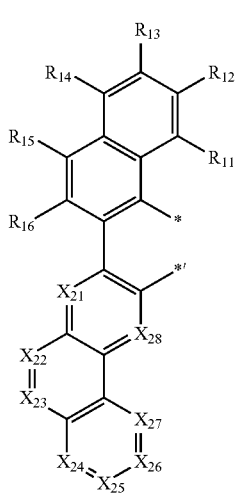
11-3
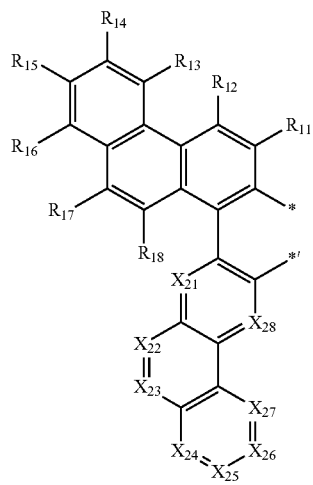
11-4
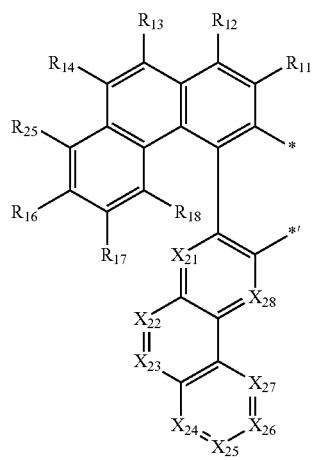
11-5
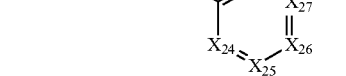
11-6

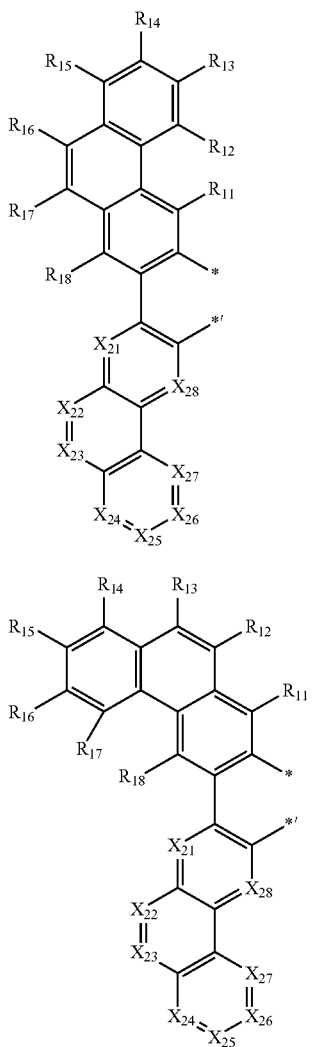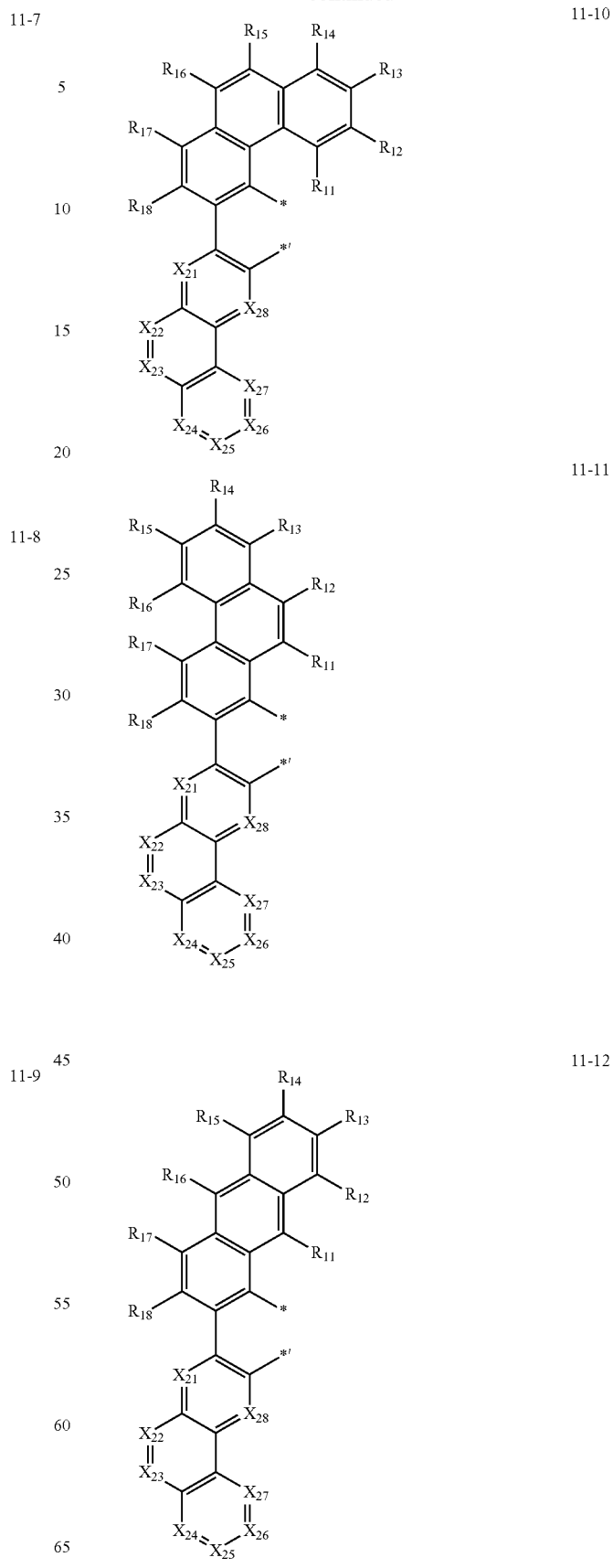

wherein, in Formulae 11-1 to 11-12,
$X_{21}$ to $X_{28}$ are respectively as described in claim 1,
$R_{11}$ to $R_{18}$ are respectively as described in connection with $R_{10}$ in claim 1, and
\* and \*' each indicate a binding site to $M_1$.

11. The organometallic compound of claim 1, wherein each $Ln_2$ is represented by one of Formulae 21-1 to 21-4:

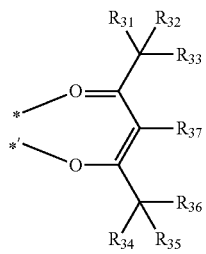
21-1

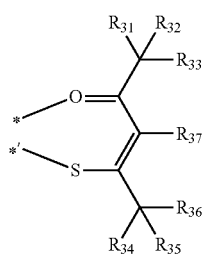
21-2

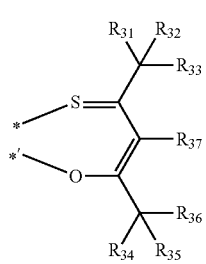
21-3

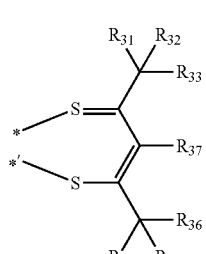
21-4 wherein, in Formulae 21-1 to 21-4,
$R_{31}$ to $R_{37}$ are respectively as described in claim 1, and
\* and \*' each indicate a binding site to $M_1$.

12. The organometallic compound of claim 1, wherein each $Ln_2$ is represented by one of Formulae 22-1 to 22-16:

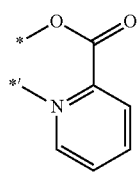
22-1

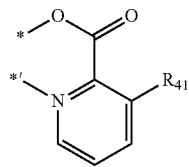
22-2

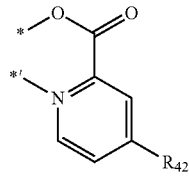
22-3

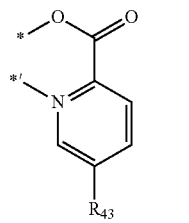
22-4

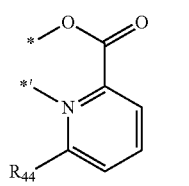
22-5

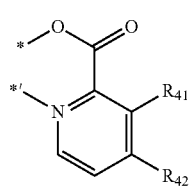
22-6

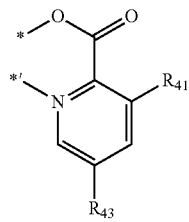
22-7

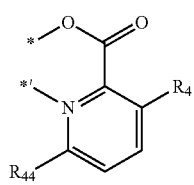
22-8

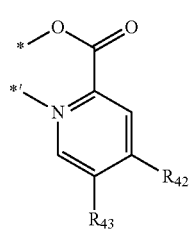
22-9

-continued
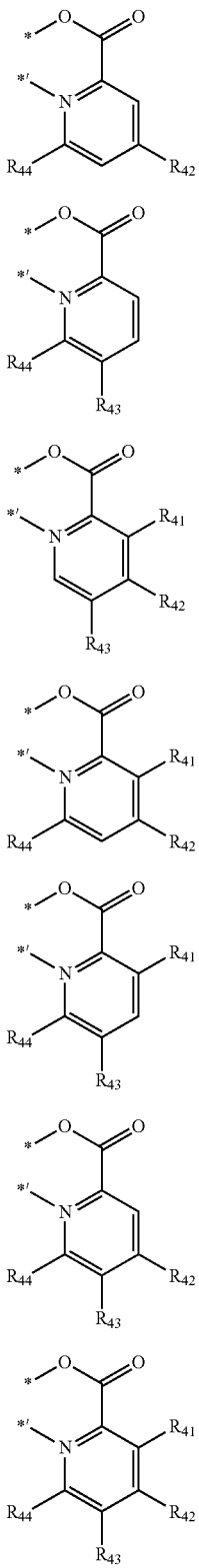
wherein, in Formulae 22-1 to 22-16,
$R_{41}$ to $R_{44}$ are respectively as described in claim 1, and are each not hydrogen, and
* and *' each indicate a binding site to $M_1$.
13. The organometallic compound of claim 1, wherein the organometallic compound is a group represented by one or more of Formulae 31-1 to 31-24:
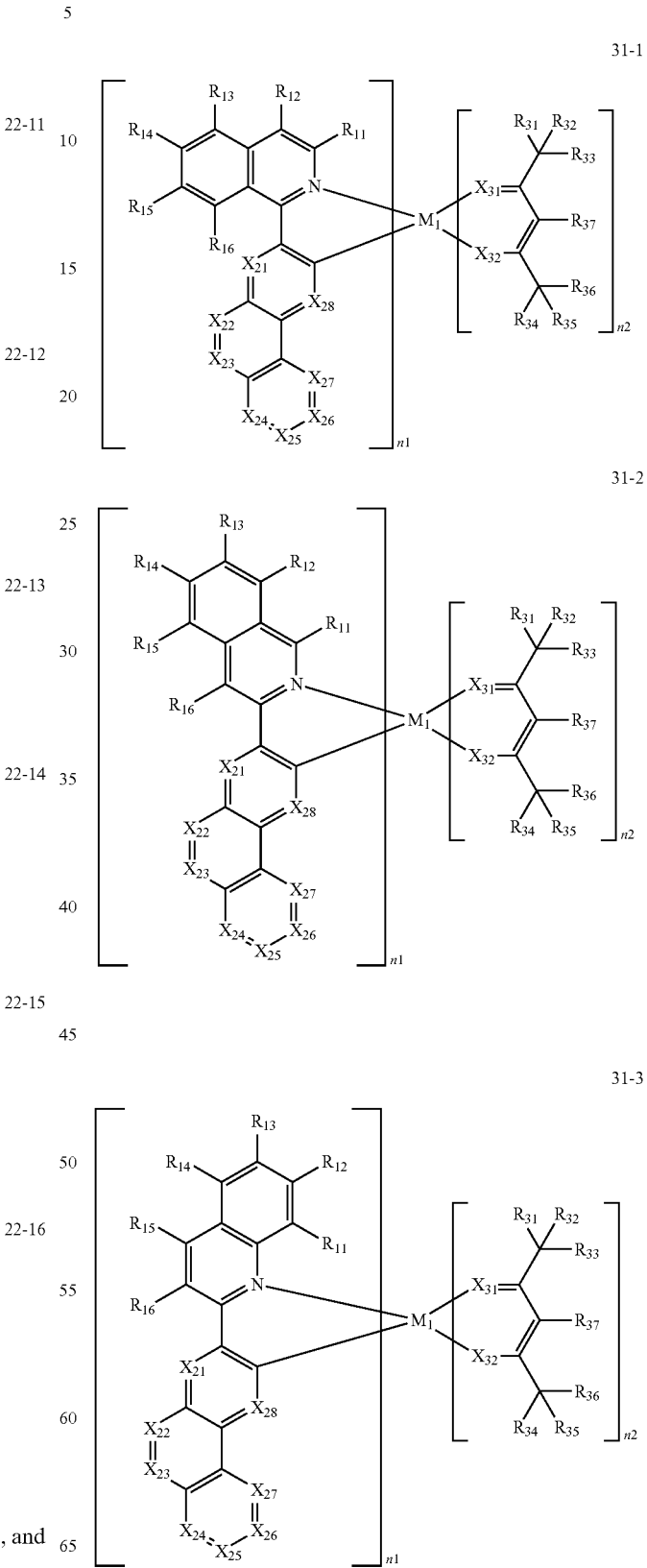

31-4
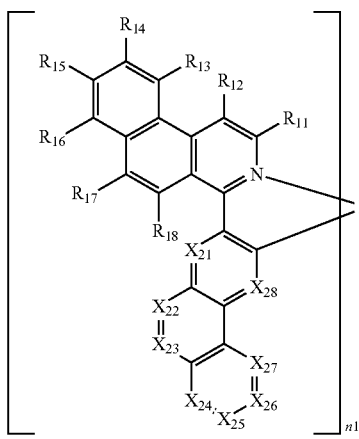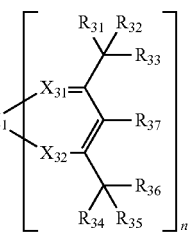
31-5
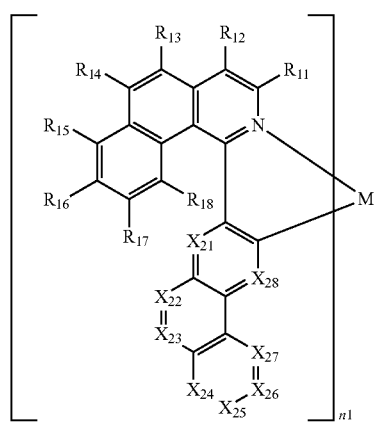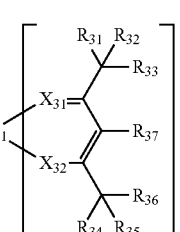
31-6
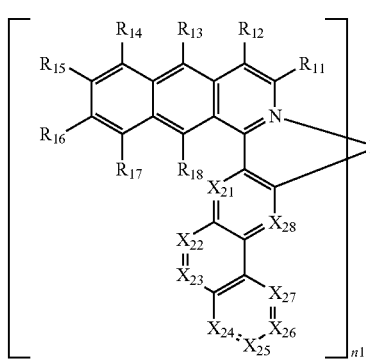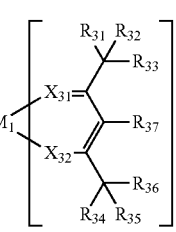
31-7
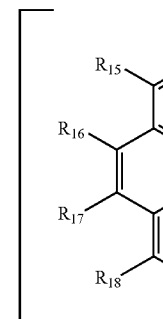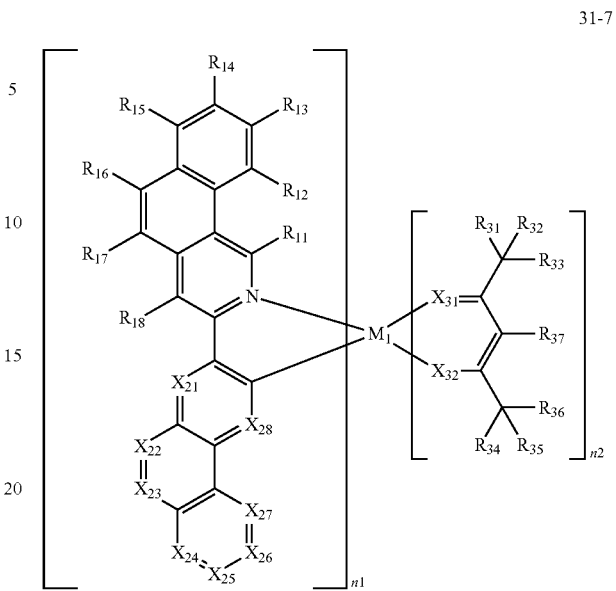
31-8
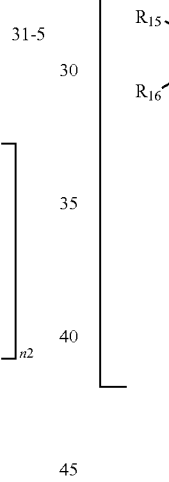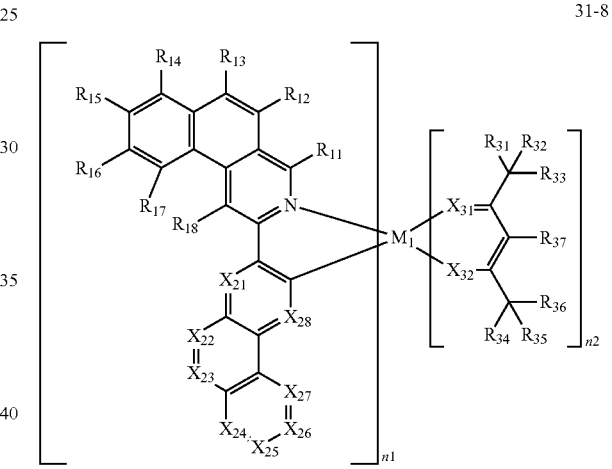
31-9
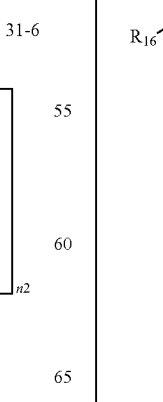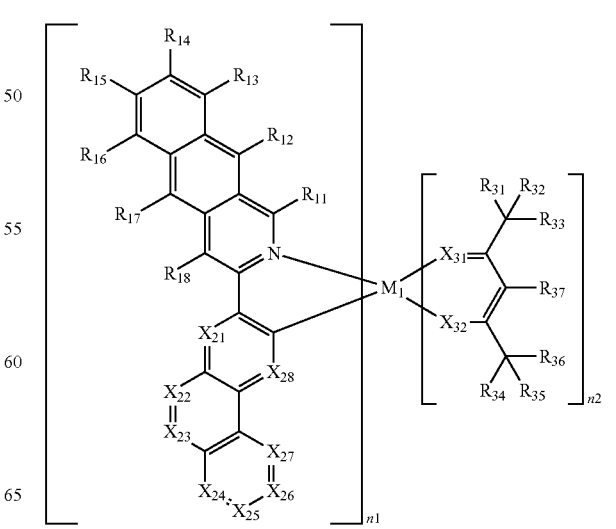

31-10
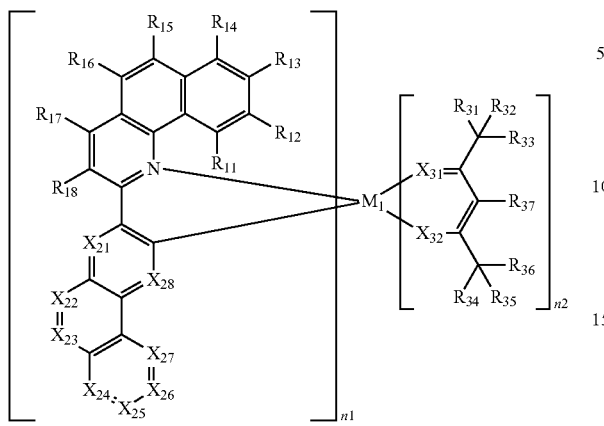
31-13
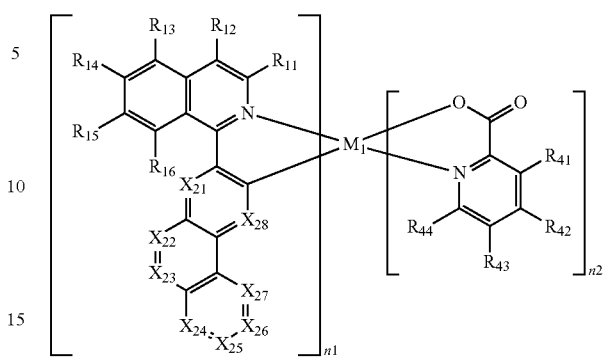
31-11
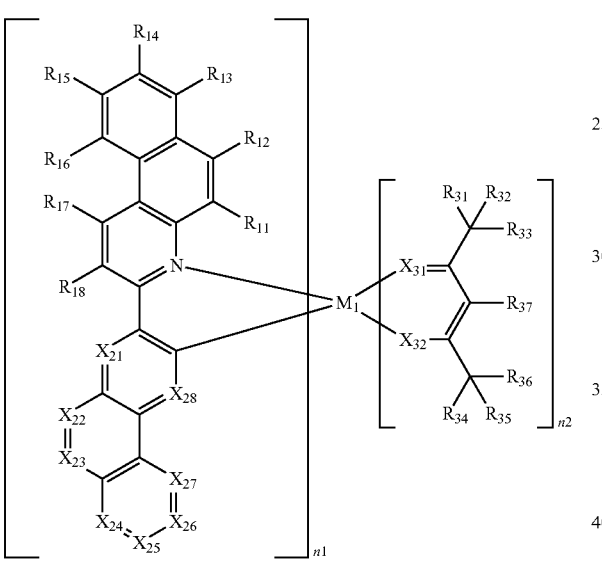
31-14
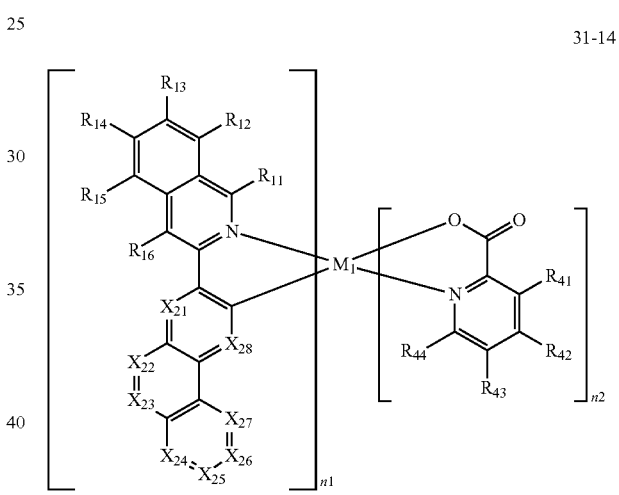
31-12
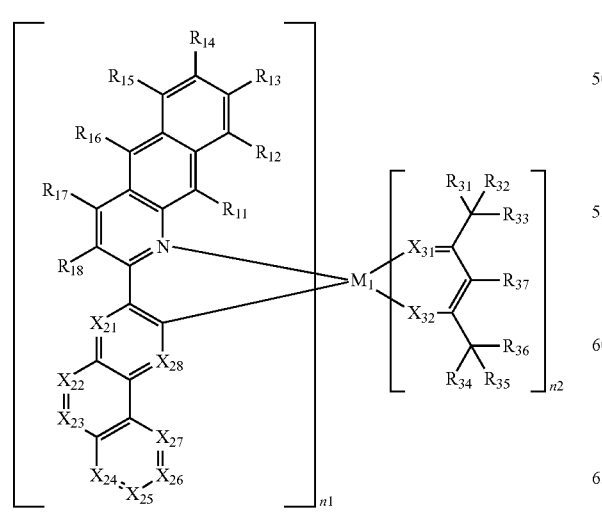
31-15
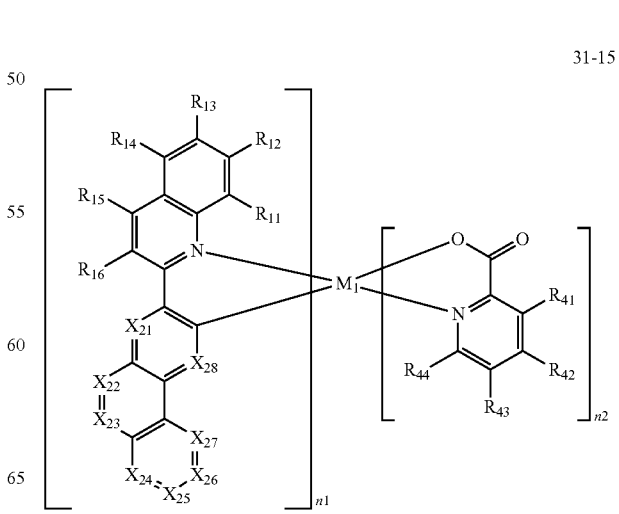

31-16
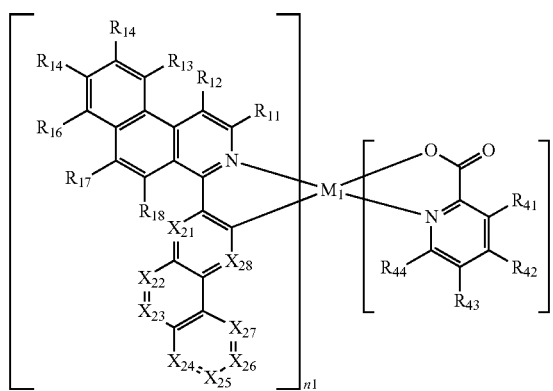
31-19
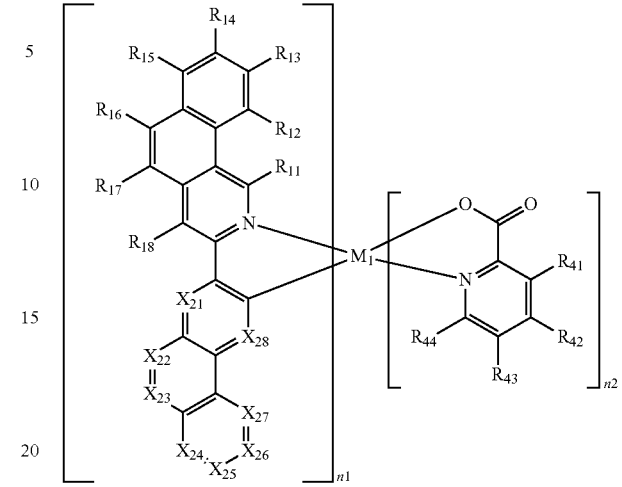
31-17
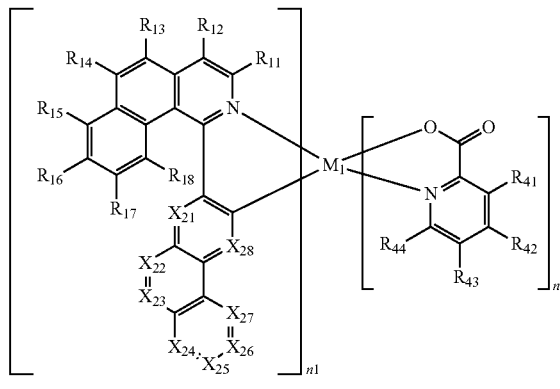
31-20
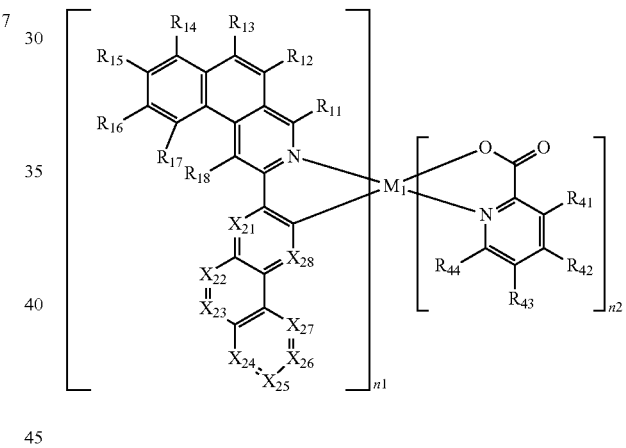
31-18
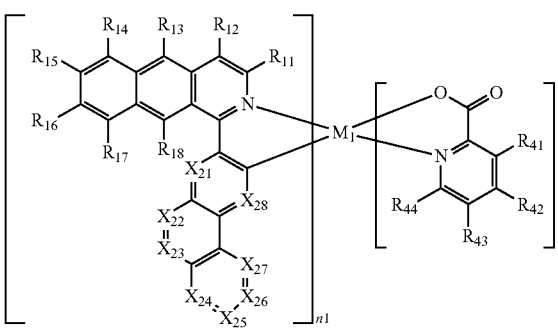
31-21
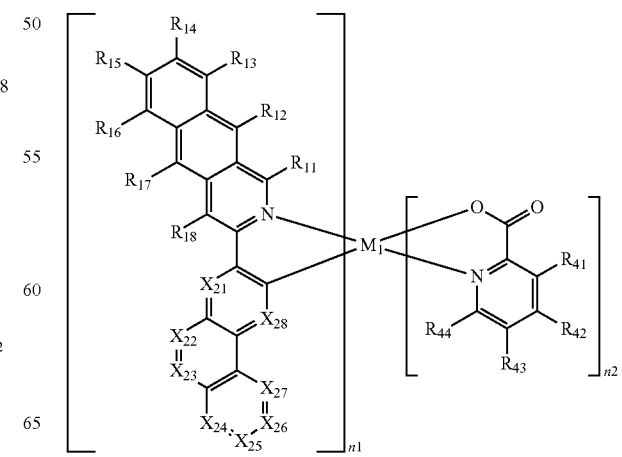

-continued 31-22

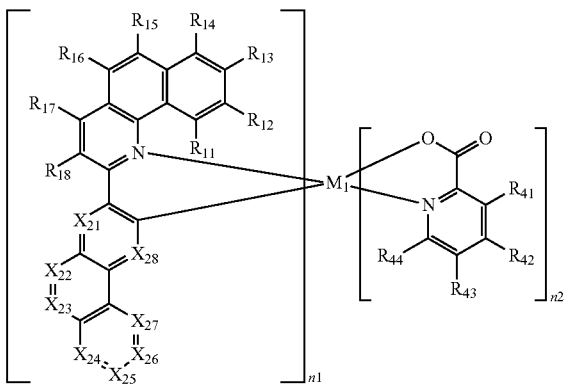

31-23

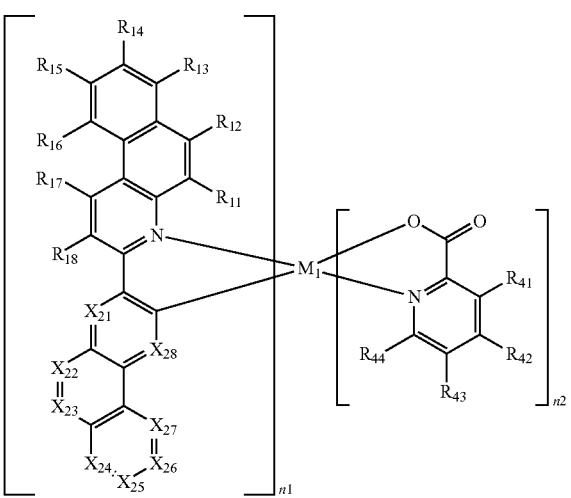

31-24

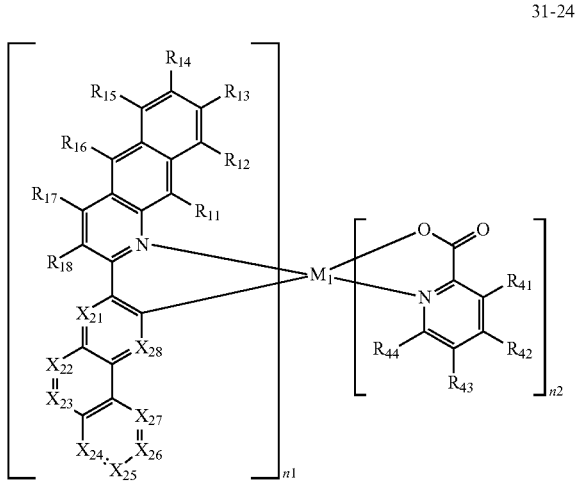

wherein, in Formulae 31-1 to 31-24, $M_1$, n1, n2, $X_{21}$ to $X_{28}$, $R_{31}$ to $R_{37}$, and $R_{41}$ to $R_{44}$ are respectively as described in claim 1, and $R_{11}$ to $R_{18}$ are respectively as described in connection with $R_{10}$ in claim 1.

14. The organometallic compound of claim 1, wherein the organometallic compound is electrically neutral.

15. The organometallic compound of claim 1, wherein the organometallic compound is one or more of Compounds 1 to 17:

1

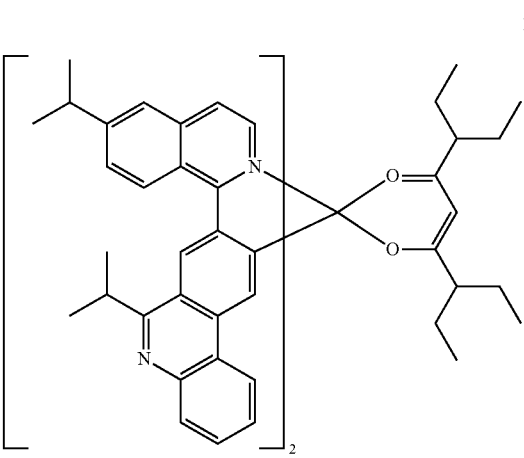

2

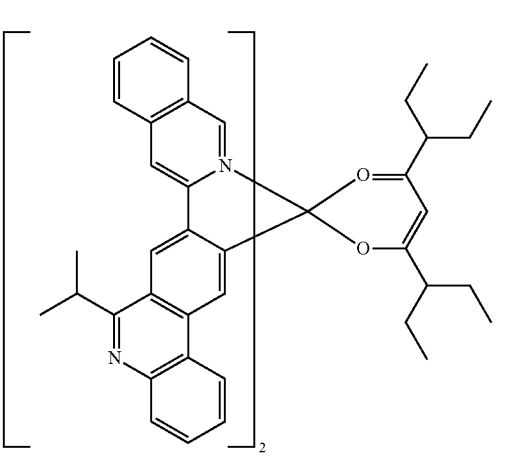

3

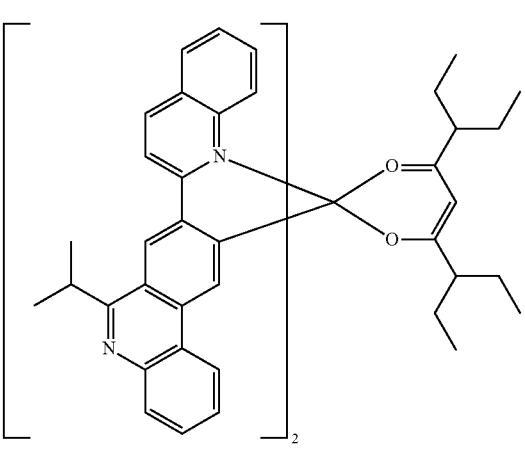

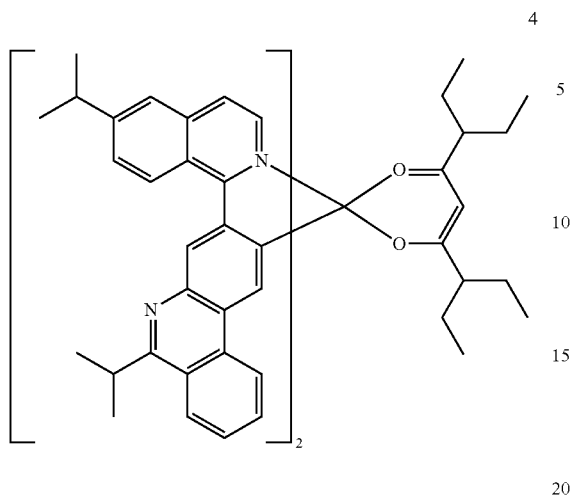
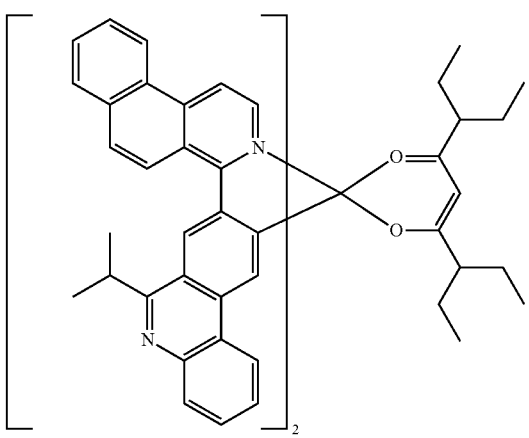
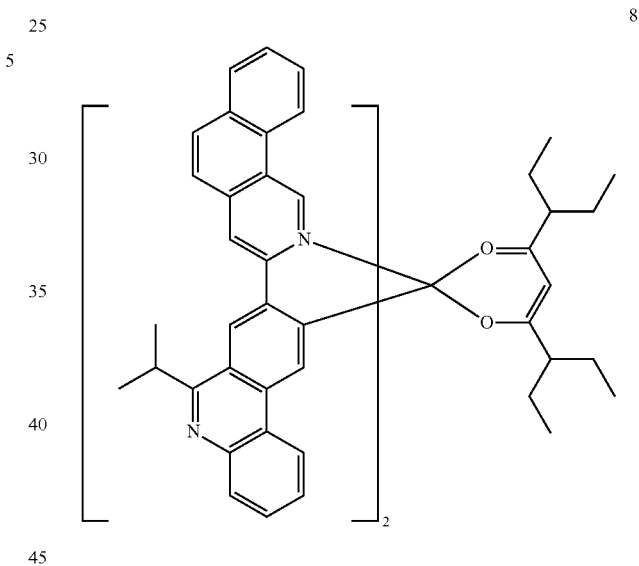
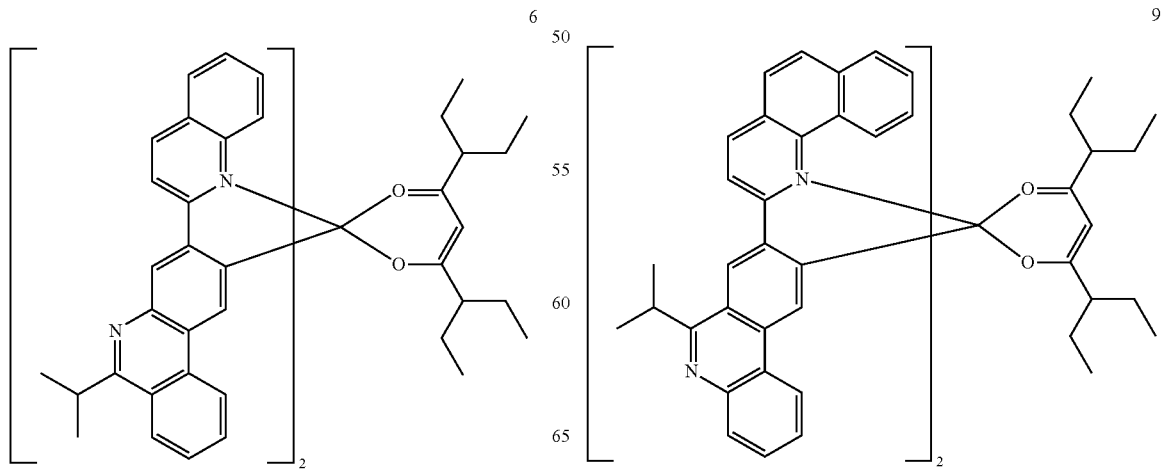

10
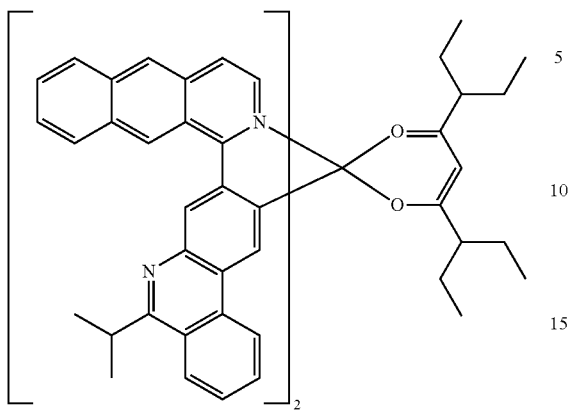
11
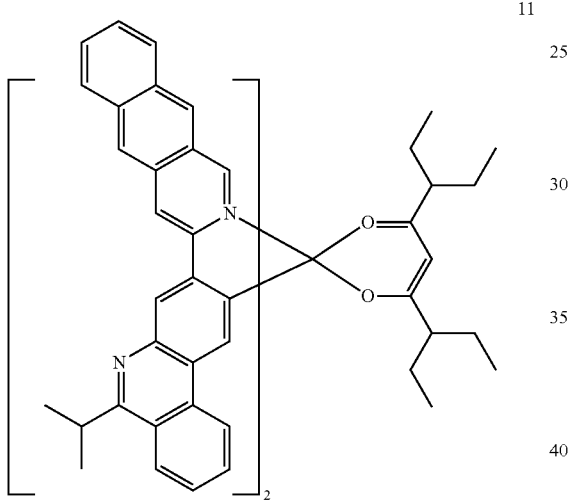
12
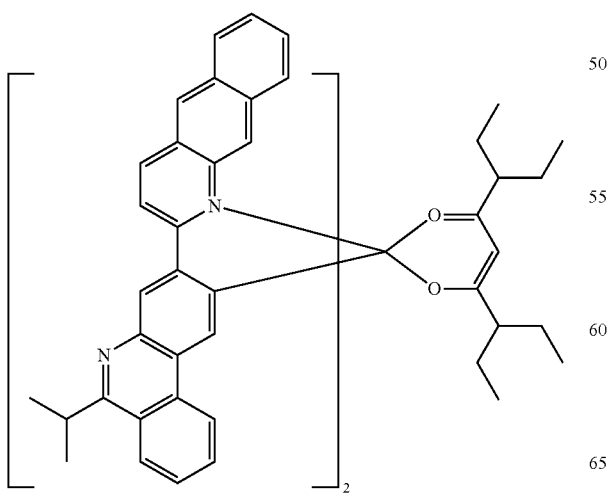
13
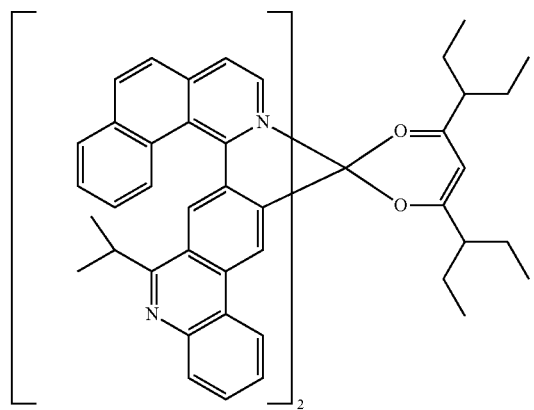
14
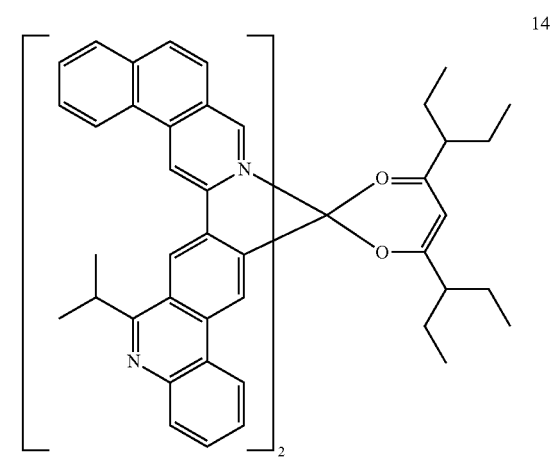
15
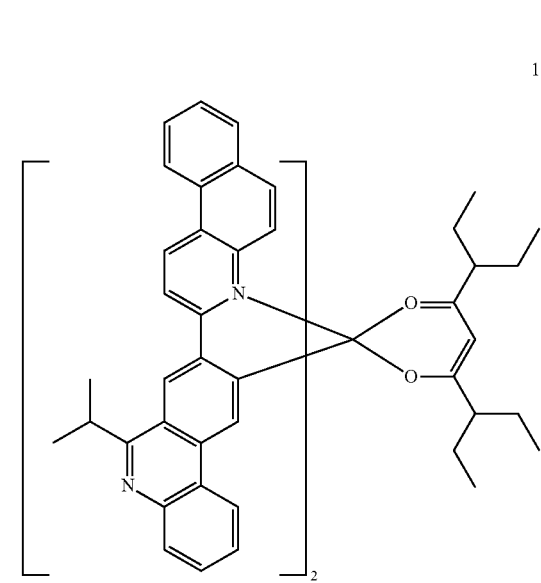

-continued

16

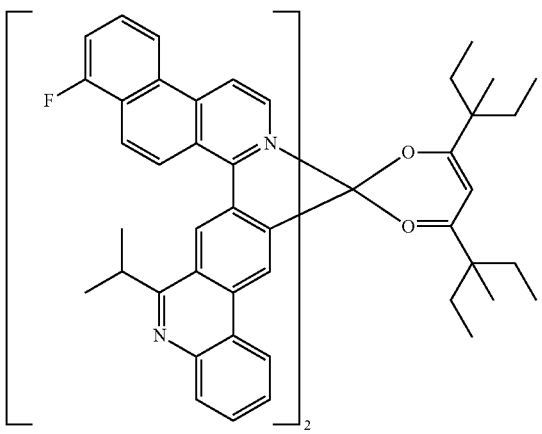

17

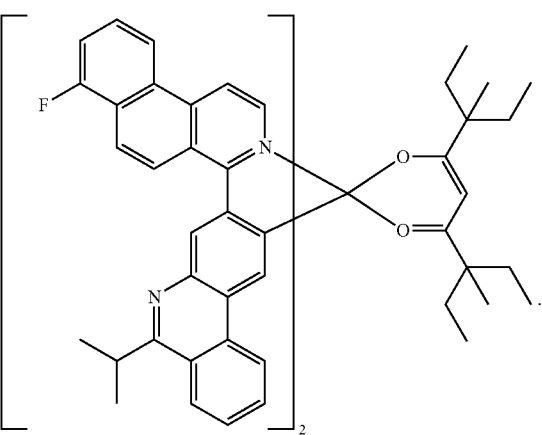

16. An organic light-emitting device, comprising:
a first electrode;
a second electrode; and
an organic layer arranged between the first electrode and the second electrode,
wherein the organic layer comprises an emission layer, and
wherein the organic layer further comprises at least one organometallic compound of claim 1.

17. The organic light-emitting device of claim 16, wherein the emission layer comprises the at least one organometallic compound.

18. The organic light-emitting device of claim 17, wherein the emission layer further comprises a host, and an amount of the host in the emission layer is greater than an amount of the at least one organometallic compound in the emission layer.

19. The organic light-emitting device of claim 16, wherein
the first electrode is an anode,
the second electrode is a cathode,
the organic layer further comprises a hole transport region arranged between the first electrode and the emission layer, and an electron transport region arranged between the emission layer and the second electrode,
the hole transport region comprises a hole injection layer, a hole transport layer, an electron blocking layer, a buffer layer, or a combination thereof, and
the electron transport region comprises a hole blocking layer, an electron transport layer, an electron injection layer, or a combination thereof.

20. An electronic apparatus, comprising the organic light-emitting device of claim 16.

* * * * *